(12) United States Patent
Yamamoto

(10) Patent No.: US 7,755,183 B2
(45) Date of Patent: Jul. 13, 2010

(54) WIRING BOARD, METHOD OF MANUFACTURING THE SAME, AND SEMICONDUCTOR DEVICE

(75) Inventor: Mitsuhiko Yamamoto, Ome (JP)

(73) Assignee: Casio Micronics Co., Ltd., Tokyo (JP)

( * ) Notice: Subject to any disclaimer, the term of this patent is extended or adjusted under 35 U.S.C. 154(b) by 731 days.

(21) Appl. No.: 11/084,805

(22) Filed: Mar. 18, 2005

(65) Prior Publication Data

US 2006/0055021 A1   Mar. 16, 2006

(30) Foreign Application Priority Data

Sep. 14, 2004   (JP) .............................. 2004-266923

(51) Int. Cl.
*H01L 23/48* (2006.01)
(52) U.S. Cl. ................ 257/693; 257/690; 257/E33.066
(58) Field of Classification Search .................. 257/692, 257/690, 693, E33.066
See application file for complete search history.

(56) References Cited

U.S. PATENT DOCUMENTS

| | | | | |
|---|---|---|---|---|
| 5,608,262 A | * | 3/1997 | Degani et al. | 257/723 |
| 6,110,824 A | * | 8/2000 | Licata et al. | 438/666 |
| 6,249,045 B1 | * | 6/2001 | Kresge et al. | 257/678 |
| 6,617,688 B2 | * | 9/2003 | Ikegami et al. | 257/738 |
| 2003/0022479 A1 | * | 1/2003 | Hayashida | 438/614 |
| 2003/0150353 A1 | * | 8/2003 | Kato et al. | 106/1.23 |

FOREIGN PATENT DOCUMENTS

| | | |
|---|---|---|
| CN | 1424756 A | 6/2003 |
| JP | 3-191541 | 8/1991 |
| JP | 2001-210676 | 8/2001 |
| JP | 3284916 | 3/2002 |
| JP | 2003-78171 | 3/2003 |

* cited by examiner

*Primary Examiner*—Thao X Le
*Assistant Examiner*—Ajay K Arora
(74) *Attorney, Agent, or Firm*—Ohlandt, Greeley, Ruggiero & Perle, L.L.P.

(57) ABSTRACT

According to this invention, a wiring board includes a conductive pattern formed from leads each of which is formed on an organic layer and has a thickness t larger than a width W.

13 Claims, 25 Drawing Sheets

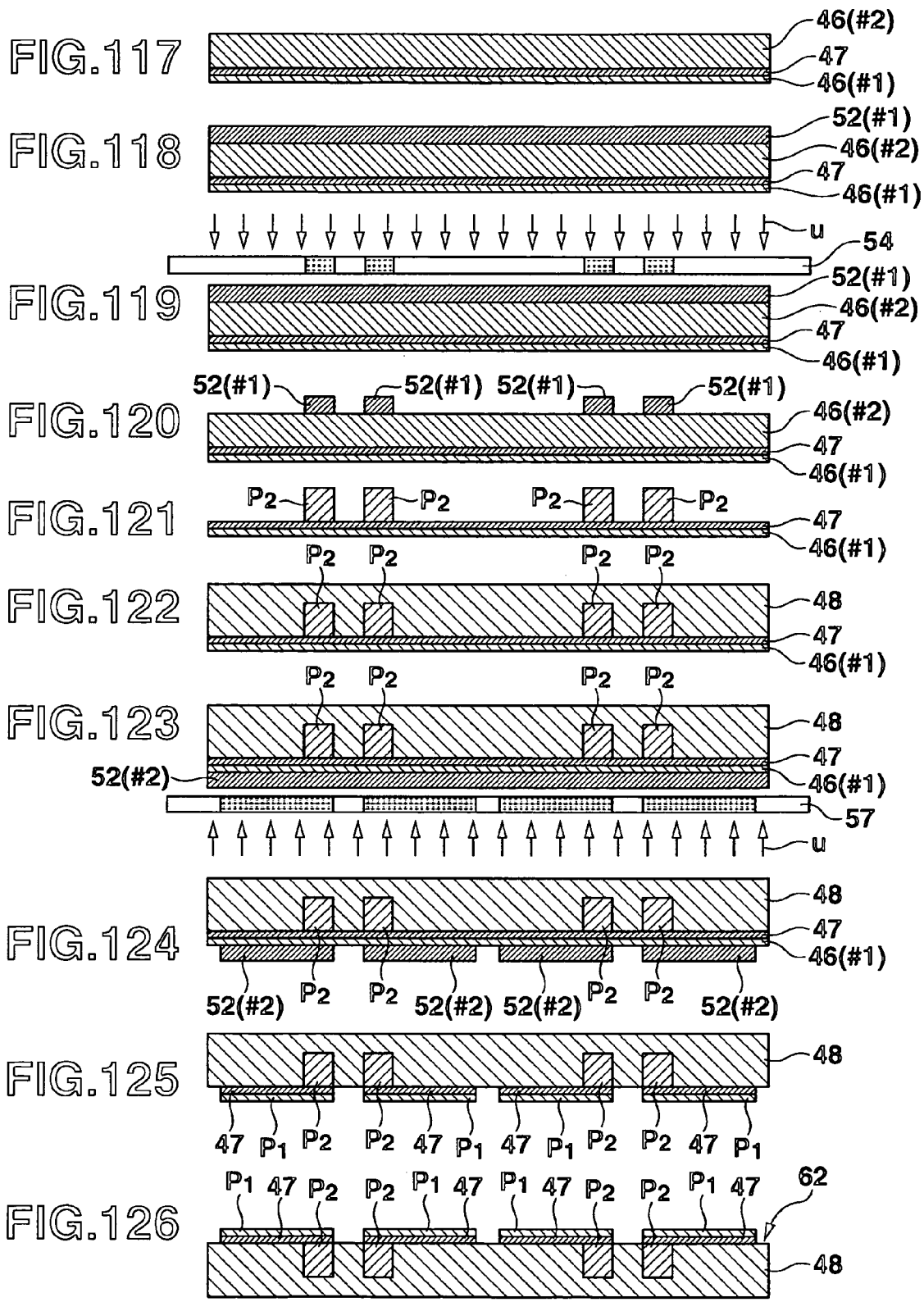

US 7,755,183 B2

WIRING BOARD, METHOD OF MANUFACTURING THE SAME, AND SEMICONDUCTOR DEVICE

CROSS-REFERENCE TO RELATED APPLICATIONS

This application is based upon and claims the benefit of priority from prior Japanese Patent Application No. 2004-266923, filed Sep. 14, 2004, the entire contents of which are incorporated herein by reference.

BACKGROUND OF THE INVENTION

1. Field of the Invention

The present invention relates to a wiring board, a method of manufacturing the same, and a semiconductor device and, more particularly, to a technique of increasing the insulating reliability and manufacturing yield.

2. Description of the Related Art

FIG. 1 is a front view showing an arrangement of a chip-on-film (COF) semiconductor device according to a prior art. FIG. 2 is a side view corresponding to FIG. 1.

The COF semiconductor device comprises a wiring board 11. In this case, the wiring board 11 is formed from a polyimide film having a thickness of about 10 to 50 μm. Wiring 12 made of a copper layer having a thickness of about 5 to 10 μm are formed on the upper surface of the wiring board 11. In this case, to form the wiring 12, an undercoat metal layer of Cr, NiCr, or NiTi and a copper layer are continuously formed on the wiring board 11 to several hundred Å and several thousand Å (1 Å=$10^{-8}$ cm), respectively, by vacuum deposition or sputtering. After that, a copper layer is formed on the wiring board 11 by electroless plating or electroplating without interposing any adhesive. A plating layer (not shown) of a low-melting metal such as tin or solder is formed on the surface of the wiring 12. One end of each wiring 12 serves as a connection terminal 12a. In this case, no device hole is formed in the semiconductor chip mounting region of the wiring board 11. The wiring board 11 has a surface opposing a semiconductor chip 13 all over the semiconductor chip mounting region. Bump electrodes 14 made of gold and formed at the periphery of the lower surface of the semiconductor chip 13 are bonded to the upper surfaces of the connection terminals 12a on the wiring board 11 by AuSn eutectic alloy so that the semiconductor chip 13 is mounted at a predetermined portion on the upper-surface-side of the wiring board 11. After that, the space formed between the semiconductor chip 13 and the wiring board 11 is filled with an insulating resin 15 (also called a sealing resin) such as an epoxy resin by a known side potting method. The insulating resin 15 is heated and cured, thereby completing the semiconductor device.

Jpn. Pat. Appln. KOKAI Publication No. 2001-210676 describes an example of the method of manufacturing the semiconductor device as shown in FIGS. 1 and 2.

To manufacture the semiconductor device shown in FIGS. 1 and 2, a bonding apparatus shown in FIG. 3 is prepared. In this bonding apparatus, a bonding tool 22 movable in the vertical direction is arranged above a stage 21 having a built-in heater (not shown). The semiconductor chip 13 is placed on the stage 21 with the bump electrodes 14 being directed upward. A clamp 23 clamps the wiring board 11 at the periphery of the region where the semiconductor chip 13 is to be mounted. The bonding tool 22 is moved downward.

The wiring board 11 has the lower surface opposing the semiconductor chip 13 all over the semiconductor chip mounting region. The wiring board 11 is set with its lower surface being directed to the upper surface of the semiconductor chip 13, i.e., with the surface having the wiring 12 being directed toward the semiconductor chip 13.

Next, the bump electrodes 14 of the semiconductor chip 13 and the connection terminals 12a of the wiring board 11 are aligned.

As shown in FIG. 4, for example, the stage 21 is moved upward to bring the bump electrodes 14 into contact with the connection terminals 12a. The bonding tool 22 is moved downward again. In this state, the stage 21 is heated to 350° C. to 450° C., and preferably, about 400° C. to heat the semiconductor chip 13. In addition, the bonding tool 22 is heated to 250° C. to 350° C., and preferably, about 300° C. and brought into direct contact with the upper surface of the wiring board 11 to press it. The bump electrodes 14 and the connection terminals 12a formed on the wiring board 11 are heated and pressed for about 1 to 3 sec. The bonding strength is increased by forming the interface in this way, as described in the prior art.

However, the conventional semiconductor device has the following problem.

In the semiconductor device shown in FIGS. 1 and 2, the semiconductor chip 13 is bonded while keeping the wiring board 11 flat. In this case, the distance between the wiring 12 and an edge Ed on the lower-surface-side of the semiconductor chip 13 is short. If the wiring board 11 deforms in bonding, the edge Ed on the lower-surface-side of the semiconductor chip 13 may short-circuit to the wiring 12 of the wiring board 11, as shown in FIG. 5.

This mechanism will be described by using a detailed example.

For example, assume that the semiconductor chip 13 having gold bumps is bonded to a 6 μm thick copper pattern formed on the wiring board 11 made of polyimide at a load of 100 N and a bonding temperature of 300° C. to 400° C. while the periphery of the chip mounting region is fixed by the clamp. At this time, the wiring board 11 is heated to the softening point of polyimide at the bonding temperature so that it is softened and pressed.

The connection terminals 12a are made of pure copper, like the copper leads formed on the wiring board 11, and therefore are excellent in ductility as a material property. The hardness is relatively low, and the rigidity is also low. The connection terminal 12a made of pure copper is as thin as 6 μm. The width is about 20 μm. Bonding to initial polyimide is done at about 1 kg/cm. Since the width of the connection terminal 12a after patterning is about 20 μm, the adhesion strength of the connection terminal 12a is about 2 g/pin, i.e., considerably low.

Assume that the semiconductor chip 13 having the bump electrodes 14 is bonded to the flexible wiring board 11 in the above-described state by the bonding method described in Jpn. Pat. Appln. KOKAI Publication No. 2001-210676, i.e., at a temperature of 300° C. to 400° C. higher than the softening point of polyimide and a pressure of 100 N or more for a bonding time of 1 to 3 sec. The connection terminals 12a sink into polyimide due to the bonding load and are going to stretch. However, the other end of each connection terminal 12a is fixed by the clamp 23 and therefore cannot move.

In addition, the adhesion strength between the copper leads and polyimide is low. Hence, the wiring 12 formed from the copper leads are deformed and bent upward near the connection terminal 12a, as shown in FIG. 5. In the worst case, the wiring 12 is peeled from the wiring board 11 made of polyimide to form a void Vd.

When the interconnection (to be also referred to as a "lead" hereinafter) 12 is deformed and bent near the connection terminal 12a, the following problems (1) to (4) rise.

(1) Sn or AuSn melted in bonding flows out along the lead 12 and separates from the bonding portion. Accordingly, the temperature decreases so that the fluidity of the melted Sn or AuSn solder diminishes, and a solder mass Sd is formed. If the melted solder amount is large, the solder sticks to the surface of the semiconductor chip 13 in the pressed state in bonding, resulting in degradation of outer appearance.

(2) The wiring 12 formed from a copper lead is deformed and bent upward near the connection terminal 12a. The wiring 12 is peeled from the wiring board 11 made of polyimide and is bent. For this reason, the lead 12 may electrically short-circuit to the edge (Ed) of the semiconductor chip 13.

(3) The lead 12 may partially be peeled from the wiring board 11 at the interface. Solder serving as the bonding material enters the interface and degrades the bonding strength.

(4) Since the lead 12 sinks into the wiring board 11, the lead 12 may be cut by the bump electrode 14. Alternatively, the lead 12 may crack and rupture as the initial crack grows during a reliability test such as a heat cycle test.

To solve the problems (1) to (4), in Jpn. Pat. Appln. KOKAI Publication No. 2001-210676, simultaneously as the semiconductor chip 13 is mounted on the upper surface of the wiring board 11, a part of the connection terminal 12a near the bonding portion to the bump electrode 14 and a part of the wiring board 11 corresponding to the vicinity of the bonding portion are deformed and spaced apart from the lower surface of the semiconductor chip 13. More specifically, a slant region is formed, in which the connection terminal 12a and wiring board 11 gradually become spaced apart from the semiconductor chip 13 from the bonding portion to the bump electrode 14 toward the outside of the semiconductor chip mounting region, thereby forming the lead 12. With this method, the distance from the edge Ed of the semiconductor chip 13 is ensured.

In this method, however, an infinite number of cracks have already been formed in the lead 12 in bonding. When lead forming is executed in the state shown in FIG. 4, the lead 12 surely ruptures.

As a solution without lead forming, Japanese Patent No. 3284916 describes a bonding method in which the bonding temperature of AuSn solder is set to 250° C. or less.

When the bonding temperature is decreased, the deformation amount of polyimide can be reduced. However, only AuSn is formed at the bonding portion in bonding at 300° C. or less, and no Cu interdiffusion occurs in the bonding interface, as described in Japanese Patent No. 3284916. Since AuSn is a fragile intermetallic compound, the bonding strength decreases. The chip is readily peeled off and cannot be bonded.

BRIEF SUMMARY OF THE INVENTION

The present invention has been made in consideration of the above situation, and has as its object to provide a wiring board, a method of manufacturing the same, and a semiconductor device which can increase the insulating reliability and manufacturing yield.

In order to achieve the above object, the present invention provides the following measures.

According to a first aspect of the present invention, in a wiring board formed from a cladding material prepared by stacking copper, nickel, and copper, a conductive pattern arranged on the wiring board includes a plurality of leads each of which has four surfaces, is buried in an organic layer while exposing at least a surface to be electrically connected, and has a thickness larger than a width, the leads being arranged in a predetermined layout to be adjacent to each other at a predetermined interval. The organic layer is a flexible substrate made of an organic substance which is at least one member selected from the group consisting of polyimide, epoxy, and liquid crystal polymer. The lead includes a trapezoidal or square shape in a section perpendicular to a lead direction of the lead.

According to a second aspect of the present invention, in a wiring board formed from a cladding material prepared by stacking copper, nickel, and copper, a conductive pattern arranged on the wiring board has at least two layers and is formed on a substrate and buried in an organic layer while exposing at least a surface to be electrically connected. The conductive pattern on a lower side is formed from a conductor smaller and denser than the conductive pattern on an upper side. A crystal size of the conductor on the lower side is smaller than a crystal size of the conductor on the upper side. A shape of the conductor in a section perpendicular to a lead direction of the conductor in each layer includes a square, trapezoidal, or inverted trapezoidal portion.

According to a third aspect of the present invention, in a wiring board formed from a cladding material prepared by stacking copper, nickel, and copper, a conductive pattern arranged on the wiring board has at least two layers and is formed on a substrate and buried in an organic layer while exposing at least a surface to be electrically connected. A conductor which forms the conductive pattern on a lower side mainly has a crystal orientation plane whose constituent element is denser than a conductor which forms the conductive pattern on an upper side.

According to a fourth aspect of the present invention, in a wiring board formed from a cladding material prepared by stacking copper, nickel, and copper, a conductive pattern arranged on the wiring board has at least two layers and is formed on a substrate and buried in an organic layer while exposing at least a surface to be electrically connected. A conductor which forms the conductive pattern has a width larger than a thickness in a section perpendicular to a lead direction in the same layer, and the conductor on a lower side has a hardness higher than the conductor on an upper side. The width is larger on the upper side than on the lower side. The conductor which forms the conductive pattern on the lower side is essentially made of an alloy containing iron or an alloy containing titanium.

According to a fifth aspect of the present invention, in a wiring board formed from a cladding material prepared by stacking copper, nickel, and copper, a conductive pattern arranged on the wiring board has at least two layers and is formed on a substrate and buried in an organic layer while exposing at least a surface to be electrically connected.

A conductor which forms the conductive pattern has a width larger than a thickness in a section perpendicular to a lead direction in the same layer, and the conductor on a lower side has a conductivity lower than the conductor on an upper side. Alternatively, a thickness of a conductor, which forms the conductive pattern, in a section perpendicular to a lead direction is different from that of other portions.

According to a sixth aspect of the present invention, in a wiring board formed from a cladding material prepared by stacking copper, nickel, and copper, a conductive pattern arranged on the wiring board includes a plurality of leads each of which has four surfaces, and is formed on a substrate and buried in an organic layer while exposing at least a surface to be electrically connected. The wiring board comprises a portion where a ratio of a thickness to a width of a conductor, which forms the conductive pattern, in a section perpendicular to a lead direction is less than 1 and a portion where the ratio is not less than 1. A semiconductor chip is arranged in a region where the portion with the ratio of not less than 1 is larger than the portion with the ratio of less than 1. The thickness in the section perpendicular to the lead direction is different from that of other portions. In the conductive pattern which comprises the portion where the ratio of the thickness to the width in the section perpendicular to the lead direction is less than 1 and the portion where the ratio is not less than 1, an exposed surface of the portion with the ratio of less than 1 and an exposed surface of the portion with the ratio of not less than 1 are flush to each other.

A wiring board according to a seventh aspect of the present invention is applied to a semiconductor device comprising a conductive pattern and a semiconductor chip connected to the conductive pattern through a plurality of bump electrodes. This wiring board is also formed from a cladding material prepared by stacking copper, nickel, and copper. The conductive pattern includes a plurality of leads each of which has four surfaces and is buried in the wiring board itself while exposing at least a surface to be electrically connected, the leads being arranged in a predetermined layout to be adjacent to each other at a predetermined interval. The wiring board comprises a portion where a ratio of a thickness to a width of a conductor, which forms the conductive pattern, in a section perpendicular to a lead direction is less than 1 and a portion where the ratio is not less than 1. The bump electrodes are electrically connected to a region where the portion with the ratio of not less than 1 is larger than the portion with the ratio of less than 1. A shortest distance between a surface which includes a side surface of the portion with the ratio of not less than 1 farthest from the bump electrode and a surface of the bump electrode is 25 to 150 μm.

A wiring board according to an eighth aspect of the present invention comprises a conductive pattern formed from, e.g., fine particles. On the wiring board, an electronic component electrically connected to the conductive pattern is mounted. This wiring board is also formed from a cladding material prepared by stacking copper, nickel, and copper. The conductive pattern includes a plurality of leads each of which has four surfaces, is buried in an organic layer while exposing at least a surface to be electrically connected, and has a thickness larger than a width, the leads being arranged in a predetermined layout to be adjacent to each other at a predetermined interval. A thickness of a conductor, which forms the conductive pattern, in a direction of a substrate depth is larger at a portion where the electronic component is mounted than other portions. The conductor has a semicylindrical shape in a section perpendicular to a lead direction.

A wiring board according to a ninth aspect of the present invention comprises a conductive pattern. The conductive pattern includes a plurality of leads each of which has four surfaces, is buried in an organic layer including at least two layers having different absorptivities while exposing at least a surface to be electrically connected, and has at least a portion in which a thickness is larger than a width, the leads being arranged in a predetermined layout to be adjacent to each other at a predetermined interval. The organic layer includes a first organic layer having a low absorptivity and a second organic layer having an absorptivity higher than the first organic layer. The conductive pattern is formed on the first organic layer.

Each of the wiring boards according to the first to eighth aspects of the present invention is manufactured by using a cladding material prepared by stacking one of Cu and a Cu alloy, one of Ni and Ti, and one of Cu and a Cu alloy. In the first to eighth aspects of the present invention, the conductor is manufactured by an imprint method using nanopaste.

According to the 10th aspect of the present invention, there is provided a semiconductor device comprising a conductive pattern and a semiconductor chip connected to the conductive pattern through a plurality of bump electrodes. The conductive pattern includes a plurality of leads each of which has four surfaces and is buried in a wiring board while exposing at least a surface to be electrically connected, the leads being arranged in a predetermined layout to be adjacent to each other at a predetermined interval. The wiring board comprises a portion where a ratio of a thickness to a width of a conductor, which forms the conductive pattern, in a section perpendicular to a lead direction is less than 1 and a portion where the ratio is not less than 1. The bump electrodes are electrically connected to a region where the portion with the ratio of not less than 1 is larger than the portion with the ratio of less than 1. Especially, the bump electrode is electrically connected to the region where the portion with the ratio of not less than 1 is larger than the portion with the ratio of less than 1 while the region is decentered to a side of a central portion of the semiconductor chip. A size of the semiconductor chip is equal to or smaller than a size of the region. For example, a shortest distance between a surface which includes a side surface of the portion with the ratio of not less than 1 farthest from the bump electrode and a surface of the bump electrode is 25 to 150 μm.

According to the 11th aspect of the present invention, there is provided a semiconductor device comprising a conductive pattern and an active device and passive device which are connected to the conductive pattern through a plurality of bump electrodes. The conductive pattern includes a plurality of leads each of which has four surfaces and is buried in a wiring board while exposing at least a surface to be electrically connected, the leads being arranged in a predetermined layout to be adjacent to each other at a predetermined interval. The wiring board comprises a portion where a ratio of a thickness to a width of a conductor, which forms the conductive pattern, in a section perpendicular to a lead direction is less than 1 and a portion where the ratio is not less than 1. An exposed surface of the portion with the ratio of less than 1 and an exposed surface of the portion with the ratio of not less than 1 are flush to each other. The passive device is electrically connected to the portion with the ratio of less than 1, and the active device is electrically connected to the portion with the ratio of not less than 1.

According to the 12th aspect of the present invention, there is provided a semiconductor device comprising a conductive pattern and an active device and passive device which are connected to the conductive pattern through a plurality of bump electrodes. The conductive pattern includes a plurality of leads each of which has four surfaces and is buried in a wiring board while exposing at least a surface to be electrically connected, the leads being arranged in a predetermined layout to be adjacent to each other at a predetermined interval. The wiring board comprises, near a lower portion of the plurality of conductive patterns, a region having a lower absorptivity than other regions, and a portion where a ratio of a thickness to a width of a conductor, which forms the conductive pattern, in a section perpendicular to a lead direction is less than 1 and a portion where the ratio is not less than 1. The passive device is electrically connected to the portion with the ratio of less than 1, and the active device is electrically connected to the portion with the ratio of not less than 1.

In the 11th and 12th aspect, the active device is, e.g., a liquid crystal driving LSI, and the passive device is, e.g., a capacitor, coil, or resistor.

According to the present invention, a wiring board, a method of manufacturing the same, and a semiconductor device which can increase the insulating reliability and manufacturing yield can be implemented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 117 is a front view showing the first step in manufacturing a wiring board according to the 11th embodiment;

FIG. 118 is a front view showing the second step in manufacturing the wiring board according to the 11th embodiment;

FIG. 119 is a front view showing the third step in manufacturing the wiring board according to the 11th embodiment;

FIG. 120 is a front view showing the fourth step in manufacturing the wiring board according to the 11th embodiment;

FIG. 121 is a front view showing the fifth step in manufacturing the wiring board according to the 11th embodiment;

FIG. 122 is a front view showing the sixth step in manufacturing the wiring board according to the 11th embodiment;

FIG. 123 is a front view showing the seventh step in manufacturing the wiring board according to the 11th embodiment;

FIG. 124 is a front view showing the eighth step in manufacturing the wiring board according to the 11th embodiment;

FIG. 125 is a front view showing the ninth step in manufacturing the wiring board according to the 11th embodiment;

FIG. 126 is a front view showing the 10th step in manufacturing the wiring board according to the 11th embodiment;

FIG. 127 is a front view showing the first step in manufacturing a wiring board according to the 12th embodiment;

FIG. 128 is a front view showing the second step in manufacturing the wiring board according to the 12th embodiment;

FIG. 129 is a front view showing the third step in manufacturing the wiring board according to the 12th embodiment;

FIG. 130 is a front view showing the fourth step in manufacturing the wiring board according to the 12th embodiment;

Figure 131:
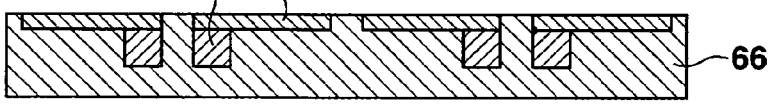
Figure 132:
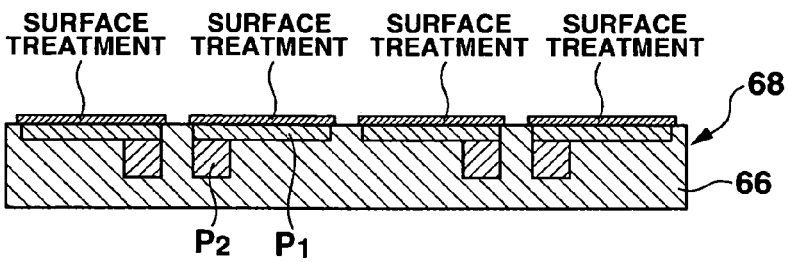
Figure 133:
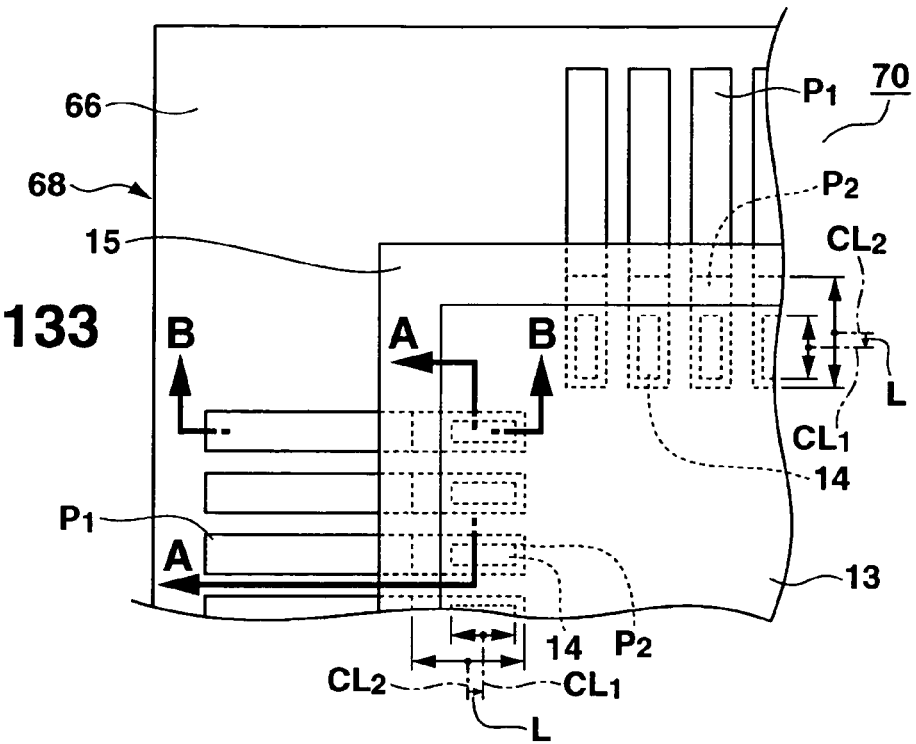
Figure 134:
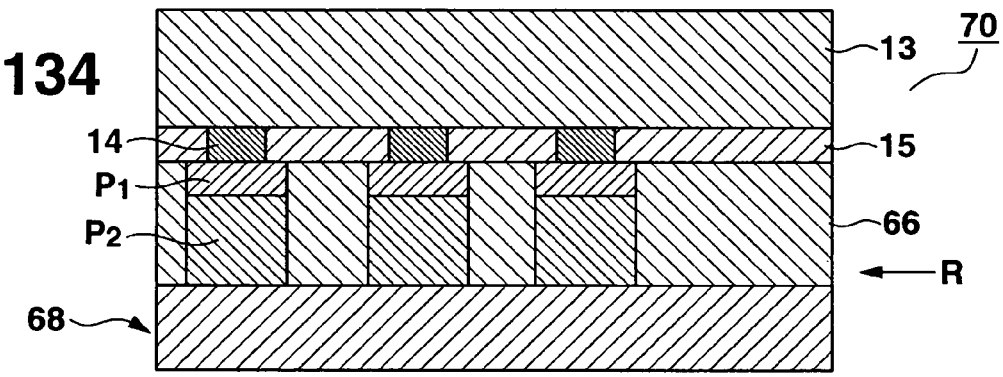

FIG. 131 is a front view showing the fifth step in manufacturing the wiring board according to the 12th embodiment;

FIG. 132 is a front view showing the sixth step in manufacturing the wiring board according to the 12th embodiment;

FIG. 133 is a view showing an arrangement of a semiconductor device according to the 13th embodiment;

FIG. 134 is a sectional view taken along a line A-A in FIG. 133; and

Figure 135:
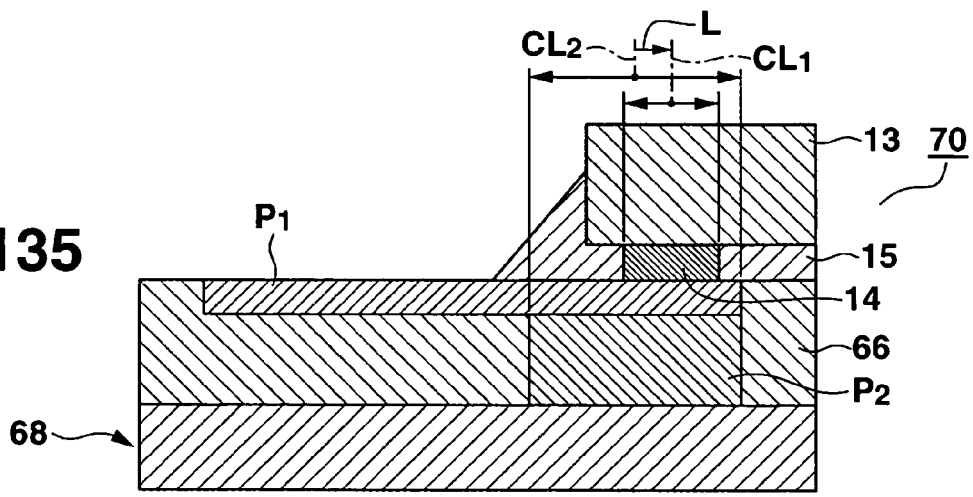

FIG. 135 is a sectional view taken along a line B-B in FIG. 133.

DETAILED DESCRIPTION OF THE INVENTION

Best modes for carrying out the present invention will be described below with reference to the accompanying drawing.

The same reference numerals as in FIGS. 1 and 2 to 5 denote the same parts in the drawing used in the description of the embodiments.

First Embodiment

The first embodiment of the present invention will be described.

First, a method of manufacturing a wiring board according to this embodiment will be described with reference to FIGS. 6 to 14.

Figure 6:
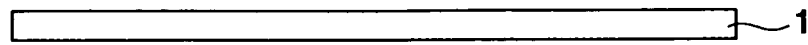
FIG. 6 is a front view showing the first step in manufacturing a wiring board according to the first embodiment.

As shown in FIG. 6, an Ni film (to be also referred to as an "Ni supporting member" hereinafter) 1 having a thickness of 50 to 125 μm is prepared as a supporting member.

Figure 7:
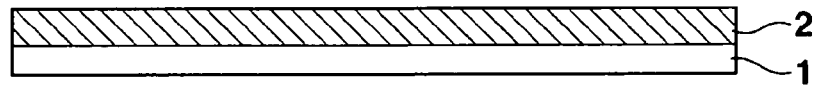
FIG. 7 is a front view showing the second step in manufacturing the wiring board according to the first embodiment.

As shown in FIG. 7, a photosensitive resin layer 2 based on a resin such as a polyimide is formed on the surface of the Ni film 1. The thickness of the photosensitive resin layer 2 is one to three times of the wiring pattern width, and more specifically, about 5 to 30 μm. To form the photosensitive resin layer 2, a known method such as roll coating, spin coating, or casting can be used. After the photosensitive resin is applied, pre-bake is executed in an inert atmosphere at a temperature of about 80° C. to 120° C. to solidify the photosensitive resin and form a film.

Figure 8:
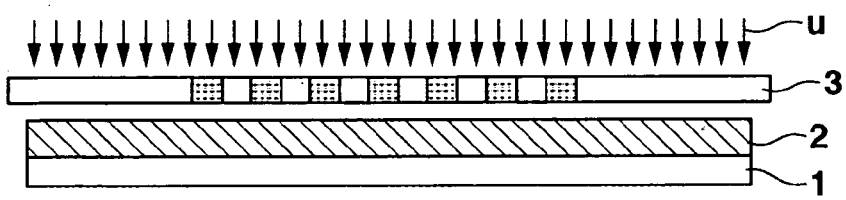
FIG. 8 is a front view showing the third step in manufacturing the wiring board according to the first embodiment.
Figure 9:
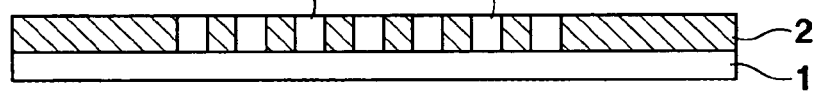
FIG. 9 is a front view showing the fourth step in manufacturing the wiring board according to the first embodiment.

As shown in FIG. 8, a predetermined glass mask 3 appropriate for the purpose is prepared to form the thick portion of the wiring pattern. The structure is irradiated with UV rays u having a predetermined wavelength to expose a wiring pattern formation portion in the photosensitive resin layer 2. The photosensitive resin layer 2 is dipped in or sprayed with a developer dedicated for the photosensitive resin to develop the pattern. Cleaning and drying are executed, thereby completing patterning of the photosensitive resin layer 2 shown in FIG. 9. Formed opening portions 4 are fabricated into a size designed in advance (e.g., a width of 20 to 30 μm).

Figure 10:
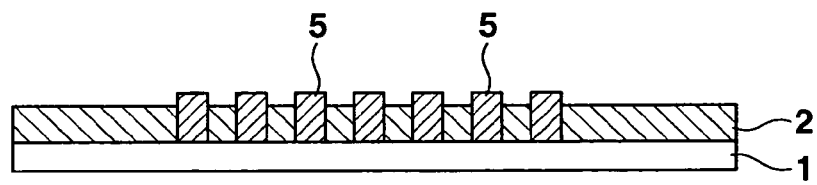
FIG. 10 is a front view showing the fifth step in manufacturing the wiring board according to the first embodiment.

As shown in FIG. 10, the Ni film 1 is set at the cathode potential. The structure is dipped in a known copper sulfate plating solution, and electroplating is performed. The plating temperature is 20° C. to 30° C. The current density is about 1 to 5 A/dm$^2$. When copper sulfate plating is executed until copper is deposited in the opening portions 4 of the photosensitive resin layer 2 and fills the opening portions 4, wiring patterns 5 are formed. The copper sulfate plating is executed until overplating occurs about 5 to 10 μm from the surface of the opening portion 4, and the top is exposed.

Figure 11:
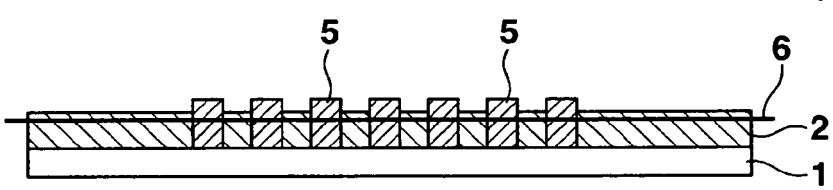
FIG. 11 is a front view showing the sixth step in manufacturing the wiring board according to the first embodiment.

As shown in FIG. 11, the photosensitive resin is cured. This process is executed in an inert atmosphere at a temperature of 300° C. for a curing time of 1 to 2 hrs. The polymerization reaction is made to progress until the photosensitive resin such as polyimide is further dehydrated and polymerized, and the imidization ratio reaches 90% or more. With this process, the photosensitive resin layer 2 having a high thermal resistance is formed. After the photosensitive resin layer 2 is formed, the surface is polished up to a polishing surface 6 by a known polishing method, thereby planarizing the photosensitive resin layer 2 and the thick wiring patterns 5. When the thick wiring patterns 5 are polished to uniform their thicknesses, the high-frequency transmission characteristic can be improved. Immediately after plating, a variation in plating thickness is present, and a small three-dimensional pattern of about 1 to 3 μm is formed on the surface. If polishing is not executed, the three-dimensional pattern acts as an antenna and leaks a high-frequency signal in transmitting a signal of several GHz. Hence, a transmission error such as EMI or EMC occurs due to electromagnetic emission.

Figure 12:
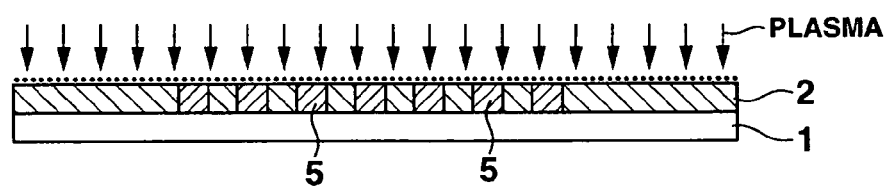
FIG. 12 is a front view showing the seventh step in manufacturing the wiring board according to the first embodiment.
Figure 13:
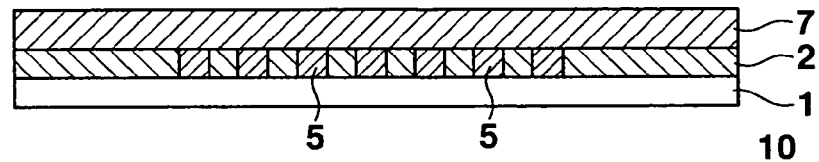
FIG. 13 is a front view showing the eighth step in manufacturing the wiring board according to the first embodiment.

As shown in FIG. 12, a process is performed to increase the adhesion strength between the already formed photosensitive resin layer 2 and a polyimide layer 7 to be formed in FIG. 13. If a process of physically forming a small three-dimensional pattern is executed, a portion serving as an antenna is formed again, as described above. For this reason, any method of physically forming anchors cannot be employed. Instead, the substrate after polishing shown in FIG. 12 is placed in a vacuum apparatus (an apparatus having an arrangement like a film sputter). A plasma treatment is executed by using a reaction gas such as nitrogen, oxygen, or argon, and more preferably, in a nitrogen gas atmosphere. By the plasma treatment, the C—N bonds which have the lowest bond energy in the polyimide molecular ring are dissociated and substituted by nitrogen or OH to form a functional group such as —COOH. Hence, the activation energy on the surface of the photosensitive resin layer 2 made of polyimide increases. In addition, the photosensitive resin layer 2 made of polyimide is formed continuously after the plasma treatment in the same apparatus. To form the photosensitive resin layer 2, vacuum stacking or cold low-pressure stacking can be used.

In this way, as shown in FIG. 13, a substrate is formed, in which the thick wiring patterns 5 are formed on the Ni supporting member 1, and the polyimide layer 7 is also formed on the wiring patterns 5.

Figure 14:
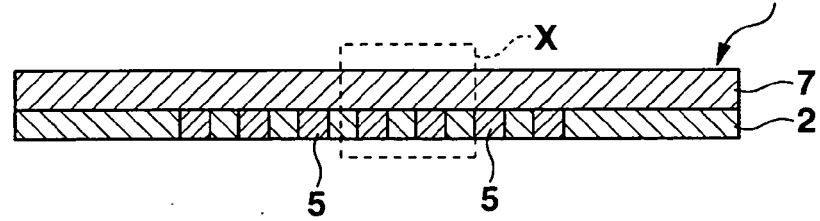
FIG. 14 is a front view showing the ninth step in manufacturing the wiring board according to the first embodiment.

As shown in FIG. 14, only Ni is etched without etching copper. More specifically, only Ni is etched by using an etchant having a high selectivity (e.g., alkali-based nickel etchant such as Enstrip NP available from Meltex, Metex SCB available from MacDermid, Top Rip AZ available from Okuno Chemical Industries, or Oxy-Strip OS available from Ebara-Udylite) to wholly remove the Ni film 1. A surface treatment (not shown) using Au, Sn, or In is executed for the exposed wiring patterns 5. After that, an insulating surface protective film (not shown) of a polyimide resin or epoxy resin is formed on the lower surface of the photosensitive resin layer 2 by a known method except a region to which an electronic component such as an active device or passive device is to be electrically connected. A wiring board 10 is thus formed.

Figure 15:
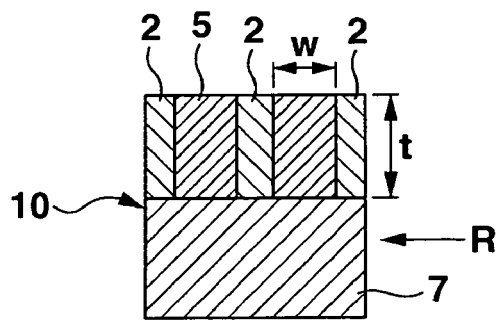
FIG. 15 is a view showing details of a portion X in FIG. 14 in the inverted state.
Figure 16:
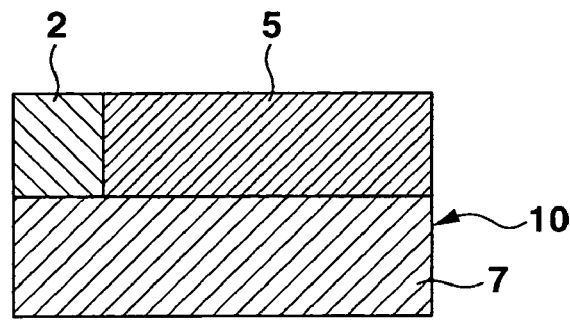
FIG. 16 is a view showing a wiring board 10 in FIG. 15 viewed from a direction R.

FIG. 15 is a view showing details of a portion X in FIG. 14 in the inverted state. FIG. 16 is a view showing the wiring board 10 in FIG. 15 viewed from a direction R (right side). This corresponds to the lead direction of the wiring patterns 5.

As is apparent from the section shown in FIG. 15, i.e., the section perpendicular to the lead direction (to be referred to as a "widthwise-direction section" hereinafter), a thickness t and width W of the wiring pattern 5 have a relationship t≧W in the widthwise-direction section of the wiring board 10. On the other hand, in the lead direction (to be also referred to as a "longitudinal direction" hereinafter), the thickness is t throughout the wiring pattern 5.

As described above, in the wiring board according to this embodiment, the interconnection (to be also referred to as a "lead" hereinafter) formed on the resin having a softening point lower than the bonding temperature has a square section, and the thickness t is equal to or more than the width W. For these reasons, the rigidity of the lead increases. The lead is not deformed even in the TC bonding method which executes bonding under bonding conditions to cause Cu interdiffusion in AuSn bonding. Hence, any edge short circuit to a semiconductor chip 13 can be prevented.

In bonding, the lead is not cut by a bump electrode 14. No crack is formed in the lead, either. Since the lead is not peeled from the organic substrate, the reliability increases. Since the lead rigidity increases, the bonding strength after bonding increases so that no chip peeling occurs.

In the conventional circuit board, the functional group and carbonized layer are present on the surface of the organic resin layer on the side where the semiconductor chip 13 is mounted. In this embodiment, the functional group and carbonized layer are not present. For this reason, the insulation resistance on the resin surface does not degrade due to bonding between the functional group and a metallic chloride. In addition, the insulation resistance does not degrade due to the presence of a carbonized layer.

Since all the three surfaces of the wiring pattern 5, except the surface to be used for surface mounting, are covered with the photosensitive resin, the adhesion strength to the photosensitive resin is very high. In addition, since the portions between the wiring patterns 5 are covered with the photosensitive resin, the insulation resistance between the wiring patterns 5 is very high.

On the mounting surface of the semiconductor chip 13, the surface of the photosensitive resin layer 2 is flat and smooth without any three-dimensional pattern formed by the manufacturing process. For this reason, no conductive substance such as a metal exists in the three-dimensional pattern as a residue, and no ion migration occurs due to the conductive substance. That is, the insulation resistance between the wiring patterns 5 is very high.

Figure 17:
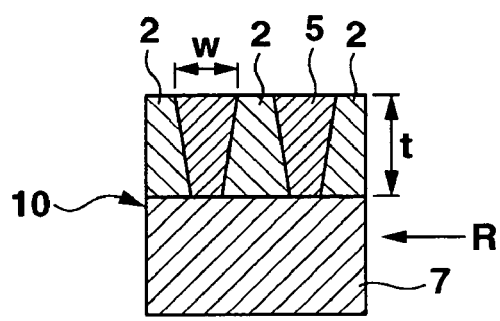
FIG. 17 is a view showing a modification of the wiring board according to the first embodiment in correspondence with FIG. 15.
Figure 18:
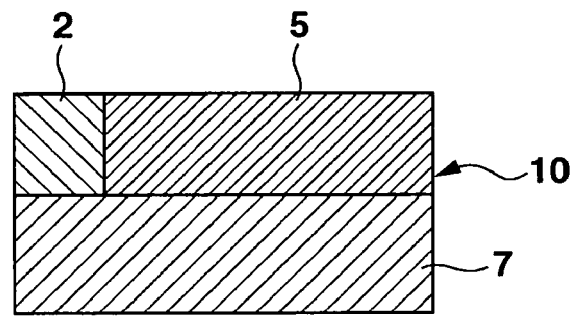
FIG. 18 is a view showing the modification of the wiring board according to the first embodiment in correspondence with FIG. 16.

The sectional shape of the wiring pattern 5 in the widthwise direction is not limited to the square as shown in FIG. 15. An inverted trapezoidal shape as shown in FIG. 17 can also be employed. That is, the width W of the wiring pattern 5 exposed to the surface on the side to mount the semiconductor chip 13 may be larger. FIG. 18 is a view showing the structure (FIG. 17) viewed from the direction R (right side).

Figure 19:
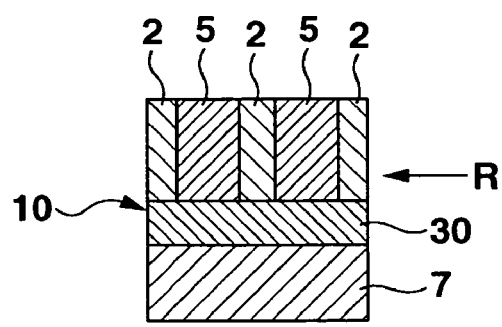
FIG. 19 is a view showing another modification (arrangement comprising a low-absorptivity layer) of the wiring board according to the first embodiment in correspondence with FIG. 15.
Figure 20:
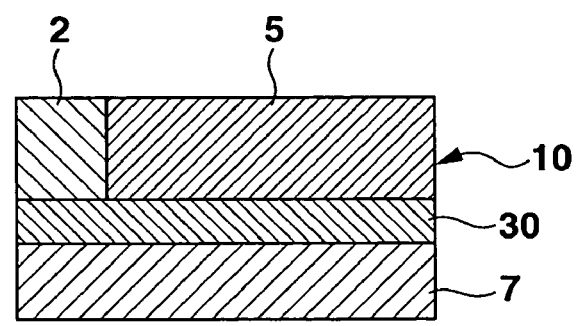
FIG. 20 is a view showing another modification (arrangement comprising a low-absorptivity layer) of the wiring board according to the first embodiment in correspondence with FIG. 16.

As shown in FIGS. 19 and 20, a low-absorptivity layer 30 made of an organic material such as liquid crystal polymer having a lower absorptivity than polyimide may be inserted between the layer having the wiring patterns 5 and the polyimide layer 7. Since a barrier layer is formed on the lower surfaces of the wiring patterns 5, oxidation of the lower surfaces of the wiring patterns 5 and deterioration over time in peeling strength due to water invasion can be prevented.

As the organic material, polyimide has been described as an example. However, an epoxy resin may particularly be used as the organic material in forming the wiring patterns 5. The epoxy resin is less expensive than polyimide and has a lower absorptivity than polyimide. Hence, the epoxy resin can suppress oxidation of the wiring patterns 5.

A non-photosensitive resin may be used in place of the photosensitive resin. The non-photosensitive resin is less expensive than polyimide and has a lower absorptivity than polyimide. In this case, a polyimide etching process must be added.

The wiring patterns 5 may be formed not by electroplating but by electroless plating. Electroless plating is more excellent than electroplating in uniforming the thickness.

In forming the wiring patterns 5, the copper crystal grain boundary (grain size) after deposition does not change. The hardness and conductivity of deposited copper are also kept unchanged. In the electroplating process, the plating conditions may be changed instead of fixing them. More specifically, at the early stage of plating, conditions to obtain a large copper crystal size after deposition are set. That is, plating is executed at a high plating solution temperature (30° C. to 50° C.) and high current density (e.g., 5 to 10 A/dm$^2$). Continuously, at the final stage of plating, conditions to make the crystal of deposited Cu finer, i.e., obtain a small crystal grain size are set. That is, plating is executed at a plating solution temperature of 10° C. and a current density of 2 A/dm$^2$ or less. In the section of the wiring pattern 5, the crystal size is large near the mounting surface so that the hardness is low, and the conductivity is high. That is, copper with properties suitable for mounting is deposited. On the opposing surface, the hardness is high, and the conductivity is low. That is, since the rigidity and flexural strength are high, the mechanical strength can be increased.

To continuously change the crystal size of deposited copper, a hoop plating apparatus is used rather than a batch plating apparatus. In the hoop plating apparatus, since a plurality of plating tanks can be connected in tandem, plating can continuously be executed while changing the plating conditions (temperature, current density, and plating solution).

For the wiring board 10, a flexible substrate is preferably used. However, a rigid substrate less expensive than a flexible substrate may be used.

Second Embodiment

The second embodiment of the present invention will be described.

Figure 21:
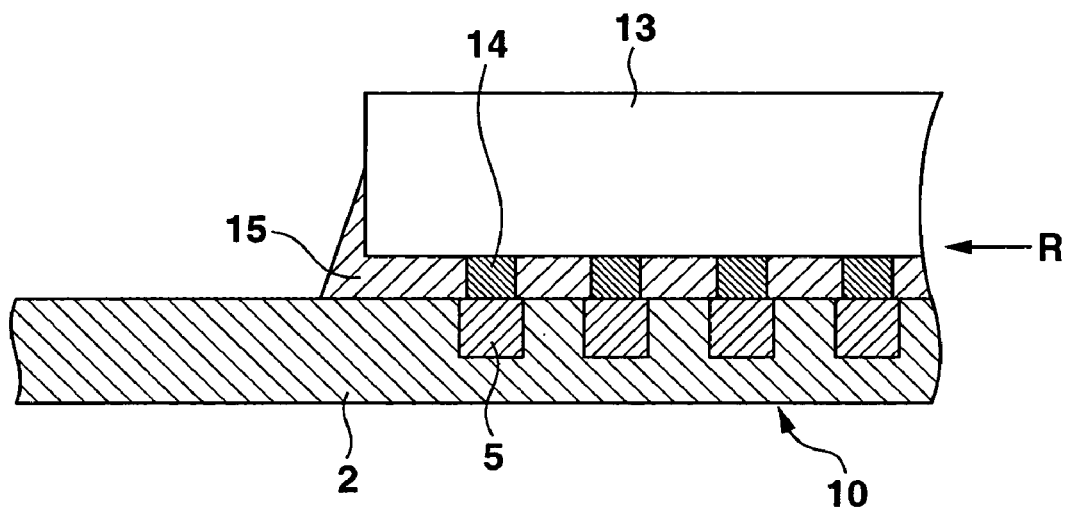
FIG. 21 is a view showing an arrangement of a semiconductor device according to the second embodiment.
Figure 22:
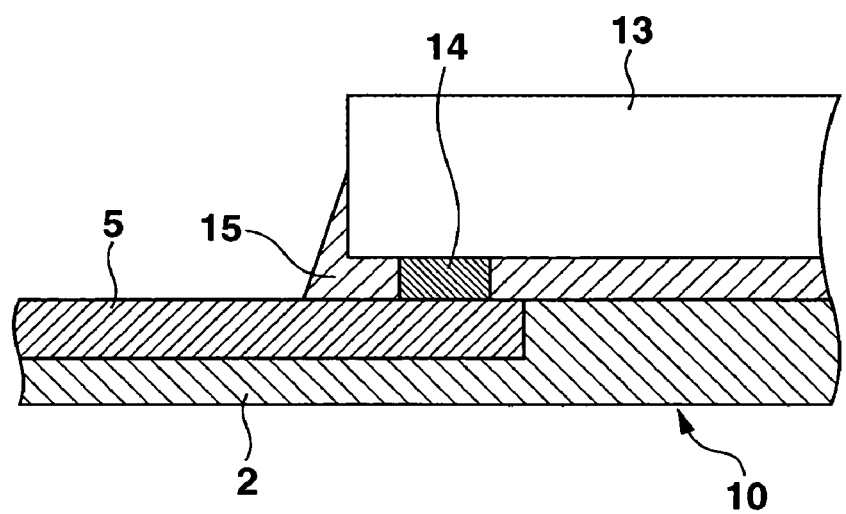
FIG. 22 is a view showing the semiconductor device in FIG. 21 viewed from a direction R (right side)

A semiconductor device according to this embodiment will be described with reference to FIGS. 21 and 22. FIG. 21 shows the widthwise-direction section of the semiconductor device. FIG. 22 shows the semiconductor device viewed from a direction R (right side) in FIG. 21. This semiconductor device is manufactured in the following way.

Figure 1:
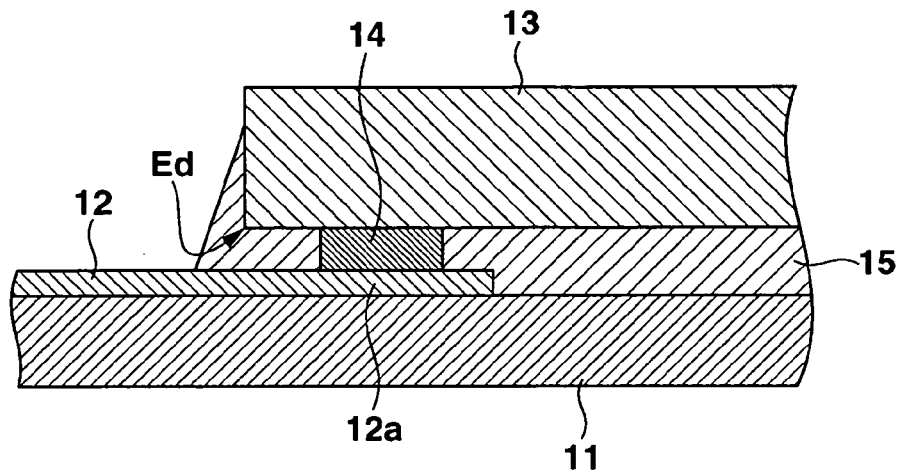
FIG. 1 is a front view showing an arrangement of a COF semiconductor device according to a prior art.
Figure 2:
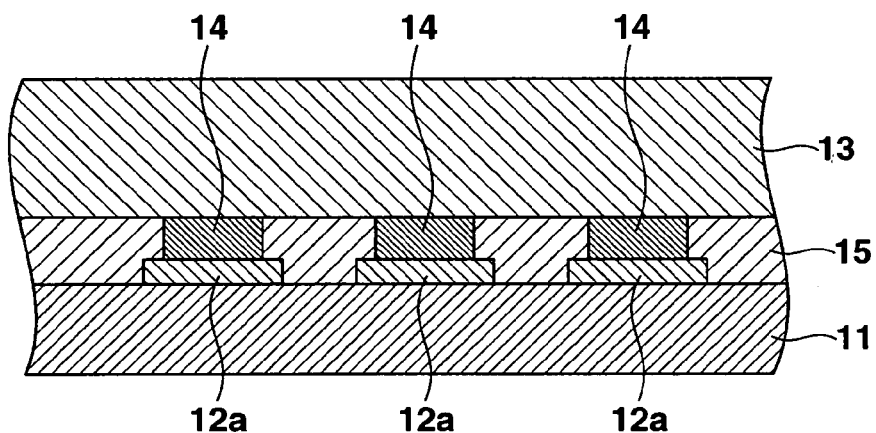
FIG. 2 is a side view of the semiconductor device shown in FIG. 1.
Figure 5:
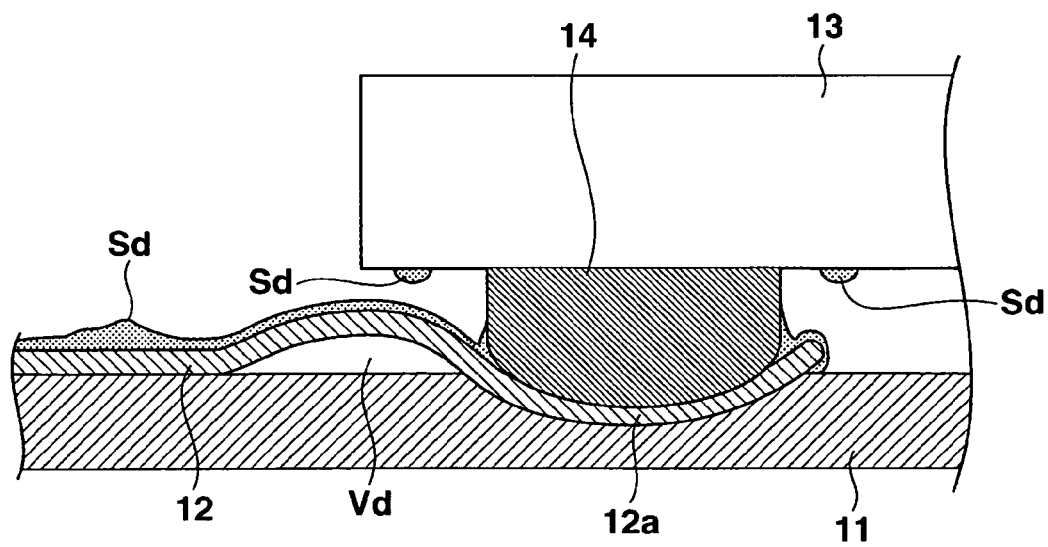
FIG. 5 is an enlarged view showing the vicinity of the bonding portion between a semiconductor chip and a wiring board which are bonded by the prior art.
Figure 3:
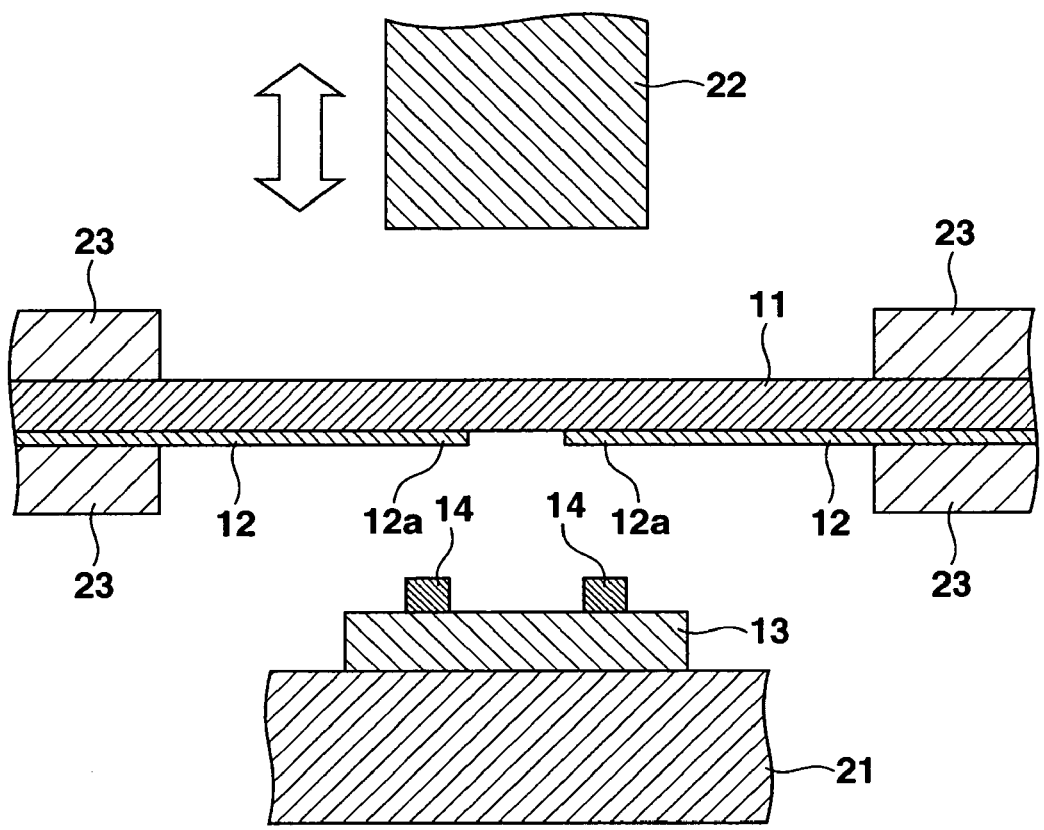
FIG. 3 is a front view showing the state before bonding so as to explain the operation of a bonding apparatus.
Figure 4:
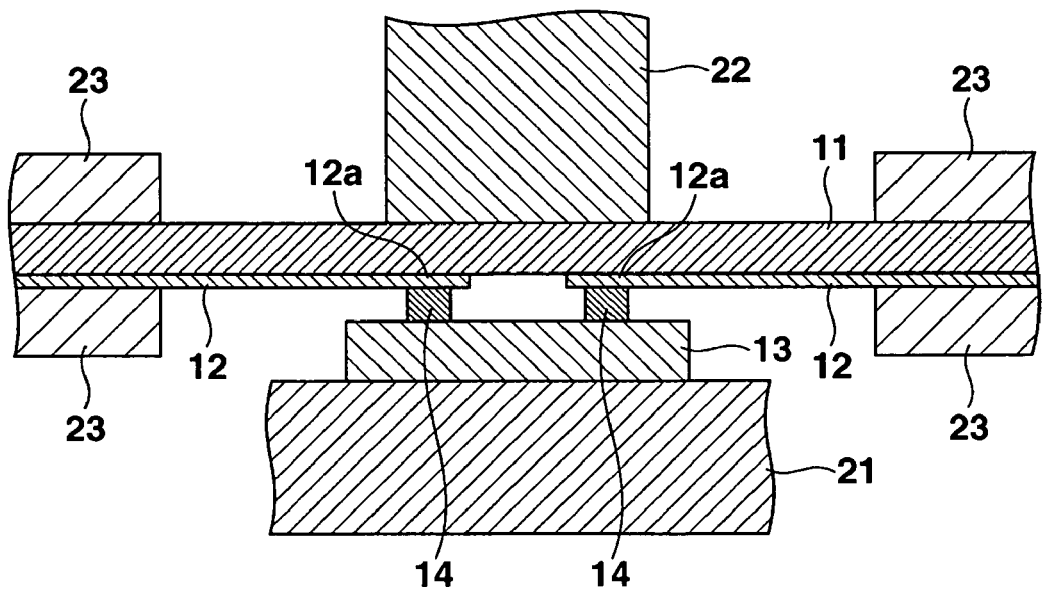
FIG. 4 is a front view showing the state during bonding so as to explain the operation of the bonding apparatus.

To manufacture the semiconductor device shown in FIGS. 21 and 22, a bonding apparatus shown in FIGS. 3 and 4 is prepared. In this bonding apparatus, a bonding tool 22 movable in the vertical direction is arranged above a stage 21 having a built-in heater (not shown). A semiconductor chip 13 is placed on the stage 21 with bump electrodes 14 being directed upward. A clamp 23 clamps a wiring board 10 at the periphery of the region where the semiconductor chip 13 is to be mounted. An insulating surface protective film (not shown) of a polyimide resin or epoxy resin is formed on the lower surface of the wiring board 10 by a known method except a region to which an electronic component such as an active device or passive device is to be electrically connected. The bonding tool 22 is moved downward.

The wiring board 10 has the lower surface opposing the semiconductor chip 13 all over the semiconductor chip mounting region. The wiring board 10 is set with its lower surface being directed to the upper surface of the semiconductor chip 13, i.e., with the surface having wiring 12 being directed toward the semiconductor chip 13.

Next, the bump electrodes 14 of the semiconductor chip 13 and connection terminals 12a of the wiring board 10 are aligned.

As shown in FIG. 4, for example, the stage 21 is moved upward to bring the bump electrodes 14 into contact with the connection terminals 12a. The bonding tool 22 is moved downward again. In this state, the stage 21 is heated to 350° C. to 450° C., and preferably, about 400° C. to heat the semiconductor chip 13. In addition, the bonding tool 22 is heated to 250° C. to 350° C., and preferably, about 300° C. at which Cu interdiffusion to the bump electrodes 14 occurs, and brought into direct contact with the upper surface of the wiring board 10 to press it. The bump electrodes 14 and the connection terminals 12a formed on the wiring board 10 are heated and pressed for about 1 to 3 sec. The bonding load is about 10 to 17 mg/μm$^2$.

The gold bumps 14 are formed on the semiconductor chip 13 in advance. On the other hand, an Sn layer is formed on the wiring 12 in advance. The Sn layer is formed by using an organic-acid-based electroless plating solution. The thickness of the Sn layer is about 0.5 to 1.0 μm. After that, the space formed between the semiconductor chip 13 and a photosensitive resin layer 2 is filled with an insulating resin 15 (also called a sealing resin) by a known side potting method. The insulating resin 15 is heated and set.

For the semiconductor device thus manufactured according to this embodiment, AuSn bonding is executed by using the wiring board 10 as described in the first embodiment by using the bonding apparatus (also called a "TAB bonder") shown in FIGS. 3 and 4. Since the rigidity of wiring patterns 5 is high in the vicinity of connection to the bump electrodes 14, the wiring patterns 5 are not deformed in bonding.

Hence, a semiconductor device can be formed in which AuSn eutectic bonding is executed at a temperature of 300° C. or more at which Cu interdiffusion to the bump electrodes 14 occurs without bending the wiring patterns 5 or peeling them from a polyimide layer 7 and forming any void Vd. In addition, since the wiring patterns 5 are not bent, and the planarity before bonding can be maintained, the insulating resin 15 can smoothly be injected into the space formed between the photosensitive resin layer 2 and the semiconductor chip 13 which is formed into a height of 10 to 30 μm. For this reason, no voids (bubbles) are formed in the insulating resin 15. Since no void expansion/contraction occurs in a reliability test such as a heat cycle test or thermal shock test, a semiconductor device with a high reliability can be formed.

In the above example, the semiconductor device is formed by using the TAB bonder. Instead of the TAB bonder, a flip chip bonder may be used to apply the bonding temperature mainly from the lower surface of the chip.

Figure 24:
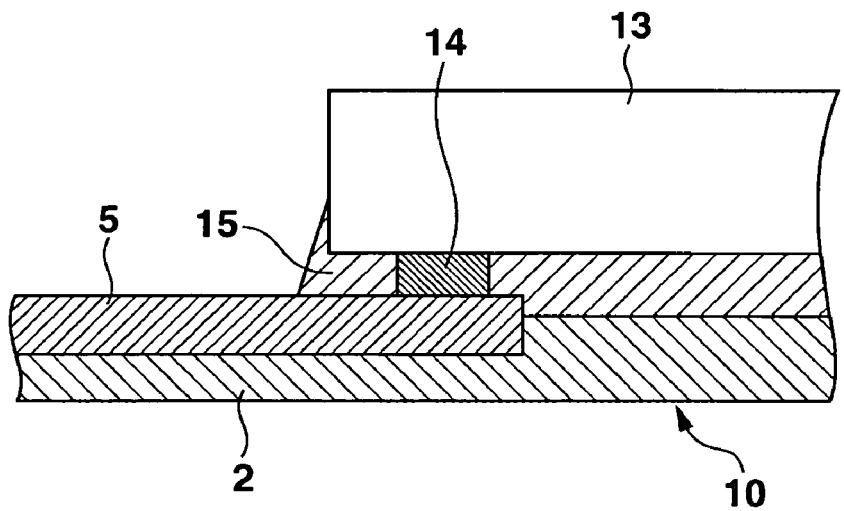
FIG. 24 is a view showing the semiconductor device in FIG. 23 viewed from a direction R (right side)
Figure 25:
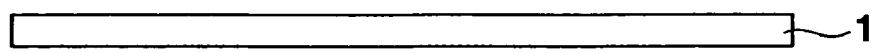
FIG. 25 is a front view showing the first step in manufacturing a wiring board for the semiconductor device shown in FIGS. 23 and 24.
Figure 26:
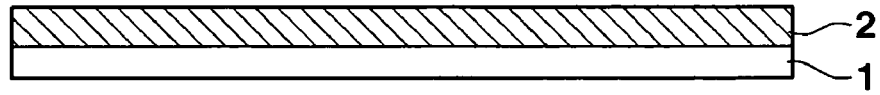
FIG. 26 is a front view showing the second step in manufacturing the wiring board for the semiconductor device shown in FIGS. 23 and 24.
Figure 27:
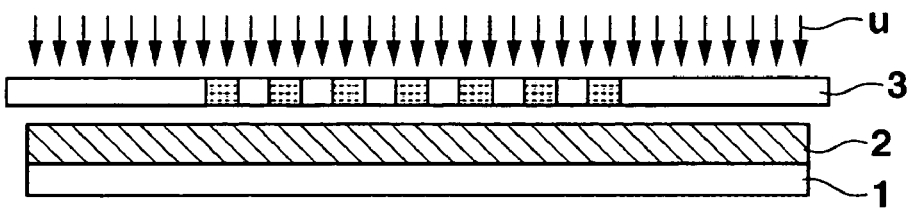
FIG. 27 is a front view showing the third step in manufacturing the wiring board for the semiconductor device shown in FIGS. 23 and 24.
Figure 28:
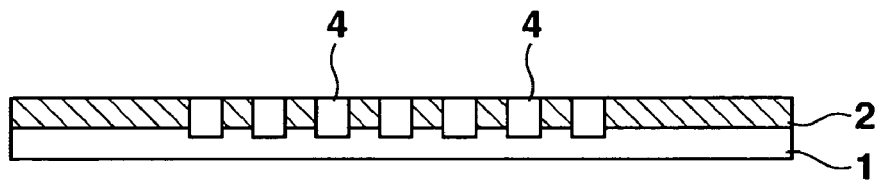
FIG. 28 is a front view showing the fourth step in manufacturing the wiring board for the semiconductor device shown in FIGS. 23 and 24.
Figure 29:
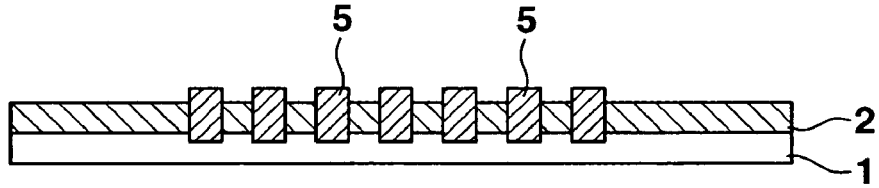
FIG. 29 is a front view showing the fifth step in manufacturing the wiring board for the semiconductor device shown in FIGS. 23 and 24.
Figure 30:
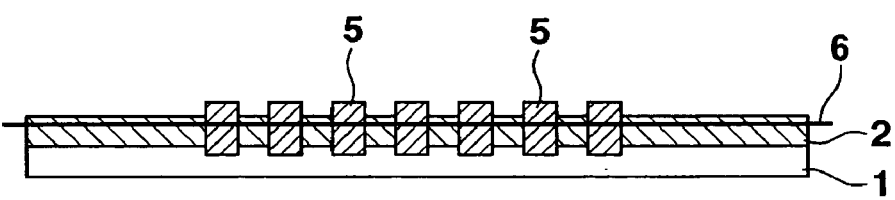
FIG. 30 is a front view showing the sixth step in manufacturing the wiring board for the semiconductor device shown in FIGS. 23 and 24.
Figure 31:
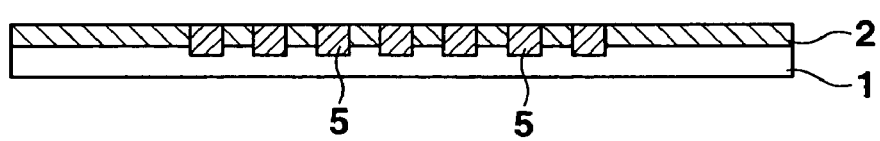
FIG. 31 is a front view showing the seventh step in manufacturing the wiring board for the semiconductor device shown in FIGS. 23 and 24.
Figure 32:
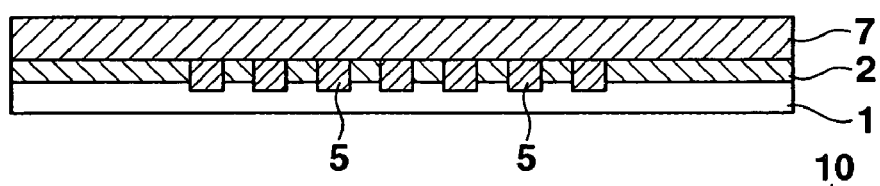
FIG. 32 is a front view showing the eighth step in manufacturing the wiring board for the semiconductor device shown in FIGS. 23 and 24.
Figure 33:
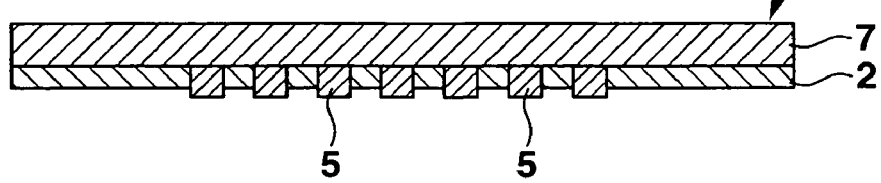
FIG. 33 is a front view showing the ninth step in manufacturing the wiring board for the semiconductor device shown in FIGS. 23 and 24.

In the semiconductor device, the surface including the wiring patterns 5 and photosensitive resin layer 2 is flat, as shown in FIG. 21. However, the semiconductor device of this embodiment is not limited to this arrangement. As shown in FIG. 24, the wiring patterns 5 may project from the surface of the photosensitive resin layer 2. Since the exposed surface and area of the wiring patterns 5 increase, and the contact area to the insulating resin 15 can be increased, the bonding strength of the insulating resin 15 can be increased.

Figure 23:
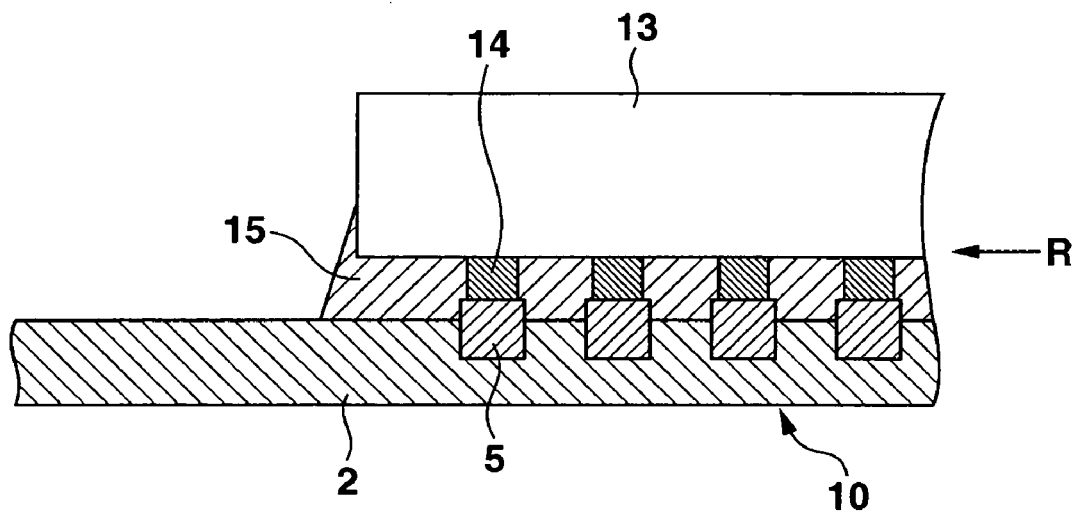
FIG. 23 is a view showing a modification of the semiconductor device according to the second embodiment.

FIG. 24 shows the widthwise-direction section in FIG. 23 viewed from the direction R (right side). FIGS. 25 to 33 are views showing steps in manufacturing the wiring board for the semiconductor device shown in FIGS. 23 and 24. An insulating surface protective film (not shown) of a polyimide resin or epoxy resin is formed on the upper surface of the photosensitive resin layer 2 by a known method except a region to which an electronic component such as an active device or passive device is to be electrically connected.

Third Embodiment

The third embodiment of the present invention will be described.

First, a method of manufacturing a wiring board according to this embodiment will be described with reference to FIGS. 34 to 42.

Figure 34:
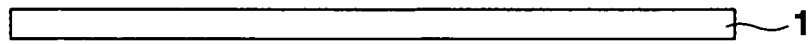
FIG. 34 is a front view showing the first step in manufacturing a wiring board according to the third embodiment.

As shown in FIG. 34, an Ni film 1 having a thickness of 50 to 125 μm is prepared as a supporting member.

Figure 35:
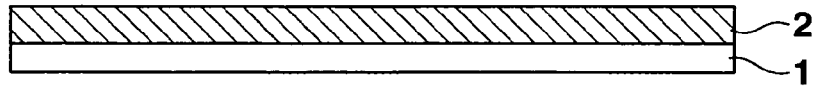
FIG. 35 is a front view showing the second step in manufacturing the wiring board according to the third embodiment.

As shown in FIG. 35, a photosensitive resin layer 2 based on a resin such as a polyimide is formed on the surface of the Ni film 1. The thickness of the photosensitive resin layer 2 is one to three times of the wiring pattern width, and more specifically, about 5 to 30 µm. To form the photosensitive resin layer 2, a known method such as roll coating, spin coating, or casting can be used. After the photosensitive resin is applied, pre-bake is executed in an inert atmosphere at a temperature of about 80° C. to 120° C. to solidify the photosensitive resin and form a film.

Figure 36:
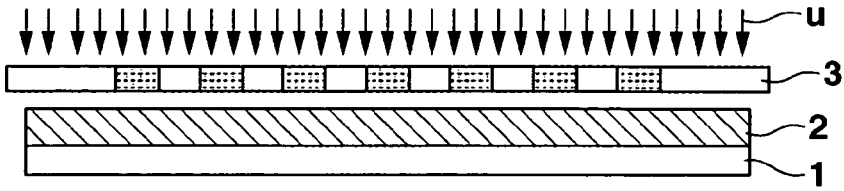
FIG. 36 is a front view showing the third step in manufacturing the wiring board according to the third embodiment.
Figure 37:
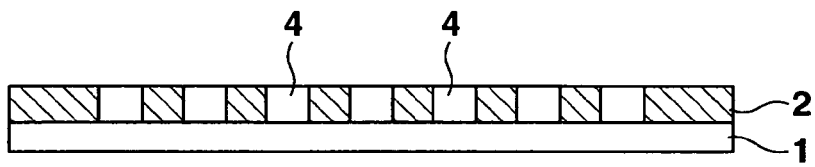
FIG. 37 is a front view showing the fourth step in manufacturing the wiring board according to the third embodiment.

As shown in FIG. 36, a predetermined glass mask 3 appropriate for the purpose is prepared to form the thick portion of the wiring pattern. The structure is irradiated with UV rays u having a predetermined wavelength to expose a wiring pattern formation portion in the photosensitive resin layer 2. The photosensitive resin layer 2 is dipped in or sprayed with a developer dedicated for the photosensitive resin to develop the pattern. Cleaning and drying are executed, thereby completing patterning of the photosensitive resin layer 2 shown in FIG. 37. Formed opening portions 4 are fabricated into a size defined in the design specifications in advance.

Figure 38:
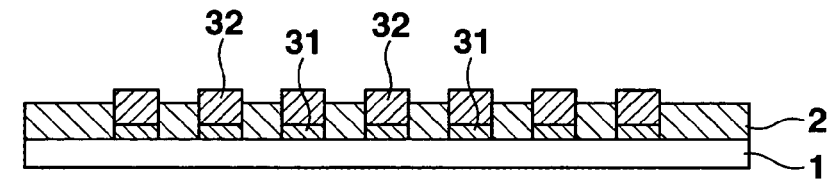
FIG. 38 is a front view showing the fifth step in manufacturing the wiring board according to the third embodiment.

As shown in FIG. 38, the Ni film 1 is set at the cathode potential. In the first embodiment, in forming the wiring patterns 5, conditions for the copper crystal grain boundary (grain size) after deposition do not change. The hardness and conductivity of deposited copper are also kept unchanged. In this embodiment, at the early stage of plating, conditions to obtain a large copper crystal size after deposition are set. That is, plating is executed at a high plating solution temperature and high current density. Continuously, at the final stage of plating, conditions to make the crystal of deposited Cu finer, i.e., obtain a small crystal grain size are set. That is, plating is executed at a low plating solution temperature and low current density, thereby forming wiring patterns.

In the section of the wiring pattern, the crystal size is large near the mounting surface so that the hardness is low, and the conductivity is high. That is, copper with properties suitable for mounting is deposited to form a copper layer. On the opposing side, since the crystal size is small, the hardness is high, and the conductivity is low. Copper with a high mechanical strength is deposited to form a copper layer so that the wiring patterns themselves are rarely stretched or deformed even upon receiving load or heat in bonding.

More specifically, to deposit copper having excellent mounting properties, plating is executed at a plating solution temperature of 20° C. to 30° C. and a current density of 1 to 5 A/dm$^2$. In the section of the wiring pattern, the crystal size is made large near the mounting surface to deposit copper having properties suitable for mounting.

To deposit copper having a high mechanical strength, plating is executed at a plating temperature of 10° C. and a current density of about 1 A/dm$^2$ or less. Hence, the crystal size can be made small, and copper having a high hardness, high rigidity, and high mechanical strength is deposited.

As shown in FIG. 38, the copper plating is executed until overplating occurs about 5 to 10 µm from the surface of the opening portion 4 in the photosensitive resin layer 2 of, e.g., polyimide, and the top is exposed. Hence, the wiring pattern has a two-layered structure.

To continuously change the crystal size of deposited copper, a hoop (also called RtoR) plating apparatus is used rather than a batch plating apparatus. In the hoop plating apparatus, since a plurality of plating tanks can be connected in tandem, plating can continuously be executed while changing the plating conditions (temperature, current density, and plating solution).

As shown in FIG. 38, the photosensitive resin layer 2 made of polyimide is cured. This process is executed in an inert atmosphere at a temperature of 300° C. for a curing time of 1 to 2 hrs. The polymerization reaction is made to progress until the polyimide is further dehydrated and polymerized, and the imidization ratio reaches 90% or more. With this process, the photosensitive resin layer 2 having a high thermal resistance is formed.

Figure 39:
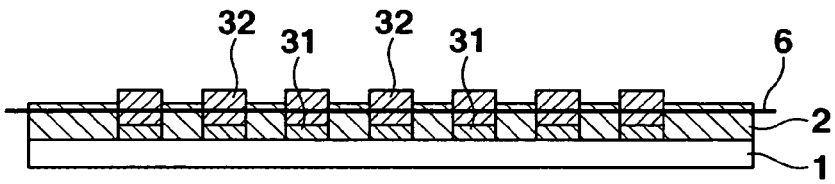
FIG. 39 is a front view showing the sixth step in manufacturing the wiring board according to the third embodiment.

After the photosensitive resin layer 2 is formed in this way, the surface is polished up to a polishing surface 6 shown in FIG. 39 by a known polishing method, thereby planarizing the photosensitive resin layer 2 and the thick wiring patterns each including a lower Cu layer 31 and upper Cu layer 32. When the thick wiring patterns are polished to uniform their thicknesses, the high-frequency transmission characteristic can be improved. Immediately after plating, a variation in plating thickness is present, and a small three-dimensional pattern of about 1 to 3 µm is formed on the surface. If polishing is not executed, the three-dimensional pattern acts as an antenna and leaks a high-frequency signal in transmitting a signal of several GHz. Due to this leakage, a transmission error such as EMI or EMC by electromagnetic emission occurs.

Figure 40:
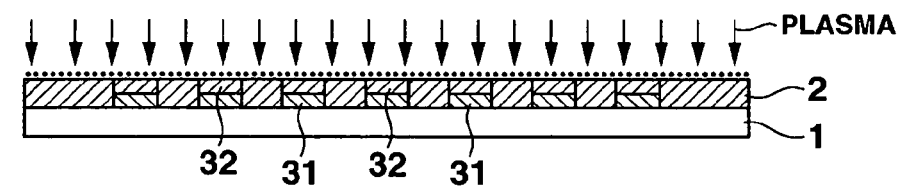
FIG. 40 is a front view showing the seventh step in manufacturing the wiring board according to the third embodiment.

As shown in FIG. 40, a process is performed to increase the adhesion strength between the photosensitive resin layer 2 and a polyimide layer 7 to be formed later. If a process of physically forming a small three-dimensional pattern is executed, a portion serving as an antenna is formed again, as described above. For this reason, any method of physically forming anchors cannot be employed. Instead, the substrate after polishing shown in FIG. 40 is placed in a vacuum apparatus (an apparatus having an arrangement like a film sputter). A plasma treatment is executed by using a reaction gas such as nitrogen, oxygen, or argon, and more preferably, in a nitrogen gas atmosphere. By the plasma treatment, the C—N bonds which have the lowest bond energy in the polyimide molecular ring are dissociated and substituted by nitrogen or OH to form a functional group such as —COOH. Hence, the activation energy on the surface of the photosensitive resin layer 2 increases. In addition, the polyimide layer 7 is formed continuously after the plasma treatment in the same apparatus. To form the polyimide layer 7, vacuum laminating or cold low-pressure laminating can be used. In the above example, the process to increase the adhesion strength is executed for the surface of the photosensitive resin layer 2. However, the process to increase the adhesion strength may be executed for both of the opposing surfaces of the photosensitive resin and polyimide resin. In this case, the bonding strength can further be increased.

Figure 41:
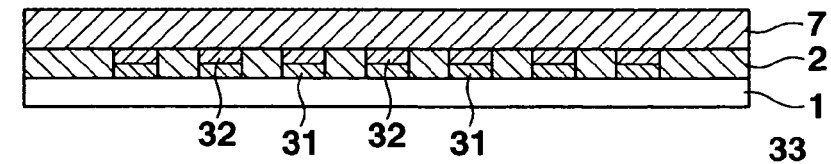
FIG. 41 is a front view showing the eighth step in manufacturing the wiring board according to the third embodiment.

In this way, as shown in FIG. 41, a substrate is formed, in which the thick wiring patterns each including the lower Cu layer 31 and upper Cu layer 32 are formed on the Ni supporting member 1, and the polyimide layer 7 is also formed on the wiring patterns.

Figure 42:
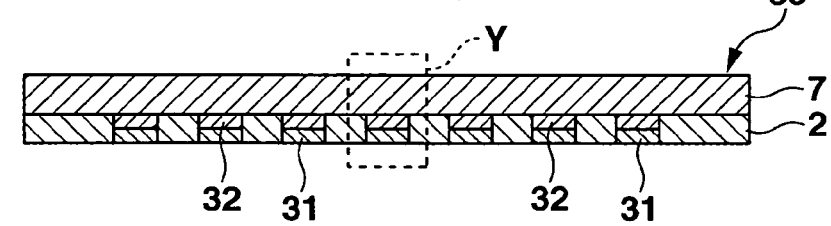
FIG. 42 is a front view showing the ninth step in manufacturing the wiring board according to the third embodiment.

As shown in FIG. 42, only Ni is etched without etching copper. More specifically, only Ni is etched by using an etchant having a high selectivity (e.g., alkali-based nickel etchant such as Enstrip NP available from Meltex, Metex SCB available from MacDermid, Top Rip AZ available from Okuno Chemical Industries, or Oxy-Strip OS available from Ebara-Udylite) to wholly remove the Ni film 1. A surface treatment (not shown) using Au, Sn, or In is executed for the exposed lower Cu layers 31. After that, an insulating surface protective film (not shown) of a polyimide resin or epoxy resin is formed on the lower surface of the photosensitive resin layer 2 by a known method except a region to which an electronic component such as an active device or passive device is to be electrically connected. A wiring board 33 is thus formed.

Figure 43:
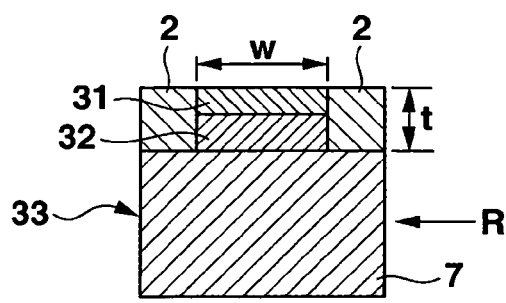
FIG. 43 is a view showing details of a portion Y in FIG. 42 in the inverted state.
Figure 44:
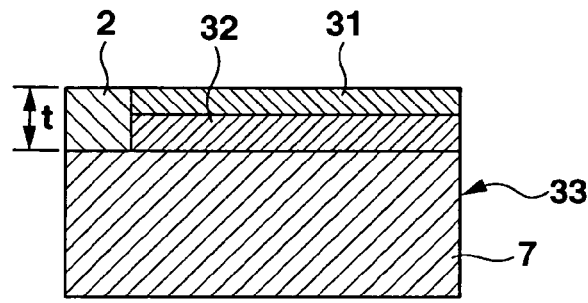
FIG. 44 is a view showing the wiring board in FIG. 43 viewed from a direction R.

FIG. 43 is a view showing details of a portion Y in FIG. 42 in the inverted state. FIG. 44 is a view showing the wiring board 33 in FIG. 43 viewed from a direction R (right side). This corresponds to the lead direction of the wiring patterns.

As is apparent from the section shown in FIG. 43, a thickness t of the wiring pattern including the lower Cu layer 31 and upper Cu layer 32 and a width W of the wiring pattern have a relationship t<W in the widthwise-direction section of the wiring board 33. On the other hand, as shown in FIG. 44, in the lead direction (longitudinal direction), the thickness is t throughout the wiring pattern 5 having the multilayered structure.

As described above, in the wiring board according to this embodiment, the wiring pattern has the multilayered structure including the lower Cu layer 31 having good mounting properties on the surface side and the upper Cu layer 32 having an excellent mechanical characteristic inside. With this structure, the wiring pattern can be thin. Hence, a flexible substrate can be used without detrimental to its characteristic feature, i.e., flexibility.

In the above example, the wiring pattern including the lower Cu layer 31 and upper Cu layer 32 is made of only copper. However, the present invention is not limited to this. The wiring pattern may have a multilayered structure made of different kinds of metals. For example, the mounting surface may be made of copper excellent in solder mounting properties, and the lower layer may be made of a material having a high mechanical strength and, for example, Ni or an alloy thereof, Cr or an alloy thereof, or an Fe- or Ti-based copper alloy.

Figure 45:
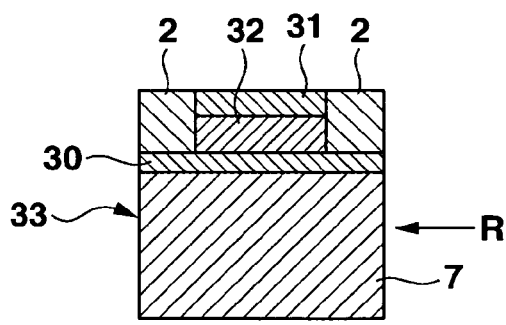
FIG. 45 is a view showing a modification (arrangement comprising a low-absorptivity layer) of the wiring board according to the third embodiment in correspondence with FIG. 43.
Figure 46:
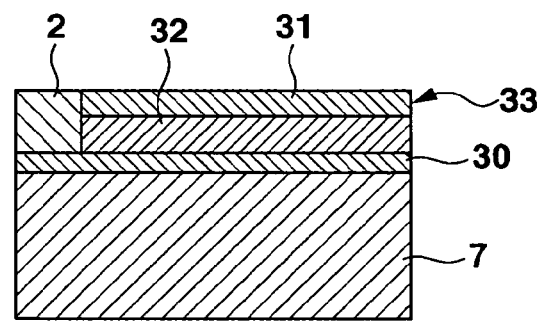
FIG. 46 is a view showing the modification (arrangement comprising a low-absorptivity layer) of the wiring board according to the third embodiment in correspondence with FIG. 44.

As shown in FIGS. 45 and 46, a low-absorptivity layer 30 described in the FIGS. 19 and 20 may be inserted between the layer having the wiring patterns and the polyimide layer 7. FIG. 46 is a view showing the widthwise-direction section in FIG. 45 viewed from the direction R (right side).

Fourth Embodiment

The fourth embodiment of the present invention will be described.

Figure 47:
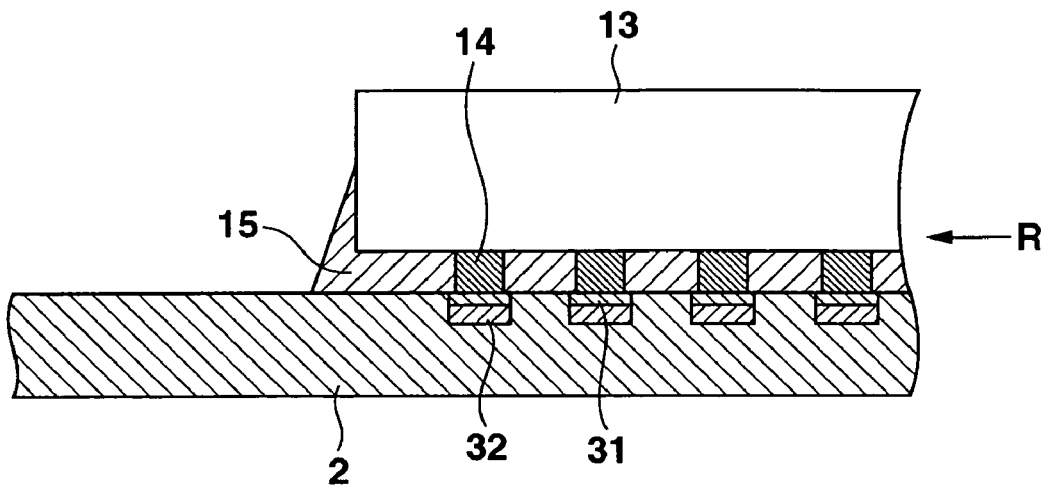
FIG. 47 is a view showing an arrangement of a semiconductor device according to the fourth embodiment.
Figure 48:
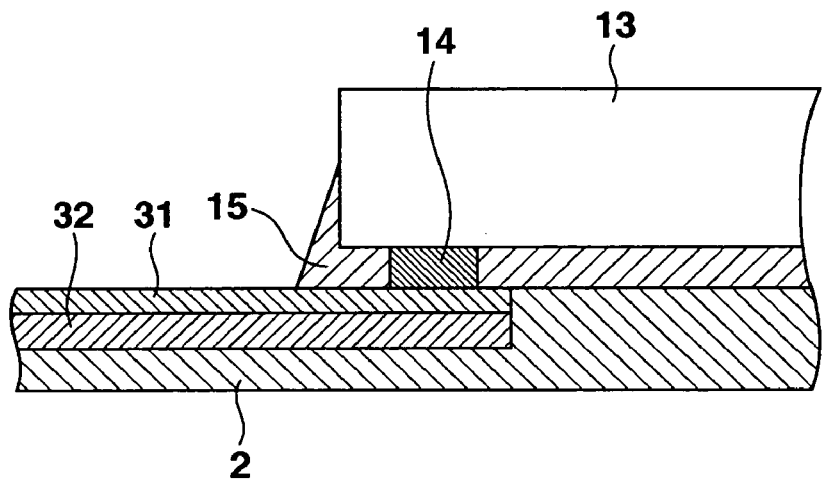
FIG. 48 is a view showing the semiconductor device in FIG. 47 viewed from a direction R (right side)
Figure 49:
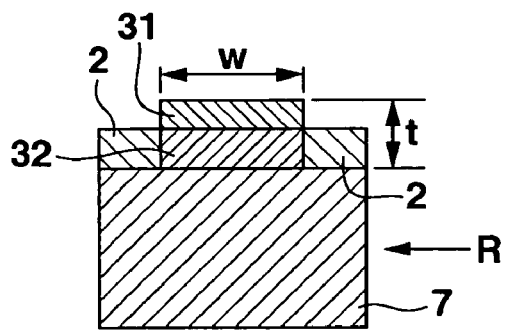
FIG. 49 is a view showing an arrangement of a wiring board according to the fourth embodiment.

A semiconductor device according to this embodiment will be described with reference to FIGS. 47 and 48. FIG. 47 shows the widthwise-direction section of the semiconductor device. FIG. 48 shows the semiconductor device viewed from a direction R (right side) in FIG. 47. This semiconductor device is manufactured in the following way.

To manufacture the semiconductor device shown in FIGS. 47 and 48, a bonding apparatus shown in FIGS. 3 and 4 is prepared. In this bonding apparatus, a bonding tool 22 movable in the vertical direction is arranged above a stage 21 having a built-in heater (not shown). A semiconductor chip 13 is placed on the stage 21 with bump electrodes 14 being directed upward. An insulating surface protective film (not shown) of a polyimide resin or epoxy resin is formed on the lower surface by a known method except a region to which an electronic component such as an active device or passive device is to be electrically connected. A clamp 23 clamps a wiring board 33 at the periphery of the region where the semiconductor chip 13 is to be mounted. The bonding tool 22 is moved downward.

The wiring board 33 has the lower surface opposing the semiconductor chip 13 all over the semiconductor chip mounting region. The wiring board 33 is set with its lower surface being directed to the upper surface of the semiconductor chip 13, i.e., with the surface having wiring 12 being directed toward the semiconductor chip 13.

Next, the bump electrodes 14 of the semiconductor chip 13 and connection terminals 12a of the wiring board 33 are aligned.

As shown in FIG. 4, for example, the stage 21 is moved upward to bring the bump electrodes 14 into contact with the connection terminals 12a. The bonding tool 22 is moved downward again. In this state, the stage 21 is heated to 350° C. to 450° C., and preferably, about 400° C. to heat the semiconductor chip 13. In addition, the bonding tool 22 is heated to 250° C. to 350° C., and preferably, about 300° C. at which Cu interdiffusion to the bump electrodes 14 occurs, and brought into direct contact with the upper surface of the wiring board 33 to press it. The bump electrodes 14 and the connection terminals 12a formed on the wiring board 33 are heated and pressed for about 1 to 3 sec. The bonding load is about 10 to 17 mg/μm².

The Au bump electrodes 14 are formed on the semiconductor chip 13 in advance. On the other hand, an Sn layer is formed on a wiring pattern 5 in advance. The Sn layer is formed by using an organic-acid-based electroless plating solution. The thickness of the Sn layer is about 0.5 to 1.0 μm.

For the semiconductor device thus manufactured according to this embodiment, AuSn bonding is executed by using the wiring board 33 as described in the third embodiment by using the bonding apparatus (also called a "TAB bonder") shown in FIGS. 3 and 4. Since the rigidity of the wiring patterns 5 is high in the vicinity of connection to the bump electrodes 14, the wiring patterns 5 are not deformed in bonding.

Hence, a semiconductor device can be formed for which AuSn eutectic bonding is executed at a temperature of 300° C. or more without bending the wiring patterns 5 or peeling them from a photosensitive resin layer 2 and forming any void Vd. In addition, the wiring pattern 5 has a multilayered structure including a lower Cu layer 31 and upper Cu layer 32. Materials having a high mechanical strength are used. Hence, the wiring pattern 5 can be thin, and a semiconductor device having a high flexibility can be formed.

In the above example, the semiconductor device is formed by using the TAB bonder. Instead of the TAB bonder, a flip chip bonder may be used to apply the bonding temperature mainly from the lower surface of the chip.

Figure 50:
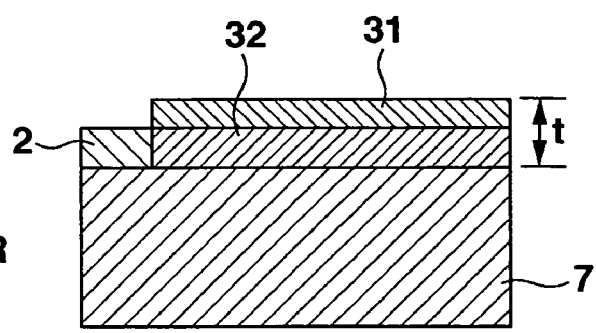
FIG. 50 is a view showing the wiring board in FIG. 49 viewed from the direction R (right side)
Figure 51:
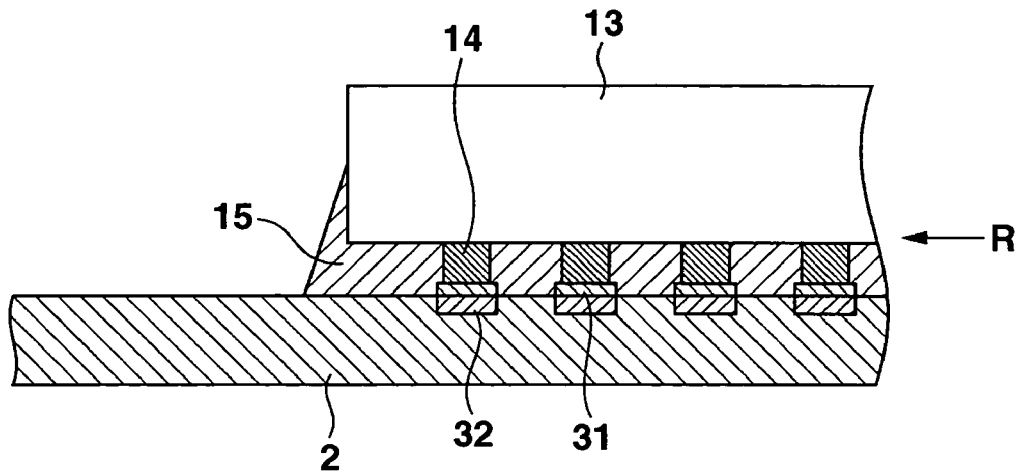
FIG. 51 is a view showing another arrangement of the semiconductor device according to the fourth embodiment.
Figure 52:
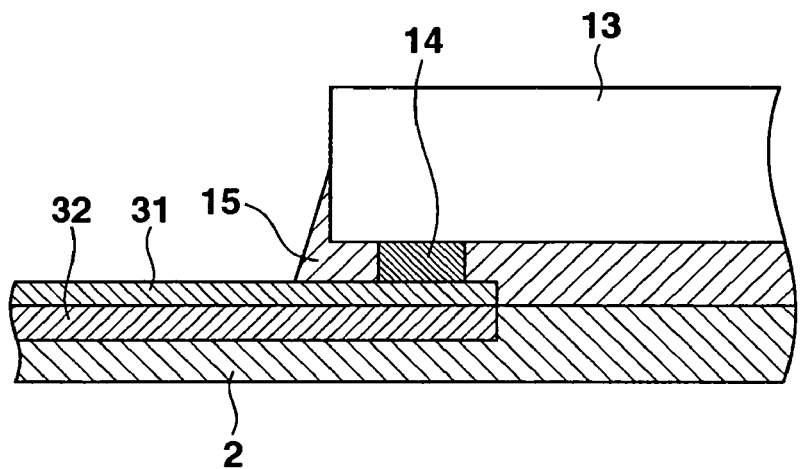
FIG. 52 is a view showing the semiconductor device in FIG. 51 viewed from the direction R (right side)
Figure 53:
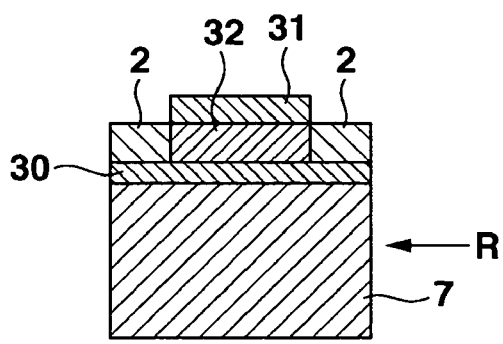
FIG. 53 is a view showing another arrangement of the wiring board according to the fourth embodiment.
Figure 54:
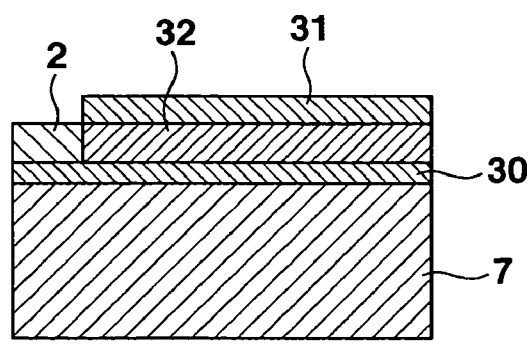
FIG. 54 is a view showing the wiring board in FIG. 53 viewed from the direction R (right side)
Figure 55:
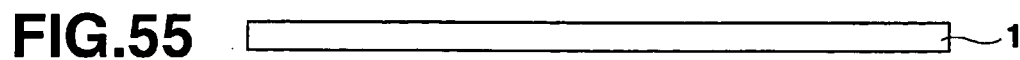
FIG. 55 is a front view showing the first step in manufacturing a wiring board for the semiconductor device shown in FIG. 51.
Figure 56:
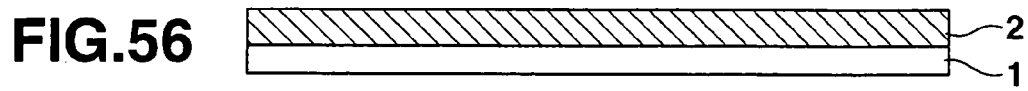
FIG. 56 is a front view showing the second step in manufacturing the wiring board for the semiconductor device shown in FIG. 51.
Figure 57:
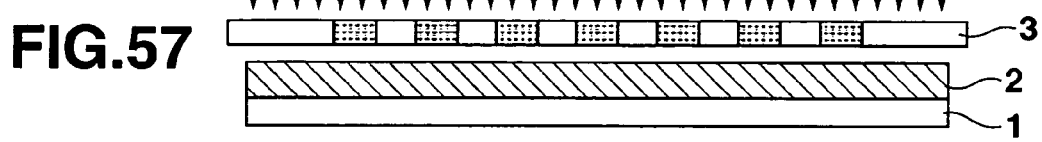
FIG. 57 is a front view showing the third step in manufacturing the wiring board for the semiconductor device shown in FIG. 51.
Figure 58:
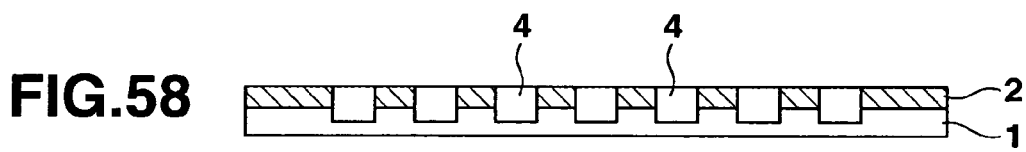
FIG. 58 is a front view showing the fourth step in manufacturing the wiring board for the semiconductor device shown in FIG. 51.
Figure 59:
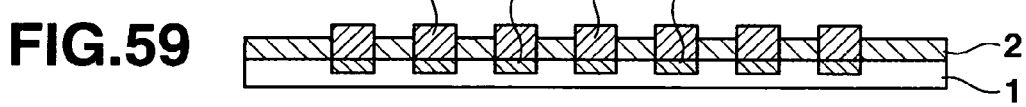
FIG. 59 is a front view showing the fifth step in manufacturing the wiring board for the semiconductor device shown in FIG. 51.
Figure 60:
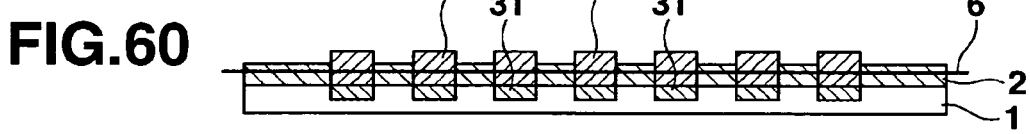
FIG. 60 is a front view showing the sixth step in manufacturing the wiring board for the semiconductor device shown in FIG. 51.
Figure 61:
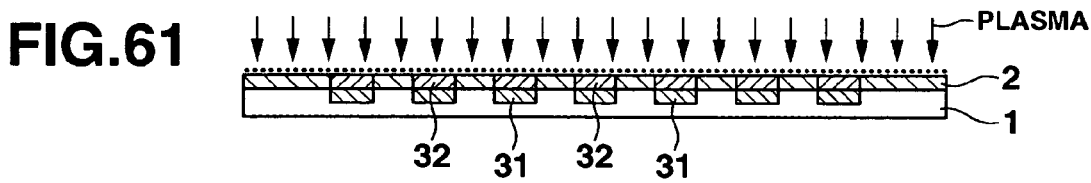
FIG. 61 is a front view showing the seventh step in manufacturing the wiring board for the semiconductor device shown in FIG. 51.
Figure 62:
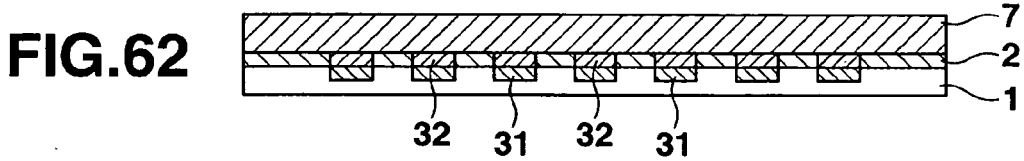
FIG. 62 is a front view showing the eighth step in manufacturing the wiring board for the semiconductor device shown in FIG. 51.
Figure 63:
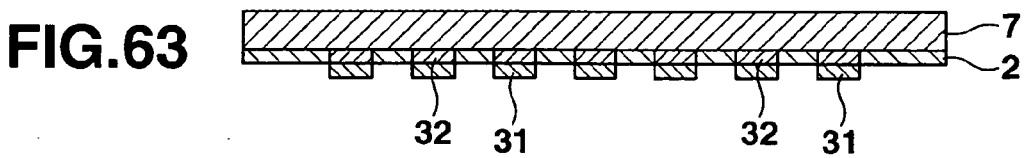
FIG. 63 is a front view showing the ninth step in manufacturing the wiring board for the semiconductor device shown in FIG. 51.

In the semiconductor device, the surface including the wiring patterns 5 and photosensitive resin layer 2 is flat, as shown in FIGS. 47 and 48. However, the semiconductor device of this embodiment is not limited to this arrangement. As shown in FIGS. 49 to 52, the wiring patterns each including the lower Cu layer 31 and upper Cu layer 32 may project from the surface of the photosensitive resin layer 2. In addition, a low-absorptivity layer 30 may be inserted between the wiring patterns and the polyimide layer 7, as shown in FIGS. 53 and 54. FIGS. 50, 52, and 54 show the widthwise-direction sections in FIGS. 49, 51, and 53 viewed from the direction R (right side), respectively. FIGS. 55 to 63 are views showing steps in manufacturing the wiring board for the semiconductor device shown in FIGS. 51 and 52. An insulating surface protective film (not shown) of a polyimide resin or epoxy resin is formed on the upper surface of the photosensitive resin layer 2 by a known method except a region to which an electronic component such as an active device or passive device is to be electrically connected.

Fifth Embodiment

The fifth embodiment of the present invention will be described.

First, a method of manufacturing a wiring board according to this embodiment will be described with reference to FIGS. 64 to 74.

Figure 64:
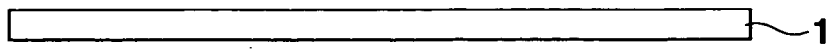
FIG. 64 is a front view showing the first step in manufacturing a wiring board according to the fifth embodiment.

As shown in FIG. 64, an Ni film 1 having a thickness of 50 to 125 μm is prepared as a supporting member.

Figure 65:
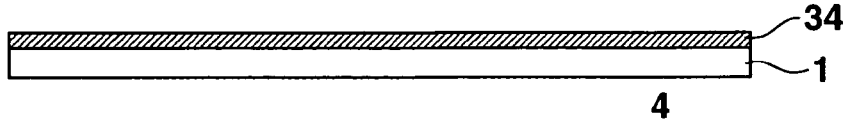
FIG. 65 is a front view showing the second step in manufacturing the wiring board according to the fifth embodiment.

As shown in FIG. 65, a resist layer 34 having photosensitivity is formed on the surface of the Ni film 1. The thickness of the photosensitive resist layer 34 is about 10 μm or less. To form the resist layer 34, a known method such as roll coating, spin coating, spraying, or inkjet can be used. After the photosensitive resist is applied, the resultant structure is pre-baked in an inert atmosphere at a temperature of about 80° C. to 120° C. to solidify the resist and form a film.

Figure 66:
FIG. 66 is a front view showing the third step in manufacturing the wiring board according to the fifth embodiment.

As shown in FIG. 66, a predetermined glass mask (not shown) appropriate for the purpose is prepared to form a mounting wiring pattern layer. The structure is irradiated with UV rays having a predetermined wavelength to expose a wiring pattern formation portion. The structure is dipped in or sprayed with a predetermined developer dedicated for the photosensitive resist to develop the pattern. Cleaning and drying are executed. The resist is patterned to form opening portions 4.

Figure 67:
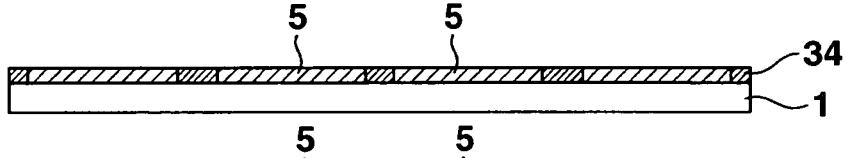
FIG. 67 is a front view showing the fourth step in manufacturing the wiring board according to the fifth embodiment.

As shown in FIG. 67, electroplating is executed by using the Ni film 1 as the cathode. The plating is performed by using a known copper sulfate plating solution at a solution temperature of about 20° C. to 30° C. and a current density of about 1 to 5 A/dm$^2$ so that copper is deposited in the opening portions 4 of the resist layer 34. With this process, wiring patterns 5 are formed. A barrier layer of Ni or Cr may also be formed.

Figure 68:
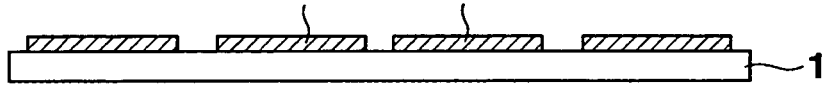
FIG. 68 is a front view showing the fifth step in manufacturing the wiring board according to the fifth embodiment.

As shown in FIG. 68, the resist layer 34 is removed, and only the wiring patterns 5 are left.

Figure 69:
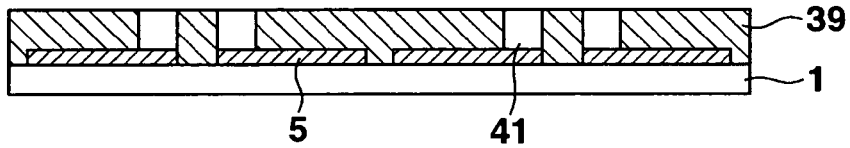
FIG. 69 is a front view showing the sixth step in manufacturing the wiring board according to the fifth embodiment.

As shown in FIG. 69, an insulating layer 39 based on a resin such as polyimide is formed. The thickness of the insulating layer 39 is about 5 to 30 μm. To form the insulating layer 39, a known method such as roll coating, spin coating, or casting can be used. After the insulating layer 39 is applied, the resultant structure is pre-baked in an inert atmosphere at a temperature of about 80° C. to 120° C. to solidify the insulating layer and form a film. A predetermined glass mask (not shown) appropriate for the purpose is prepared to form the thick portion of wiring patterns 35 having a high mechanical strength. The structure is irradiated with UV rays having a predetermined wavelength to expose the thick wiring pattern formation portion in the insulating layer 39. The structure is dipped in or sprayed with a predetermined developer dedicated for the resin of the insulating layer to develop the pattern. Cleaning and drying are executed, thereby completing patterning.

Figure 70:
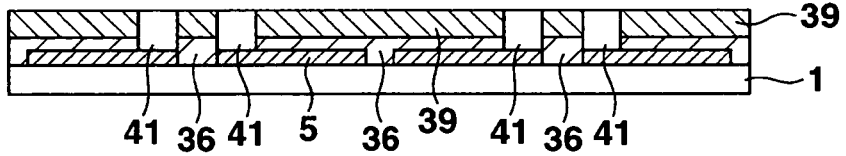
FIG. 70 is a front view showing the seventh step in manufacturing the wiring board according to the fifth embodiment.

In this example, after the resist layer 34 is removed in FIG. 68, a resin such as polyimide is applied as the insulating layer 39. However, the present invention is not limited to this. For example, as shown in FIG. 70, after the resist layer 34 is removed, an interlayer dielectric film 36 may be formed. The insulating layer 39 may be applied to the surface of the interlayer dielectric film 36. The interlayer dielectric film 36 is very thin and has a thickness of 3 μm or less. A material such as liquid crystal polymer having a lower absorptivity than polyimide may be applied and cured to form a barrier layer. With this structure, oxidation of the lower surfaces of the wiring patterns 5 and deterioration in peeling strength due to water invasion from the surface opposing to the wiring patterns, i.e., the lower surface of the substrate can be prevented.

Figure 71:
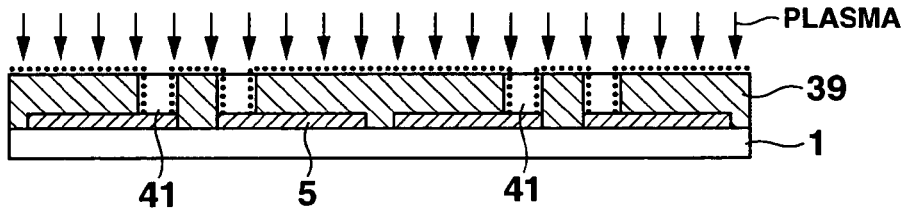
FIG. 71 is a front view showing the eighth step in manufacturing the wiring board according to the fifth embodiment.

As shown in FIG. 71, surface activation is performed to increase the adhesion strength to the wiring patterns 35 and a thermoplastic adhesive 37. If a process of physically forming a small three-dimensional pattern is executed, a portion serving as an antenna is formed again, as described above. For this reason, any method of physically forming anchors cannot be employed. Instead, the substrate after polishing shown in FIG. 71 is placed in a vacuum apparatus (e.g., film sputter). A plasma treatment is executed by using a reaction gas such as nitrogen, oxygen, or argon, and more preferably, in a nitrogen gas atmosphere. The C—N bonds which have the lowest bond energy in the polyimide molecular ring are dissociated and substituted by nitrogen or OH to form a functional group such as —COOH. Hence, the activation energy on the surface of the insulating layer 39 increases. In addition, a polyimide layer is formed continuously after the plasma treatment in the same apparatus. To form the polyimide layer, vacuum laminating or cold low-pressure laminating can be used.

Figure 72:
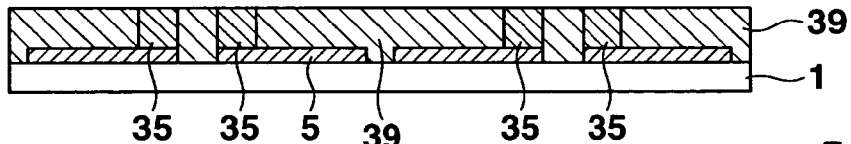
FIG. 72 is a front view showing the ninth step in manufacturing the wiring board according to the fifth embodiment.

As shown in FIG. 72, the Ni supporting member 1 is set at the cathode potential. The structure is dipped in a known copper sulfate plating solution, and electroplating is performed. The plating temperature is 20° C. to 30° C. The current density is about 1 to 5 A/dm$^2$. The copper sulfate plating is executed until copper is deposited in opening portions 41 of the insulating layer 39 and fills the opening portions 41. The copper sulfate plating is executed until overplating occurs about 5 to 10 μm from the surface of the opening portion 41, and the top is exposed. With this process, the wiring patterns 35 are formed.

Next, the polyimide layer 7 is cured. This process is executed in an inert atmosphere at a temperature of 300° C. for a curing time of 1 to 2 hrs. The polymerization reaction is made to progress until the polyimide is further dehydrated and polymerized, and the imidization ratio reaches 90% or more. With this process, the polyimide layer 7 having a high thermal resistance is formed. After the polyimide layer 7 is formed, the surface is polished up to a polishing surface by a known polishing method, thereby planarizing the polyimide layer 7 and the thick wiring patterns 35. When the thick wiring patterns 35 are polished to uniform their thicknesses, the high-frequency transmission characteristic can be improved. Immediately after plating, a variation in plating thickness is present, and a small three-dimensional pattern of about 1 to 3 μm is formed on the surface. If polishing is not executed, the three-dimensional pattern acts as an antenna and leaks a high-frequency signal in transmitting a signal of several GHz. Due to this leakage, a transmission error such as EMI or EMC by electromagnetic emission occurs.

Figure 73:
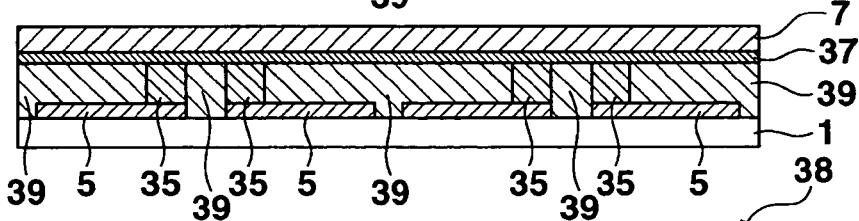
FIG. 73 is a front view showing the 10th step in manufacturing the wiring board according to the fifth embodiment.

As shown in FIG. 73, surface activation (not shown) is performed to increase the adhesion strength to the thermoplastic adhesive 37. This process can be executed by the same method as shown in FIG. 71. After that, the polyimide layer 7 which has a thickness of 10 μm or less and, on one surface, the polyimide-based thermoplastic adhesive 37 having a thickness of about 3 μm is prepared. The polyimide layer 7 is bonded by using a known method such as vacuum laminating. The surface activation and polyimide layer laminating may be executed continuously in the same apparatus.

Figure 74:
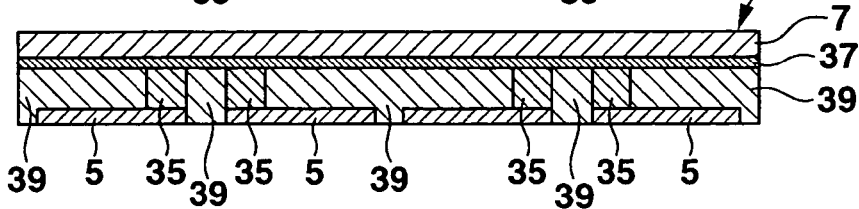
FIG. 74 is a front view showing the 11th step in manufacturing the wiring board according to the fifth embodiment.

As shown in FIG. 74, only Ni is etched without etching copper. More specifically, only Ni is etched by using an etchant having a high selectivity (e.g., alkali-based nickel etchant such as Enstrip NP available from Meltex, Metex SCB available from MacDermid, Top Rip AZ available from Okuno Chemical Industries, or Oxy-Strip OS available from Ebara-Udylite) to wholly remove the Ni film 1. A surface treatment (not shown) using Au, Sn, or In is executed for the exposed wiring patterns 5. After that, an insulating surface protective film (not shown) of a polyimide resin or epoxy resin is formed on the lower surface of the insulating layer 39 by a known method except a region to which an electronic component such as an active device or passive device is to be electrically connected. A wiring board 38 is thus formed.

Figure 75:
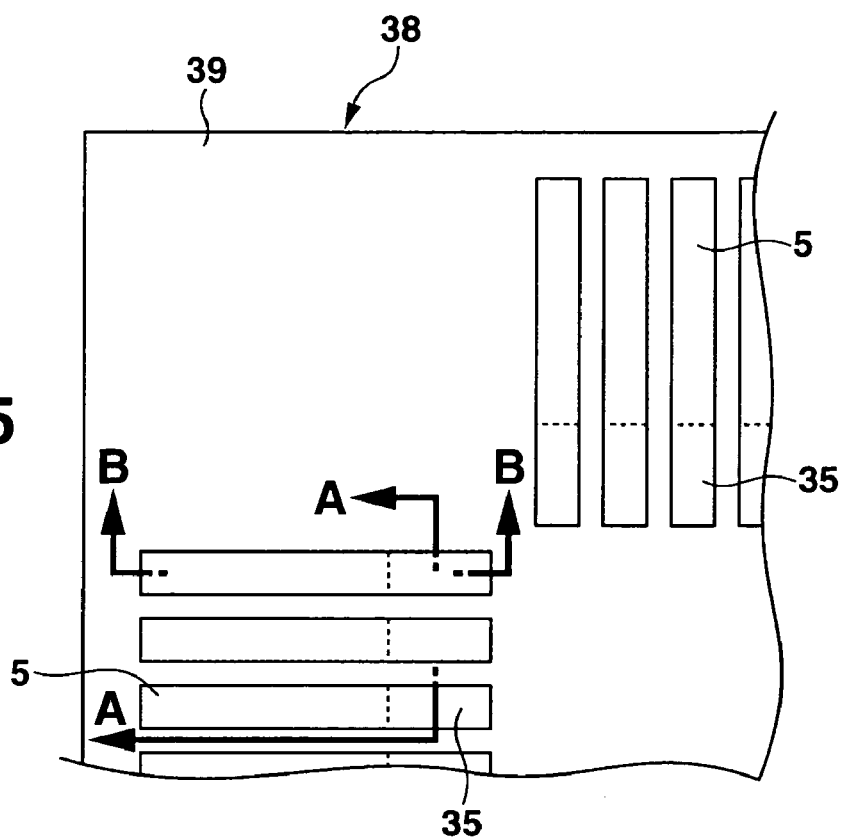
FIG. 75 is a view showing an arrangement of the wiring board according to the fifth embodiment.
Figure 76:
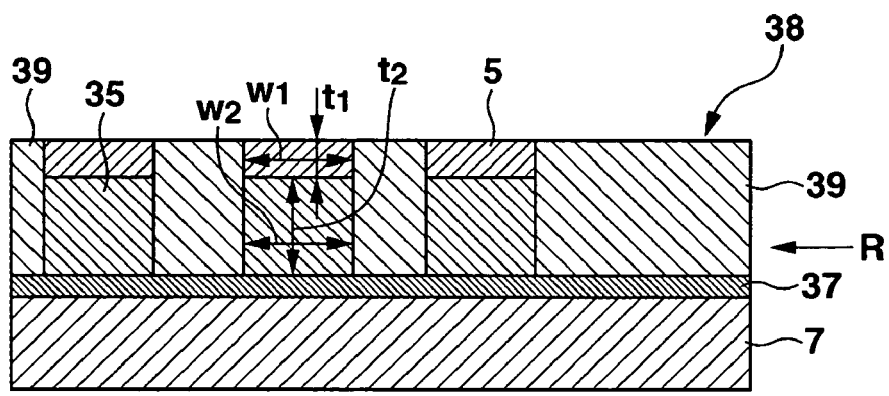
FIG. 76 is a sectional view taken along a line A-A in FIG. 75.
Figure 77:
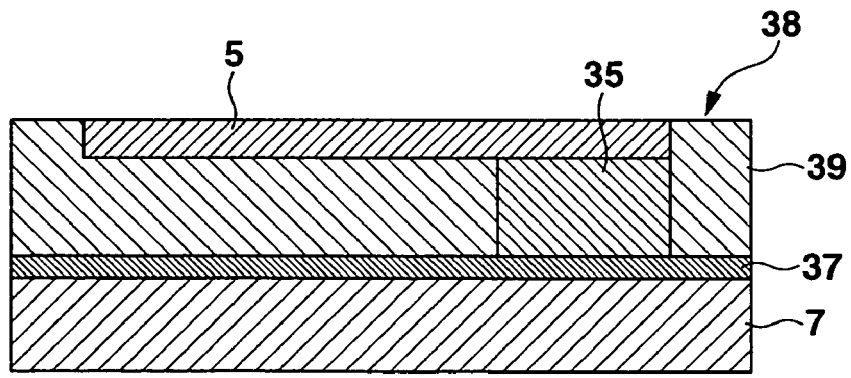
FIG. 77 is a sectional view taken along a line B-B in FIG. 75.

FIG. 75 is a plan view showing an example of the wiring board 38 formed in the above-described manner. FIG. 76 is a sectional view taken along a line A-A in FIG. 75. FIG. 77 is a sectional view taken along a line B-B in FIG. 75.

Each wiring pattern formed on the wiring board 38 includes the wiring pattern 5 whose width $W_1$ and thickness $t_1$ have a relationship $W_1 > t_1$ and the wiring pattern 35 whose width $W_2$ and thickness $t_2$ have a relationship $W_2 \leq t_2$, as shown in FIG. 76. The wiring patterns 35 are laid out near the semiconductor chip mounting region. The wiring patterns 35 are bonded to bump electrodes 14 formed on a semiconductor chip 13. That is, the semiconductor chip 13 is mounted on the wiring patterns 35.

As described above, in the wiring board according to this embodiment, the wiring patterns 5 and 35 are formed by using the same conductive material. In addition, $t_2 \geq W_2$ is satisfied in only the region of the wiring patterns 35 on which the bump electrodes 14 formed on the semiconductor chip 13 are mounted. AuSn bonding of the semiconductor chip 13 is executed by TC bonding at a temperature of 300° C. or more. Since the wiring patterns 35 bonded to the bump electrodes 14 have a relationship t>W, the wiring patterns 35 are not deformed even when polyimide is softened by the bonding temperature and load. Hence, the wiring patterns are not bent near the chip mounting region. Since the chip edge and wiring pattern do not come into contact, no electrical short circuit occurs.

The wiring patterns 35 project into the wiring board 38. Hence, they are not bent downward even upon receiving a bonding load and a bonding temperature of 300° C. or more. The wiring patterns 35 project into the wiring board 38. That is, anchors are formed in the wiring board 38. For this reason, stretching of copper in the lead direction of the wiring pattern (from the right to the left in FIG. 77) is restricted. That is, Cu used as the material of the wiring pattern cannot freely stretch. Since stretching and bending are suppressed, the wiring patterns made of the same material are not peeled from the wiring board 38. Hence, no void is formed between the wiring board 38 and the wiring pattern.

The wiring patterns have an anchor in the wiring board 38 and a large contact area to the polyimide. Since the bonding strength to the wiring board 38 can be maintained high, the wiring patterns are hardly be peeled off.

In the above example, the wiring patterns 5 and 35 formed from copper under the same plating conditions. Instead of using the same plating conditions, they may be changed to change the crystal size and density. More specifically, the wiring pattern 35 may have a small copper crystal size and high hardness. On the other hand, copper used for the wiring pattern 5 may have a large crystal size and low hardness.

The wiring patterns 5 and 35 may be formed by using copper with different crystal orientations. The wiring pattern 35 is made of a single copper layer. However, it may have a multilayered structure made of different kinds of metals. The wiring patterns 5 may be formed by using copper with excellent solder mounting properties while the wiring patterns 35 may be formed by using Ni or Cr, or an Fe- or Ti-based copper alloy having a higher mechanical strength than copper. In this case, the rigidity increases, and deformation, stretching, and bending of the wiring patterns can further be reduced.

When a material other than copper and, for example, a high-hardness material such as Ni or Cr is used for the wiring patterns 35, the wiring patterns 35 serving as anchor portions can be made thinner. Accordingly, the production efficiency can be increased.

Sixth Embodiment

The sixth embodiment of the present invention will be described.

Figure 78:
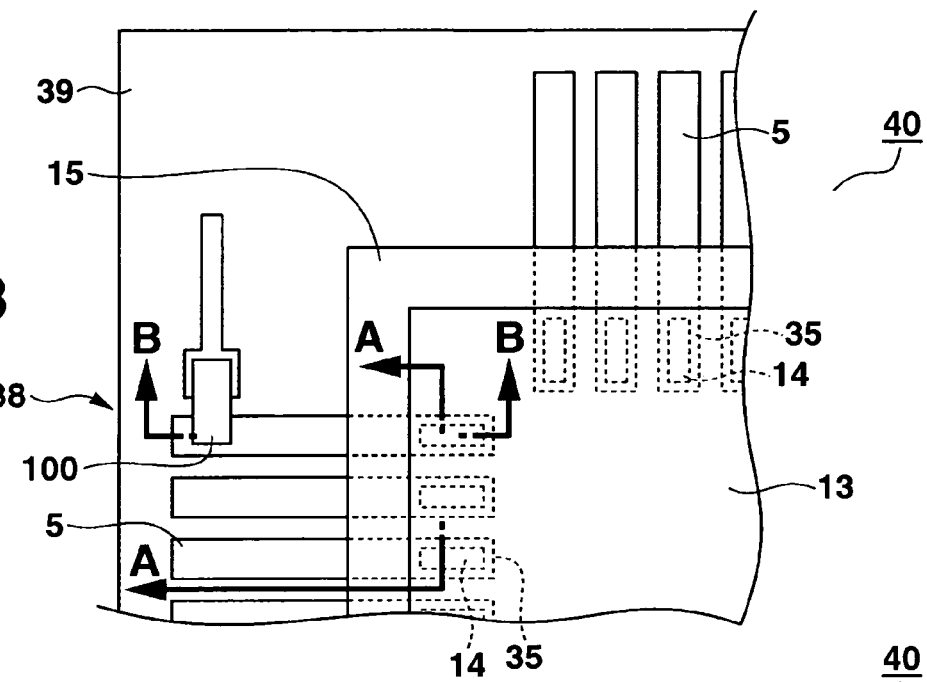
FIG. 78 is a view showing an arrangement of a semiconductor device according to the sixth embodiment.
Figure 79:
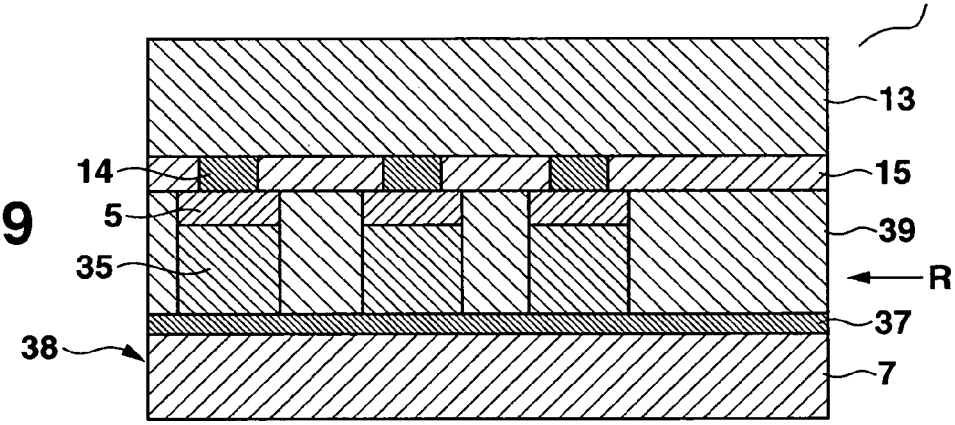
FIG. 79 is a sectional view taken along a line A-A in FIG. 78.
Figure 80:
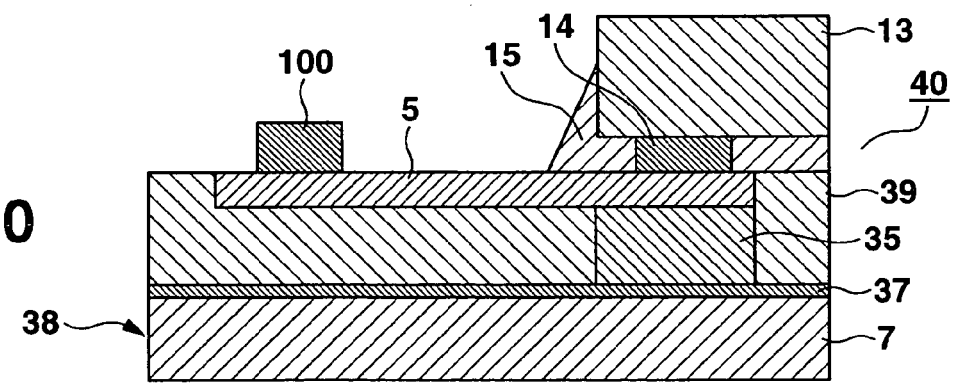
FIG. 80 is a sectional view taken along a line B-B in FIG. 78.

A semiconductor device according to this embodiment will be described with reference to FIGS. 78 to 80. FIG. 78 is a plan view showing an example of a semiconductor device 40 according to this embodiment. FIG. 79 is a sectional view taken along a line A-A in FIG. 78. FIG. 80 is a sectional view taken along a line B-B in FIG. 78. The semiconductor device 40 is manufactured in the following way.

To manufacture the semiconductor device 40 shown in FIGS. 78 to 80, a bonding apparatus shown in FIGS. 3 and 4 is prepared. In this bonding apparatus, a bonding tool 22 movable in the vertical direction is arranged above a stage 21 having a built-in heater (not shown). A semiconductor chip 13 is placed on the stage 21 with bump electrodes 14 being directed upward. A clamp 23 clamps a wiring board 38 described in the fifth embodiment at the periphery of the region where the semiconductor chip 13 is to be mounted. The bonding tool 22 is moved downward.

The wiring board 38 has the lower surface opposing the semiconductor chip 13 all over the semiconductor chip mounting region. The wiring board 38 is set with its lower surface being directed to the upper surface of the semiconductor chip 13, i.e., with the surface having wiring 12 being directed toward the semiconductor chip 13.

Next, the bump electrodes 14 of the semiconductor chip 13 and connection terminals 12a of the wiring board 38 are aligned.

As shown in FIG. 4, for example, the stage 21 is moved upward to bring the bump electrodes 14 into contact with the connection terminals 12a. The bonding tool 22 is moved downward again. In this state, the stage 21 is heated to 350° C. to 450° C., and preferably, about 400° C. to heat the semiconductor chip 13. In addition, the bonding tool 22 is heated to 250° C. to 350° C., and preferably, about 300° C. at which Cu interdiffusion to the bump electrodes 14 occurs, and brought into direct contact with the upper surface of the wiring board 38 to press it. The bump electrodes 14 and the wiring 12 corresponding to the connection terminals formed on the wiring board 38 are heated and pressed for about 1 to 3 sec. The bonding load is about 10 to 17 mg/μm².

The bump electrodes 14 are formed on the semiconductor chip 13 in advance. On the other hand, an Sn layer is formed on the wiring 12 in advance. The Sn layer is formed by using an organic-acid-based electroless plating solution. The thickness of the Sn layer is about 0.5 to 1.0 μm. After that, the space formed between the semiconductor chip 13 and a photosensitive resin layer 2 is filled with an insulating resin 15 (also called a sealing resin) by a known side potting method. The insulating resin 15 is heated and set. Then, a plurality of kinds of passive components 100 such as a capacitor, resistor, and coil are surface-mounted (also called SMT mounting) in accordance with the requested specifications.

In the semiconductor device 40 thus manufactured according to this embodiment, the wiring board 38 is AuSn-bonded by the bonding tool 22 by using the bonding apparatus (also called a "TAB bonder") shown in FIGS. 3 and 4. Even in this case, since the connection terminals of the wiring patterns are anchored in the wiring board 38 by using the same material as the conductive material of the wiring 12 near the connection to the Au bumps, the rigidity of the wiring 12 can be made high, and the wiring 12 are rarely bent and stretched. For this reason, the wiring patterns are not deformed in bonding.

Hence, the semiconductor device 40 can be formed in which AuSn eutectic bonding is executed at a temperature of 300° C. or more at which Cu interdiffusion to the bump electrodes 14 occurs without bending the wiring 12 or peeling them from the wiring board 38 and forming any void Vd. In addition, at the connection terminal of each wiring pattern, only a wiring pattern 35 is thick and projects into the wiring board 38. For a wiring pattern 5, $W_1 > t_1$ holds. For these reasons, the semiconductor device 40 having a high flexibility can be formed.

Furthermore, since the wiring patterns 5 are not bent, and almost the same planarity as before bonding can be maintained, the insulating resin 15 can smoothly be injected into the space formed between the photosensitive resin layer 2 and the semiconductor chip 13 which is formed into a height of 10 to 30 μm. For this reason, no voids (bubbles) are formed in the insulating resin 15. Since no void expansion/contraction occurs in a reliability test such as a heat cycle test or thermal shock test because of the absence of voids, a semiconductor device with a high reliability can be formed. In the above example, the semiconductor device 40 is formed by using the TAB bonder. A flip chip bonder may be used to apply the bonding temperature mainly from the lower surface of the chip. In the semiconductor device 40, the surface including the wiring patterns 5 and photosensitive resin layer 2 is flat. However, the surface may project, as shown in FIGS. 49 to 54. As shown in FIGS. 19, 20, 45, and 46, a low-absorptivity layer 30 may be inserted between the wiring patterns and the polyimide layer 7. With this structure, the semiconductor device 40 having a higher reliability can be formed.

A protective film may be formed on the upper surface of the wiring board 38 except a region necessary for electrically connecting the passive component 100 and the like. With this structure, the reliability can further be increased.

Seventh Embodiment

The seventh embodiment of the present invention will be described.

First, a method of manufacturing a wiring board according to this embodiment will be described with reference to FIGS. 81 to 91.

Figure 81:
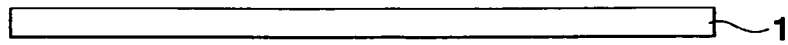
FIG. 81 is a front view showing the first step in manufacturing a wiring board according to the seventh embodiment.

As shown in FIG. 81, an Ni film 1 having a thickness of 50 to 125 μm is prepared as a supporting member.

Figure 82:
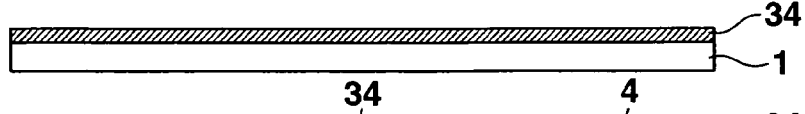
FIG. 82 is a front view showing the second step in manufacturing the wiring board according to the seventh embodiment.

As shown in FIG. 82, a resist layer 34 having photosensitivity is formed on the surface of the Ni film 1. The thickness of the photosensitive resist layer 34 is about 10 μm or less. To form the resist layer 34, a known method such as roll coating, spin coating, spraying, or inkjet can be used. After the resist layer 34 is applied, the resultant structure is pre-baked in an inert atmosphere at a temperature of about 80° C. to 120° C. to solidify the resist and form a film.

Figure 83:
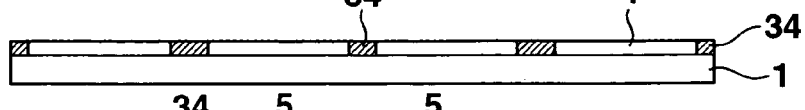
FIG. 83 is a front view showing the third step in manufacturing the wiring board according to the seventh embodiment.

As shown in FIG. 83, a predetermined glass mask (not shown) appropriate for the purpose is prepared to form a mounting wiring pattern layer. The structure is irradiated with UV rays having a predetermined wavelength to expose a wiring pattern formation portion. The structure is dipped in or sprayed with a predetermined developer dedicated for the photosensitive resist to develop the pattern. Cleaning and drying are executed. The resist is patterned by forming opening portions 4.

Figure 84:
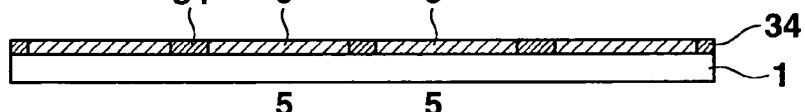
FIG. 84 is a front view showing the fourth step in manufacturing the wiring board according to the seventh embodiment.

As shown in FIG. 84, electroplating is executed by using the Ni film 1 as the cathode. The plating is performed by using a known copper sulfate plating solution at a solution temperature of about 20° C. to 30° C. and a current density of about 3 A/dm$^2$ so that copper is deposited in the opening portions 4 of the resist layer 34. The plating resist pattern may directly be drawn by an imprint technique using a known inkjet technique. In the above example, the resist pattern is formed by exposing it by UV rays through the glass mask and developing the pattern. Instead, the resist pattern may be formed by directly drawing a resist sensitive to a wavelength of 300 nm or less by irradiating it with a laser beam.

Figure 85:
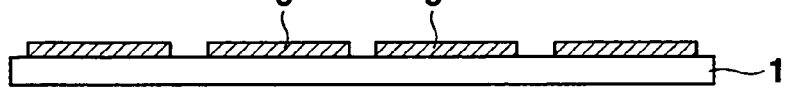
FIG. 85 is a front view showing the fifth step in manufacturing the wiring board according to the seventh embodiment.

As shown in FIG. 85, the resist layer 34 is removed, and wiring patterns 5 to be mounted are formed. Instead of forming the wiring patterns 5 by plating, they may directly be formed by imprinting copper nanopaste by an inkjet technique.

Figure 86:
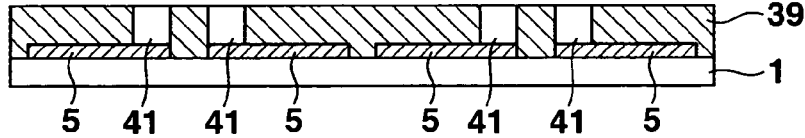
FIG. 86 is a front view showing the sixth step in manufacturing the wiring board according to the seventh embodiment.

As shown in FIG. 86, an insulating layer 39 based on a resin such as polyimide is formed. The thickness of the insulating layer 39 is about 5 to 30 μm. To form the insulating layer 39, a known method such as roll coating, spin coating, or casting can be used. After the insulating layer 39 is applied, the resultant structure is pre-baked in an inert atmosphere at a temperature of about 80° C. to 120° C. to solidify the insulating layer and form a film. A predetermined glass mask (not shown) appropriate for the purpose is prepared to form the thick portion of wiring patterns having a high mechanical strength. The structure is irradiated with UV rays having a predetermined wavelength to expose the thick wiring pattern formation portion in the insulating layer 39. The structure is dipped in or sprayed with a predetermined developer dedicated for the insulating layer 39 to develop the pattern. Cleaning and drying are executed, and opening portions 41 to pattern the thick wiring patterns are thus formed.

Figure 87:
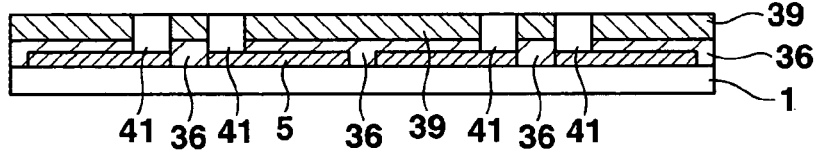
FIG. 87 is a front view showing the seventh step in manufacturing the wiring board according to the seventh embodiment.

In this example, after the resist layer 34 is removed in FIG. 85, a resin such as polyimide is applied as the insulating layer 39. However, the present invention is not limited to this. For example, as shown in FIG. 87, after the resist layer 34 is removed, an interlayer dielectric film 36 is formed. The interlayer dielectric film 36 is very thin and has a thickness of 3 μm or less. A material such as liquid crystal polymer having a lower absorptivity than polyimide may be applied and cured to form a barrier layer. With this structure, oxidation of the lower surfaces of the wiring patterns 5 and deterioration in peeling strength due to water invasion from the surface opposing to the wiring patterns 5, i.e., the lower surface of the substrate can be prevented.

Figure 88:
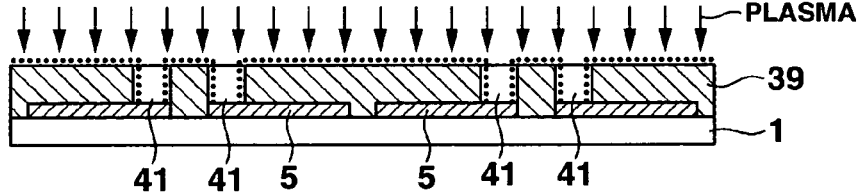
FIG. 88 is a front view showing the eighth step in manufacturing the wiring board according to the seventh embodiment.

As shown in FIG. 88, surface activation is performed to increase the adhesion strength to the wiring patterns 5. If a process of physically forming a small three-dimensional pattern is executed, a portion serving as an antenna is formed again, as described above. For this reason, any method of physically forming anchors cannot be employed. Instead, the substrate after polishing shown in FIG. 88 is placed in a vacuum apparatus (e.g., film sputter). A plasma treatment is executed by using a reaction gas such as nitrogen, oxygen, or argon, and more preferably, in a nitrogen gas atmosphere. The C—N bonds which have the lowest bond energy in the polyimide molecular ring are dissociated and substituted by nitrogen or OH to form a functional group such as —COOH. Hence, the activation energy on the surface of the insulating layer 39 increases.

Figure 89:
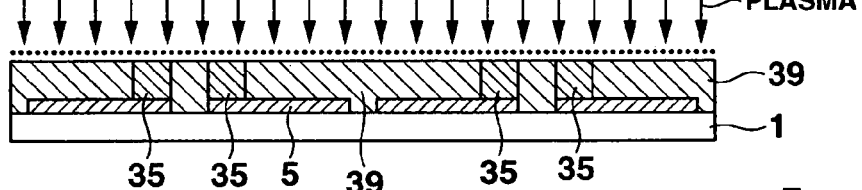
FIG. 89 is a front view showing the ninth step in manufacturing the wiring board according to the seventh embodiment.

As shown in FIG. 89, the Ni supporting member 1 is set at the cathode potential. The structure is dipped in a known copper sulfate plating solution, and electroplating is performed. The plating temperature is 20° C. to 30° C. The current density is about 5 A/dm$^2$. The copper sulfate plating is executed until copper is deposited in the opening portions 41 of the insulating layer 39 and fills the opening portions 41. The copper sulfate plating is executed until overplating occurs about 5 to 10 μm from the surface of the opening portion 41, and the top is exposed. With this process, wiring patterns 35 are formed.

The wiring patterns 35 are formed such a length that at least one end of the wiring pattern is located at a position spaced apart by 500 μm from the end of the bump electrode 14 on the semiconductor chip 13 to be mounted later. That is, the wiring patterns 35 are formed in a region to be most easily deformed.

Next, the insulating layer 39 is cured. This process is executed in an inert atmosphere at a temperature of 300° C. for a curing time of 1 to 2 hrs. The polymerization reaction is made to progress until the polyimide is further dehydrated and polymerized, and the imidization ratio reaches 90% or more. With this process, the insulating layer 39 having a high thermal resistance is formed. After the insulating layer 39 is formed, the surface is polished up to a polishing surface by a known polishing method, thereby planarizing the insulating layer 39 and the thick wiring patterns 35.

When the thick wiring patterns 35 are polished to uniform their thicknesses, the high-frequency transmission characteristic can be improved. Immediately after plating, a variation in plating thickness is present, and a small three-dimensional pattern of about 1 to 3 μm is formed on the surface. If polishing is not executed, the three-dimensional pattern acts as an antenna and leaks a high-frequency signal in transmitting a signal of several GHz. Due to this leakage, a transmission error such as EMI or EMC by electromagnetic emission occurs. In the above description, the wiring patterns 35 are formed by plating. Instead, they may directly be formed by imprinting copper nanopaste by using an inkjet technique.

Figure 90:
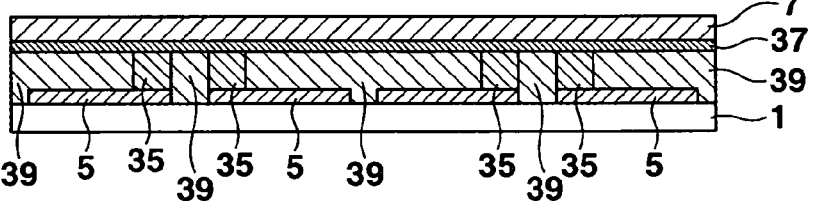
FIG. 90 is a front view showing the 10th step in manufacturing the wiring board according to the seventh embodiment.

As shown in FIG. 90, surface activation (not shown) is performed to increase the adhesion strength to a thermoplastic adhesive 37. This process can be executed by the same method as shown in FIG. 71. A polyimide layer 7 which has a thickness of 10 μm or less and, on one surface, the polyimide-based thermoplastic adhesive 37 having a thickness of about 3 μm is prepared. The polyimide film is bonded by using a known method such as vacuum laminating. The surface activation and polyimide layer laminating may be executed continuously in the same apparatus.

Figure 91:
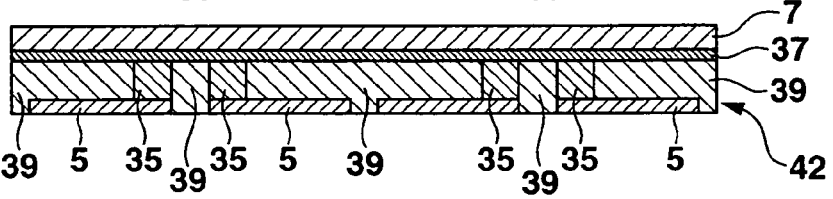
FIG. 91 is a front view showing the 11th step in manufacturing the wiring board according to the seventh embodiment.

As shown in FIG. 91, only Ni is etched without etching copper. More specifically, only Ni is etched by using an etchant having a high selectivity (e.g., alkali-based nickel etchant such as Enstrip NP available from Meltex, Metex SCB available from MacDermid, Top Rip AZ available from Okuno Chemical Industries, or Oxy-Strip OS available from Ebara-Udylite) to wholly remove the Ni film 1. A surface treatment (not shown) using Au, Sn, or In is executed for the exposed wiring patterns 5. After that, an insulating surface protective film (not shown) of a polyimide resin or epoxy resin is formed on the lower surface of the insulating layer 39 by a known method except a region to which an electronic component such as an active device or passive device is to be electrically connected. A wiring board 42 is thus formed.

Figure 92:
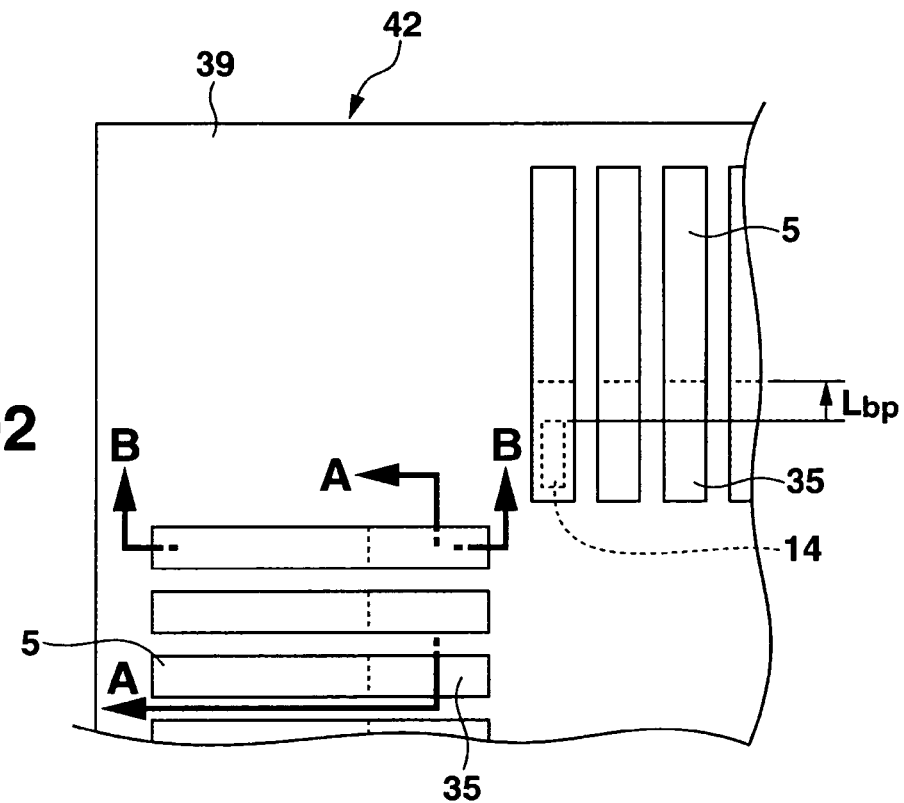
FIG. 92 is a view showing an arrangement of a wiring board 42 according to the seventh embodiment.
Figure 93:
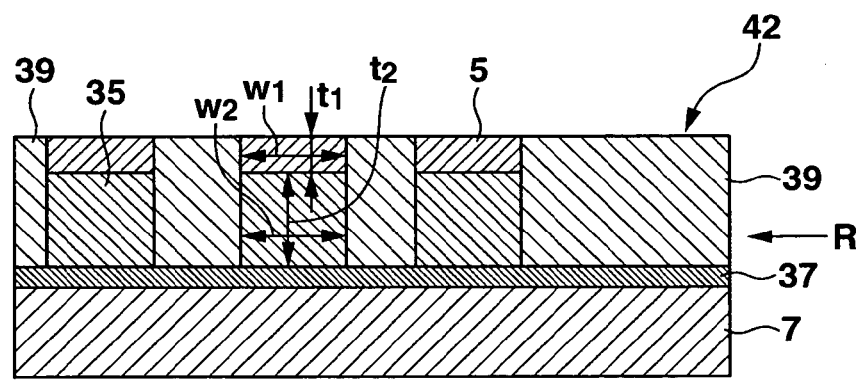
FIG. 93 is a sectional view taken along a line A-A in FIG. 92.
Figure 94:
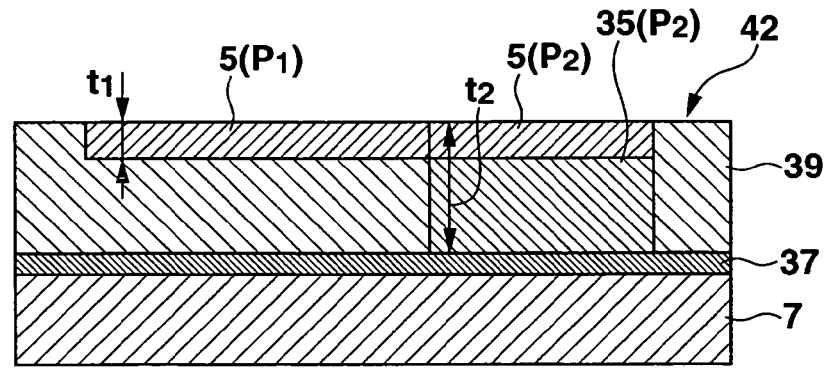
FIG. 94 is a sectional view taken along a line B-B in FIG. 92.

FIG. 92 is a plan view showing an example of the wiring board 42 formed in the above-described manner. FIG. 93 is a sectional view taken along a line A-A in FIG. 92. FIG. 94 is a sectional view taken along a line B-B in FIG. 92.

Each wiring pattern formed on the wiring board 42 includes a wiring pattern $P_1$ (the wiring pattern 5 which does not face the wiring pattern 35) whose width $W_1$ and thickness $t_1$ have a relationship $W_1 > t_1$ and a wiring pattern $P_2$ (a region including both the wiring pattern 35 and the wiring pattern 5 facing the wiring pattern 35) whose width $W_2$ and thickness $t_2$ have a relationship $W_2 \leq t_2$, as shown in FIGS. 93 and 94. The wiring pattern $P_1$ made of copper is formed such that $W_1/t_1 > 1$ is satisfied. On the other hand, the wiring pattern $P_2$ including the first layer (wiring pattern 5) made of copper and the second layer (wiring pattern 35) made of copper, Ni or Cr, or a copper alloy containing at least iron or titanium is formed such that $W_2/t_2 \leq 1$ is satisfied. As shown in FIG. 93, the width $W_1$ of the wiring pattern $P_1$ and the width $W_2$ of the wiring pattern $P_2$ equal (i.e., $W_1 = W_2$). As shown in FIG. 92, the formation region of the wiring pattern $P_2$ is formed such that when the semiconductor chip 13 is bonded to the wiring board 42, a length Lbp from the bump electrode 14 (its prospective position is shown in FIG. 92) becomes at least 25 to 150 μm outward.

In the wiring board according to this embodiment having the above-described arrangement, AuSn bonding of the semiconductor chip 13 is executed by TC bonding at a temperature of 300° C. or more at which Cu interdiffusion to the bump electrodes 14 occurs. Since the wiring patterns $P_2$ bonded to the bump electrodes 14 have a relationship $W_2 \leq t_2$, the wiring patterns $P_2$ are not deformed even when polyimide is softened by the bonding temperature and load. Hence, the wiring patterns are not bent near the chip mounting region. Since the chip edge and wiring pattern do not come into contact, no electrical short circuit occurs.

The wiring patterns $P_2$ project into the wiring board 42. When the semiconductor chip 13 is bonded to the wiring board 42, the length Lbp from the bump electrode 14 (its prospective position is shown in FIG. 92) becomes at least 25 to 150 μm outward. Hence, the wiring patterns are not bent downward even upon receiving a bonding load and a bonding temperature of 300° C. or more. The wiring patterns $P_2$ project into the wiring board 42. That is, anchors are formed in the wiring board 42. For this reason, stretching in the lead direction of the wiring pattern (from the right to the left in FIG. 94) is restricted. That is, Cu used as the material of the wiring pattern cannot freely stretch. Since stretching and bending are suppressed, the wiring patterns made of the same material are not peeled from the wiring board 42. Hence, no void Vd is formed between the wiring board 42 and the wiring pattern.

The wiring patterns have an anchor in the wiring board 42 and a large contact area to the polyimide. Since the bonding strength to the wiring board 42 can be maintained high, the wiring patterns are hardly be peeled off.

The wiring patterns $P_2$ have a mechanical characteristic different from that of the wiring patterns $P_1$. The wiring patterns $P_2$ project into the wiring board 42 and have a size larger than the semiconductor chip 13 by 500 μm. For these reasons, even when the bonding position is shifted due to a factor in bonding apparatus loading accuracy, the wiring patterns $P_2$ are always arranged in the wiring pattern bending region.

The wiring patterns 5 and 35 are formed from copper under the same plating conditions. Instead of using the same plating conditions, they may be changed to change the crystal size and density. More specifically, the wiring pattern 35 may have a small copper crystal size and high hardness. On the other hand, copper used for the wiring pattern 5 may have a large crystal size and low hardness.

The wiring patterns 5 and 35 may be formed by using copper with different crystal orientations. The wiring pattern 35 is made of a single copper layer. However, it may have a multilayered structure made of different kinds of metals.

The wiring patterns are made of only copper. The wiring patterns 5 may be formed by using copper with excellent solder mounting properties. The first and second layers of the wiring patterns 35 are made of copper. Instead, they may be formed by using Ni or Cr, or an Fe- or Ti-based copper alloy having a higher mechanical strength than copper. With this structure, the rigidity increases, and deformation, stretching, and bending of the wiring patterns can further be reduced.

When a material other than copper and, for example, a high-hardness material such as Ni or Cr is used for the wiring patterns 35, the wiring patterns 35 serving as anchor portions can be made thinner. Accordingly, the production efficiency can be increased.

Eighth Embodiment

The eighth embodiment of the present invention will be described.

Figure 95:
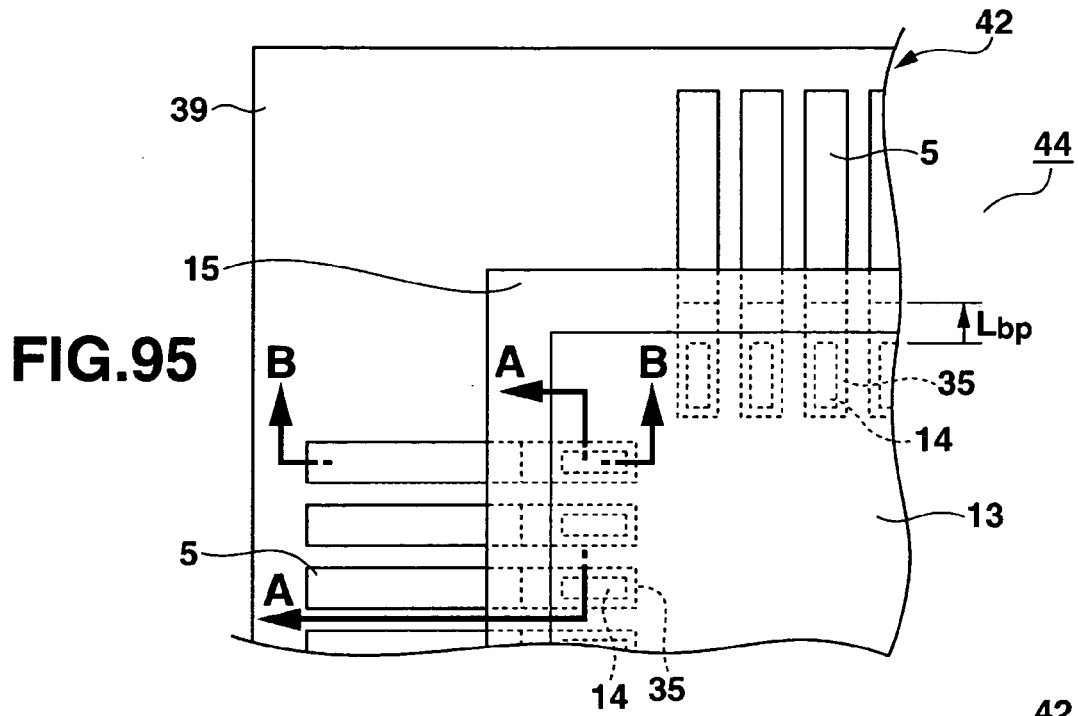
FIG. 95 is a view showing an arrangement of a semiconductor device according to the eighth embodiment.
Figure 96:
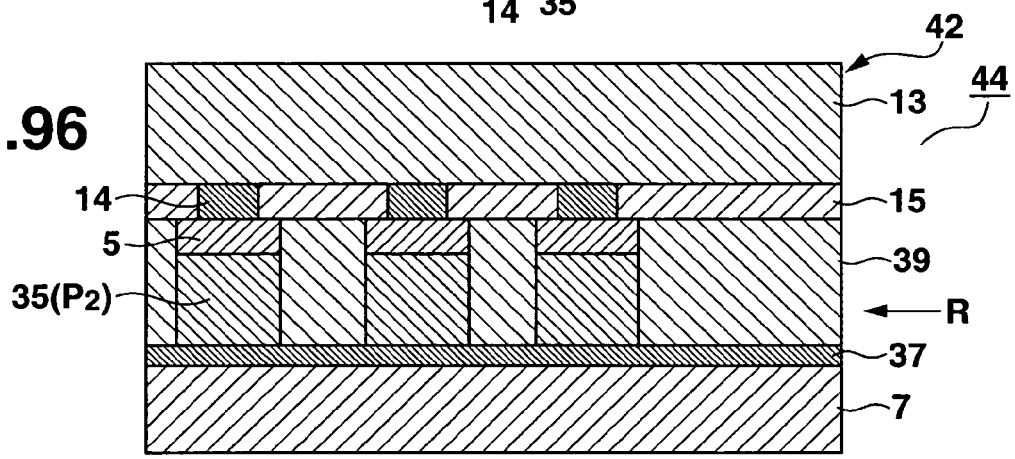
FIG. 96 is a sectional view taken along a line A-A in FIG. 95.
Figure 97:
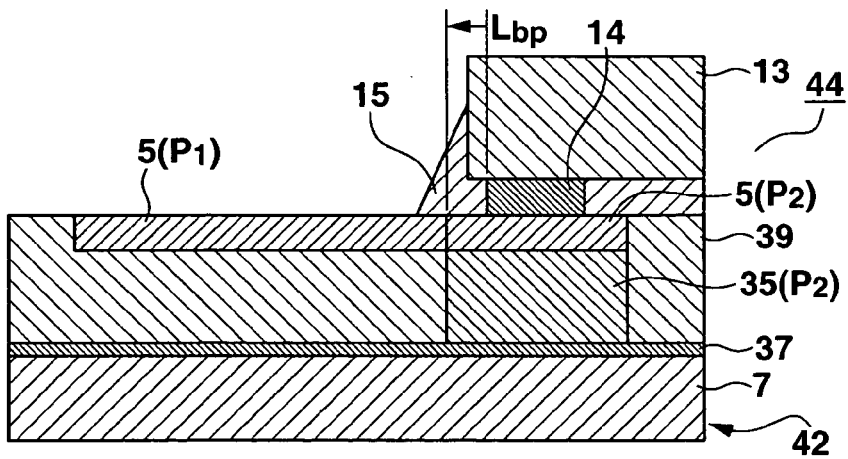
FIG. 97 is a sectional view taken along a line B-B in FIG. 95.

A semiconductor device according to this embodiment will be described with reference to FIGS. 95 to 97. FIG. 95 is a plan view showing an example of a semiconductor device 44 according to this embodiment. FIG. 96 is a sectional view taken along a line A-A in FIG. 95. FIG. 97 is a sectional view taken along a line B-B in FIG. 95. The semiconductor device 44 is manufactured in the following way.

To manufacture the semiconductor device 44 shown in FIGS. 95 to 97, a bonding apparatus shown in FIGS. 3 and 4 is prepared. In this bonding apparatus, a bonding tool 22 movable in the vertical direction is arranged above a stage 21 having a built-in heater (not shown). A semiconductor chip 13 is placed on the stage 21 with bump electrodes 14 being directed upward. A clamp 23 clamps a wiring board 42 described in the seventh embodiment at the periphery of the region where the semiconductor chip 13 is to be mounted. The bonding tool 22 is moved downward.

The wiring board 42 has the lower surface opposing the semiconductor chip 13 all over the semiconductor chip mounting region. The wiring board 42 is set with its lower surface being directed to the upper surface of the semiconductor chip 13, i.e., with the surface having wiring 12 being directed toward the semiconductor chip 13.

Next, the bump electrodes 14 of the semiconductor chip 13 and connection terminals 12a of the wiring board 42 are aligned.

As shown in FIG. 4, for example, the stage 21 is moved upward to bring the bump electrodes 14 into contact with the connection terminals 12a. The bonding tool 22 is moved downward again. In this state, the stage 21 is heated to 350° C. to 450° C., and preferably, about 400° C. to heat the semiconductor chip 13. In addition, the bonding tool 22 is heated to 250° C. to 350° C., and preferably, about 300° C. at which Cu interdiffusion to the bump electrodes 14 occurs, and brought into direct contact with the upper surface of the wiring board 42 to press it. The bump electrodes 14 and wiring patterns $P_2$ corresponding to the connection terminals formed on the wiring board 42 are heated and pressed for about 1 to 3 sec. The bonding load is about 10 to 17 mg/$\mu$m$^2$.

The bump electrodes 14 are formed on the semiconductor chip 13 in advance. On the other hand, an Sn layer is formed on the wiring pattern $P_2$ in advance. The Sn layer is formed by using an organic-acid-based electroless plating solution. The thickness of the Sn layer is about 0.5 to 1.0 $\mu$m. After that, the space formed between the semiconductor chip 13 and a photosensitive resin layer 2 is filled with an insulating resin 15 (also called a sealing resin) by a known side potting method. The insulating resin 15 is heated and set.

In the semiconductor device 44 thus manufactured according to this embodiment, the wiring board 42 is AuSn-bonded by the bonding tool 22 by using the bonding apparatus (also called a "TAB bonder") shown in FIGS. 3 and 4. The wiring patterns $P_2$ made of the same material as the conductive material of the wiring patterns are formed in the wiring board 42 near the connection to the Au bumps such that when the semiconductor chip 13 is bonded to the wiring board 42, a length Lbp from the bump electrode 14 (its prospective position is shown in FIG. 92) becomes at least 25 to 150 $\mu$m outward. For this reason, the rigidity of the wiring pattern $P_2$ can be made high, and the wiring patterns $P_2$ are rarely bent and stretched. Hence, the wiring patterns are not deformed in bonding.

Hence, the semiconductor device 44 can be formed in which AuSn eutectic bonding is executed at a temperature of 300° C. or more without bending the wiring patterns or peeling them from the wiring board 42 and forming any void Vd. In addition, at the connection terminal of each wiring pattern $P_2$, only the wiring pattern $P_2$ is thick and projects into the wiring board 42. For a wiring pattern $P_1$, $W_1 > t_1$ holds. For these reasons, the semiconductor device 44 having a high flexibility can be formed.

Furthermore, since wiring patterns 5 are not bent, and almost the same planarity as before bonding can be maintained, the insulating resin 15 can smoothly be injected into the space formed between the photosensitive resin layer 2 and the semiconductor chip 13 which is formed into a height of 10 to 30 $\mu$m. For this reason, no voids (bubbles) are formed in the insulating resin 15. Since no void expansion/contraction occurs in a reliability test such as a heat cycle test or thermal shock test because of the absence of voids, a semiconductor device with a high reliability can be formed.

In the above example, the semiconductor device 44 is formed by using the TAB bonder. A flip chip bonder may be used to apply the bonding temperature mainly from the lower surface of the chip. When heat can be applied mainly from the side of the semiconductor chip 13, the set temperature of the bonding tool 22 can be decreased because the thermal conductivity is high. Hence, the load on the bonding tool 22 becomes low. Since heat to the wiring board 42 decreases, the thermal deformation amount can be decreased relatively, and the wiring pattern deformation amount can also be decreased.

In the semiconductor device 44, the surface including the wiring patterns 5 and an insulating layer 39 is flat. However, the surface may project, as shown in FIGS. 49 to 54. As the bonding material, AuSn solder is used. Any other leadless solder material such as SnCu, SnAgCu, or SnAg may be used.

In the bonding structure of this embodiment, the bump electrode 14 of the semiconductor chip 13 is arranged at almost the central portion of the wiring pattern $P_2$. However, the bump electrode 14 may be arranged inside the center line of the wiring pattern $P_2$ (toward the center of the semiconductor chip region). In this case, the region of the wiring pattern $P_2$ located outside the layout position of the bump electrode 14 becomes large or wide. Hence, the wiring patterns are more hardly deformed.

Ninth Embodiment

The ninth embodiment of the present invention will be described.

First, a method of manufacturing a wiring board according to this embodiment will be described with reference to FIGS. 98 to 109.

Figure 98:
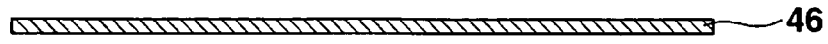
FIG. 98 is a front view showing the first step in manufacturing a wiring board according to the ninth embodiment.

As shown in FIG. 98, a copper foil 46 having a thickness of about 3 to 12 $\mu$m is prepared as a material to form first wiring patterns. If the copper foil 46 is thin, conveyance during manufacturing is technically difficult. For example, a copper foil formed on a carrier copper foil having a thickness of about 30 $\mu$m while inserting a peeling layer between them may be used. The copper foil 46 is preferably re-crystallized by heat treatment in advance to obtain a large crystal size and low hardness.

Figure 99:
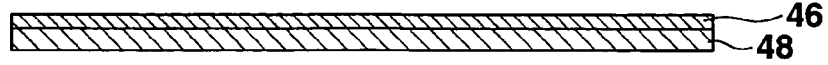
FIG. 99 is a front view showing the second step in manufacturing the wiring board according to the ninth embodiment.

As shown in FIG. 99, a resin layer 48 made of, e.g., polyimide is formed on the surface (lower surface) of the copper foil 46. The thickness of the resin layer 48 is about 5 to 35 μm. To form the resin layer 48, a known method such as roll coating, spin coating, or casting can be used. After the resin layer 48 is applied, the resultant structure is pre-baked in an inert atmosphere at a temperature of about 80° C. to 120° C. to solidify the resin layer and form a film. In addition, to increase the imidization ratio, post-curing (curing) is executed in an inert atmosphere at a temperature of about 300° C., thereby forming a polyimide resin layer.

Figure 100:
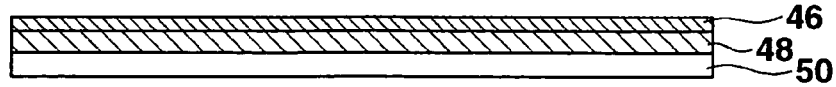
FIG. 100 is a front view showing the third step in manufacturing the wiring board according to the ninth embodiment.

As shown in FIG. 100, a reinforcing film 50 with an acrylic adhesive, which is made of an organic material such as PET, is bonded to the entire surface of the formed polyimide resin layer 48 by using a known laminating method to make it possible to convey the film in the subsequent manufacturing process.

Figure 101:
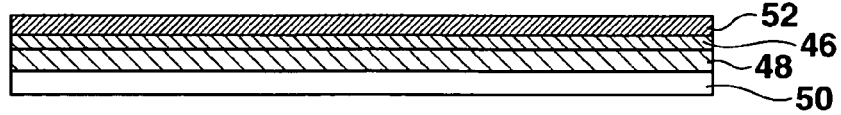
FIG. 101 is a front view showing the fourth step in manufacturing the wiring board according to the ninth embodiment.

As shown in FIG. 101, a resist 52 is applied to the surface of the copper foil 46 to a thickness of 10 μm or less by an application method such as roll coating, spin coating, or casting and pre-baked at a temperature of about 80° C. to form a film.

Figure 102:
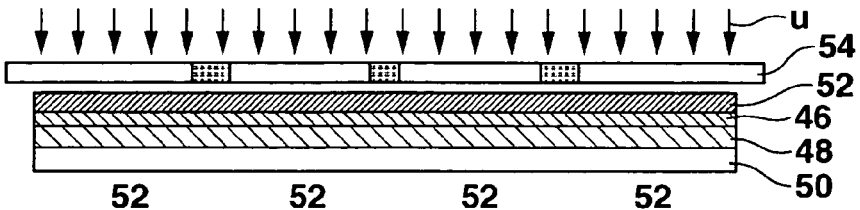
FIG. 102 is a front view showing the fifth step in manufacturing the wiring board according to the ninth embodiment.

As shown in FIG. 102, to form the first wiring patterns, a glass mask 54 is prepared on the basis of the design data of the first wiring patterns. The copper foil 46 is exposed through the glass mask 54 by UV rays u having a predetermined wavelength. Subsequently, development is executed to pattern the resist 52.

Figure 103:
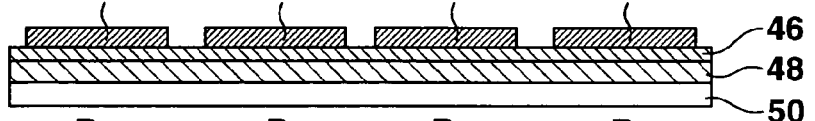
FIG. 103 is a front view showing the sixth step in manufacturing the wiring board according to the ninth embodiment.

As shown in FIG. 103, the copper foil 46 is etched by using a copper etchant based on, e.g., cupric chloride, ferrous chloride, or hydrogen peroxide/sulfuric acid by using the patterned resist 52 as a mask. Accordingly, the copper foil 46 is fabricated into the shape of first wiring patterns $P_1$.

Figure 104:
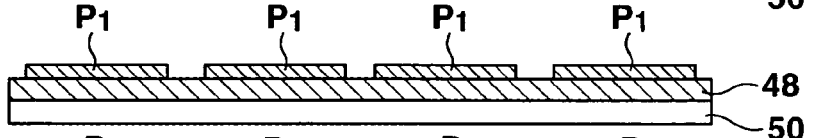
FIG. 104 is a front view showing the seventh step in manufacturing the wiring board according to the ninth embodiment.

As shown in FIG. 104, the resist 52 is removed. The first wiring patterns $P_1$ are formed by the copper foil 46.

Figure 105:
FIG. 105 is a front view showing the eighth step in manufacturing the wiring board according to the ninth embodiment.

As shown in FIG. 105, a PET film 55 with an acrylic adhesive is bonded by a known stacking method to the surface of the copper foil 46 fabricated into the first wiring pattern $P_1$. Since the acrylic adhesive is formed to be slightly thicker than the copper foil 46, the surface of the PET film 55 is bonded flat. After that, the reinforcing film 50 formed on the surface of the resin layer 48 is peeled. The reinforcing film 50 is peeled mechanically (PEEL OFF).

Figure 106:
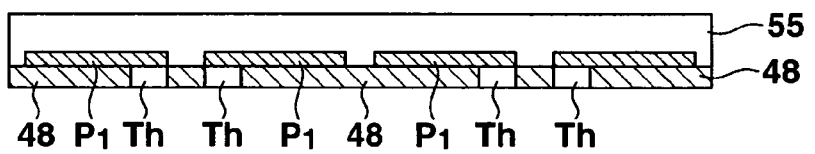
FIG. 106 is a front view showing the ninth step in manufacturing the wiring board according to the ninth embodiment.

As shown in FIG. 106, through holes Th are formed into the shape of second wiring patterns on the first wiring patterns $P_1$ and in the resin layer 48 at positions whether the second wiring patterns are to be formed. The through holes Th can be formed by, e.g., laser machining. The wavelength of the laser to be used here is preferably 300 nm or less. This is because the resin layer 48 hardly thermally degrades.

Figure 107:
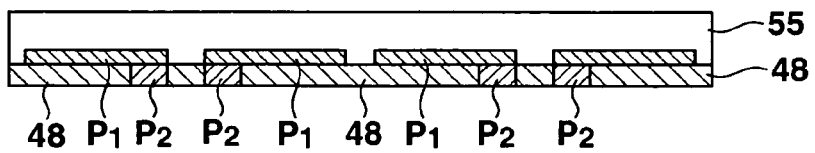
FIG. 107 is a front view showing the 10th step in manufacturing the wiring board according to the ninth embodiment.

As shown in FIG. 107, to form the second wiring patterns, the formed through holes Th are filled by copper electroless plating. Copper is finely deposited by electroless plating. With this process, the hardness of copper formed in the wiring patterns $P_2$ can be increased. Hence, the rigidity can be increased. When the crystal size is small, the hardness becomes high, and the conductivity becomes low. A copper layer is formed by depositing copper having a high mechanical strength so that the wiring patterns themselves are rarely stretched or deformed even upon receiving the load and heat in bonding.

Figure 108:
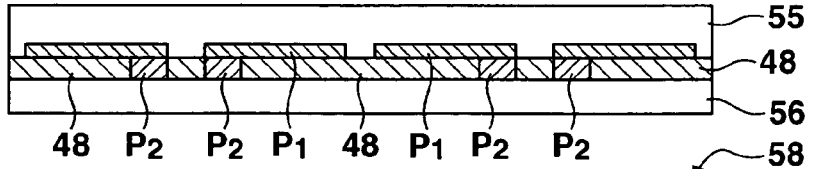
FIG. 108 is a front view showing the 11th step in manufacturing the wiring board according to the ninth embodiment.

As shown in FIG. 108, a process (not shown) is performed to increase the adhesion strength between the already formed resin layer 48 and a polyimide film 56. The polyimide film 56 is formed under the resin layer 48. If a process of physically forming a small three-dimensional pattern is executed to increase the adhesion strength, a portion serving as an antenna is formed again, as described above. For this reason, any method of physically forming anchors cannot be employed. Instead, the substrate is placed in a vacuum apparatus (e.g., film sputter). A plasma treatment is executed by using a reaction gas such as nitrogen, oxygen, or argon, and more preferably, in a nitrogen gas atmosphere. With the plasma treatment, the C—N bonds which have the lowest bond energy in the polyimide molecular ring are dissociated and substituted by nitrogen or OH to form a functional group such as —COOH. Hence, the activation energy on the surface of the polyimide film 56 increases. To form the polyimide film 56, vacuum laminating or cold low-pressure laminating can be used. The surface activation and polyimide layer laminating may be executed continuously in the same apparatus.

Figure 109:
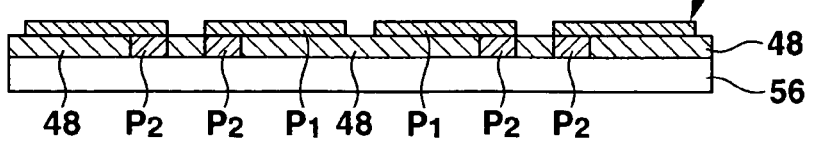
FIG. 109 is a front view showing the 12th step in manufacturing the wiring board according to the ninth embodiment.

As shown in FIG. 109, the surface-reinforcing PET film 55 formed on the surface with the wiring patterns is peeled off. A surface treatment (not shown) using Au, Sn, or In is executed for the exposed first wiring patterns $P_1$, as needed. After that, an insulating surface protective film (not shown) of a polyimide resin or epoxy resin is formed on the upper of the resin layer 48 by a known method except a region to which an electronic component such as an active device or passive device is to be electrically connected. A wiring board 58 is thus formed.

In the wiring board 58 according to this embodiment having the above-described arrangement, since the copper foil 46 is used, a barrier layer can easily be formed between the wiring patterns and the resin layer 48 made of polyimide. In addition, the wiring patterns $P_2$ can be formed from a plurality of pillars.

Figure 110:
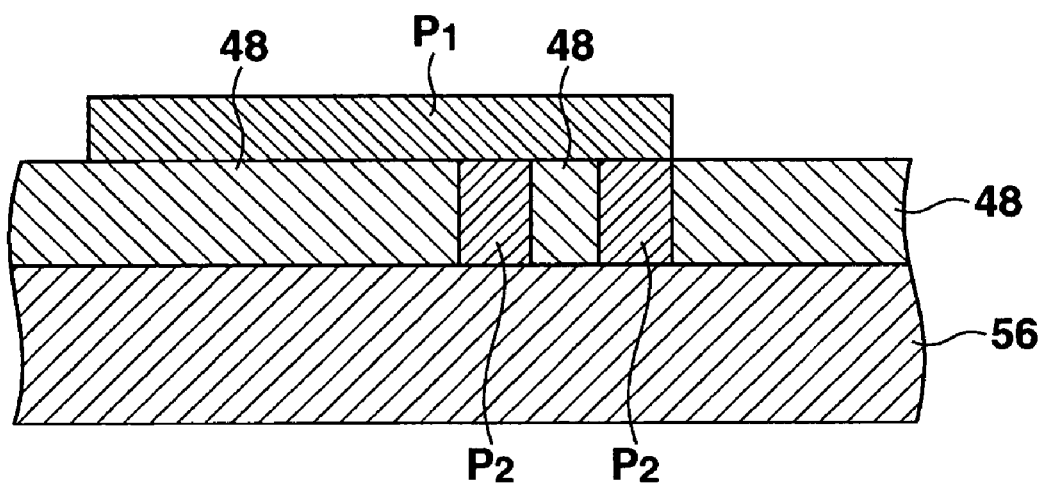
FIG. 110 is an elevation view showing an example of a wiring board having a plurality of pillars.

In the above-described example, one through hole Th is formed to form the wiring pattern $P_2$. However, as shown in FIG. 110, a plurality of small pillars may be formed. As the copper foil 46, a copper foil may be used in which a barrier layer of, e.g., Ni, Cr, NiCr, NiV, or NiTi is formed in advance by sputtering or deposition on the surface which should come into contact with the surface of the resin layer 48 of polyimide.

Referring to FIG. 108, the polyimide film 56 is laminated. A film made of not polyimide but liquid crystal polymer may be laminated. A polyimide film having a several-μm thick liquid crystal polymer layer may be used. In this case, the material preferably has a lower absorptivity than polyimide. With this structure, invasion of water absorbed from the lower surface of the final substrate can be prevented.

10th Embodiment

The 10th embodiment of the present invention will be described.

Figure 111:
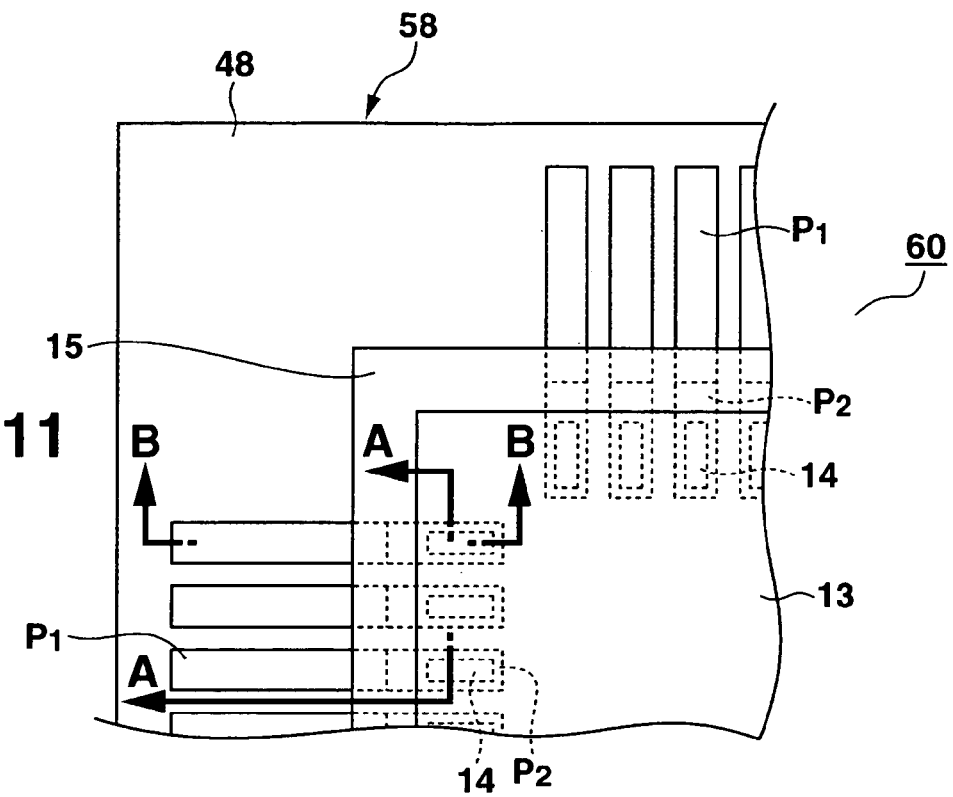
FIG. 111 is a view showing an arrangement of a semiconductor device according to the 10th embodiment.
Figure 112:
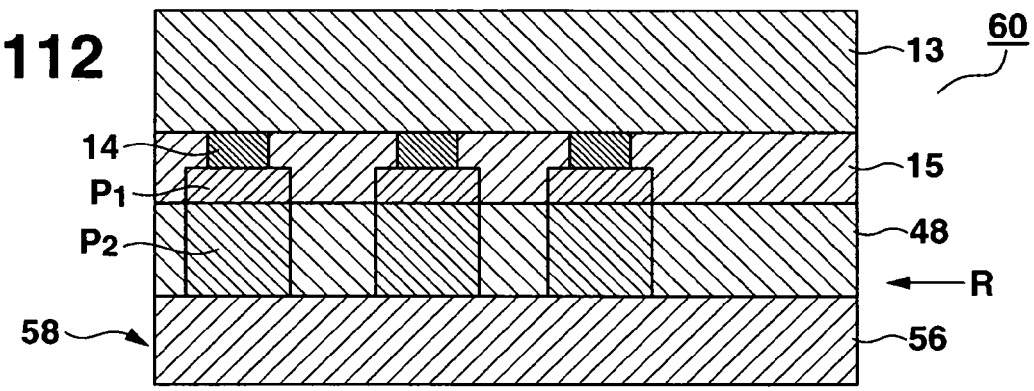
FIG. 112 is a sectional view taken along a line A-A in FIG. 111.
Figure 113:
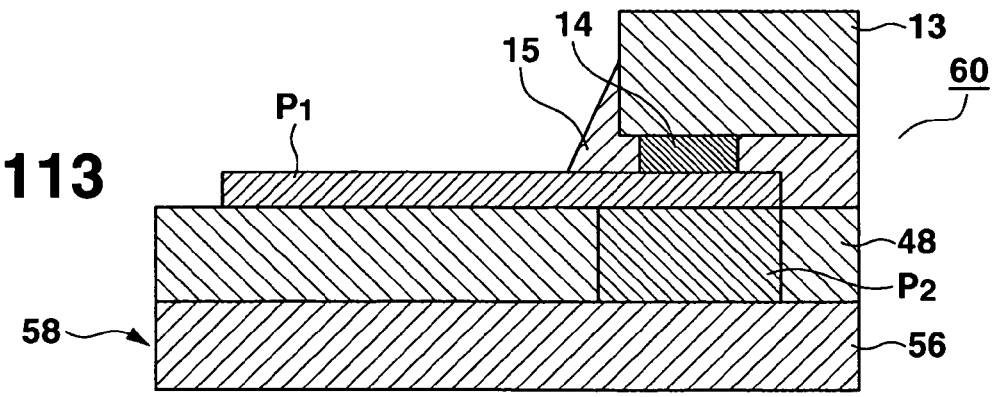
FIG. 113 is a sectional view taken along a line B-B in FIG. 111.

A semiconductor device according to this embodiment will be described with reference to FIGS. 111 to 113. FIG. 111 is a plan view showing an example of a semiconductor device 60 according to this embodiment. FIG. 112 is a sectional view taken along a line A-A in FIG. 111. FIG. 113 is a sectional view taken along a line B-B in FIG. 111. The semiconductor device 60 is manufactured in the following way.

To manufacture the semiconductor device 60 shown in FIGS. 111 to 113, a bonding apparatus shown in FIGS. 3 and 4 is prepared. In this bonding apparatus, a bonding tool 22 movable in the vertical direction is arranged above a stage 21 having a built-in heater (not shown). A semiconductor chip 13 is placed on the stage 21 with bump electrodes 14 being directed upward. A clamp 23 clamps a wiring board 58 described in the ninth embodiment at the periphery of the region where the semiconductor chip 13 is to be mounted. The bonding tool 22 is moved downward.

The wiring board 58 has the lower surface opposing the semiconductor chip 13 all over the semiconductor chip mounting region. The wiring board 58 is set with its lower surface being directed to the upper surface of the semiconductor chip 13, i.e., with the surface having wiring 12 being directed toward the semiconductor chip 13.

Next, the bump electrodes 14 of the semiconductor chip 13 and the connection terminals of the wiring board 58 are aligned.

As shown in FIG. 4, for example, the stage 21 is moved upward to bring the bump electrodes 14 into contact with connection terminals 12a. The bonding tool 22 is moved downward again. In this state, the stage 21 is heated to 350° C. to 450° C., and preferably, about 400° C. to heat the semiconductor chip 13. In addition, the bonding tool 22 is heated to 250° C. to 350° C., and preferably, about 300° C. at which Cu interdiffusion to the bump electrodes 14 occurs, and brought into direct contact with the upper surface of the wiring board 58 to press it. The bump electrodes 14 and second wiring patterns $P_2$ corresponding to the connection terminals formed on the wiring board 58 are heated and pressed for about 1 to 3 sec. The bonding load is about 10 to 17 mg/$\mu m^2$.

The bump electrodes 14 are formed on the semiconductor chip 13 in advance. On the other hand, an Sn layer is formed on the wiring pattern of the wiring board 58 in advance. The Sn layer is formed by using an organic-acid-based electroless plating solution. The thickness of the Sn layer is about 0.5 to 1.0 μm. After that, the space formed between the semiconductor chip 13 and a resin layer 48 is filled with an insulating resin 15 (also called a sealing resin) by a known side potting method. The insulating resin 15 is heated and set.

In the semiconductor device 60 thus manufactured according to this embodiment, the wiring board 58 is AuSn-bonded by the bonding tool 22 by using the bonding apparatus (also called a "TAB bonder") shown in FIGS. 3 and 4. The connection terminals of the wiring patterns, which are made of the same material as the conductive material of the wiring patterns, are anchored in the wiring board 58 near the connection to the Au bumps. For this reason, the rigidity of the second wiring pattern $P_2$ can be made high, and the second wiring patterns $P_2$ are rarely bent and stretched. Hence, the wiring patterns are not deformed in bonding.

Hence, the semiconductor device 60 can be formed in which AuSn eutectic bonding is executed at a temperature of 300° C. or more at which Cu interdiffusion to the bump electrodes 14 occurs without bending the wiring patterns or peeling them from the wiring board 58 and forming any void Vd. In addition, at each connection terminal, only the second wiring pattern $P_2$ is thick and projects into the wiring board 58. For a first wiring pattern $P_1$ as another wiring pattern, W>t holds. For these reasons, the semiconductor device 60 having a high flexibility can be formed.

The second wiring pattern $P_2$ is at least columnar and has at least one pillar structure. Since pressure in bonding can be dispersed, the wiring patterns are not bent and deformed.

Since the plurality of second wiring patterns $P_2$ are formed, and the contact area between polyimide and the second wiring patterns $P_2$ increases, the peeling strength increases. In addition, bonding is done for the wiring board 58 in which a plurality of pillars are driven in polyimide, the anchor effect increases. For this reason, in the semiconductor device 60, deformation of the wiring patterns can further be reduced.

The second wiring pattern $P_2$ has a multiple pillar structure, and an insulating resin is interposed between the pillars. Since heat in bonding is uniformly dispersed and dissipated from the plurality of pillars serving as a radiator, thermal damage to polyimide is small. Hence, the wiring patterns are not deformed. In addition, no voids Vd are formed between the wiring patterns and polyimide.

In the above example, the semiconductor device 60 is formed by using the TAB bonder. A flip chip bonder may be used to apply the bonding temperature mainly from the lower surface of the chip. When heat can be applied mainly from the side of the semiconductor chip 13, the tool set temperature can be decreased because the thermal conductivity is high. Hence, the load on the bonding tool 22 becomes low. Since heat to the wiring board 58 decreases, the thermal deformation amount can be decreased relatively, and the wiring pattern deformation amount can also be decreased.

As the bonding material, AuSn solder is used. Any other leadless solder material such as SnCu, SnAgCu, or SnAg may be used.

In the bonding structure of this embodiment, the bump electrode 14 of the semiconductor chip 13 is arranged at almost the central portion of the second wiring pattern $P_2$. However, the bump electrode 14 may be arranged inside the center line of the second wiring pattern $P_2$ (toward the center of the semiconductor chip region). In this case, the region of the wiring pattern $P_2$ located outside the layout position of the bump electrode 14 becomes large or wide. Hence, the wiring patterns are more hardly deformed.

Figure 114:
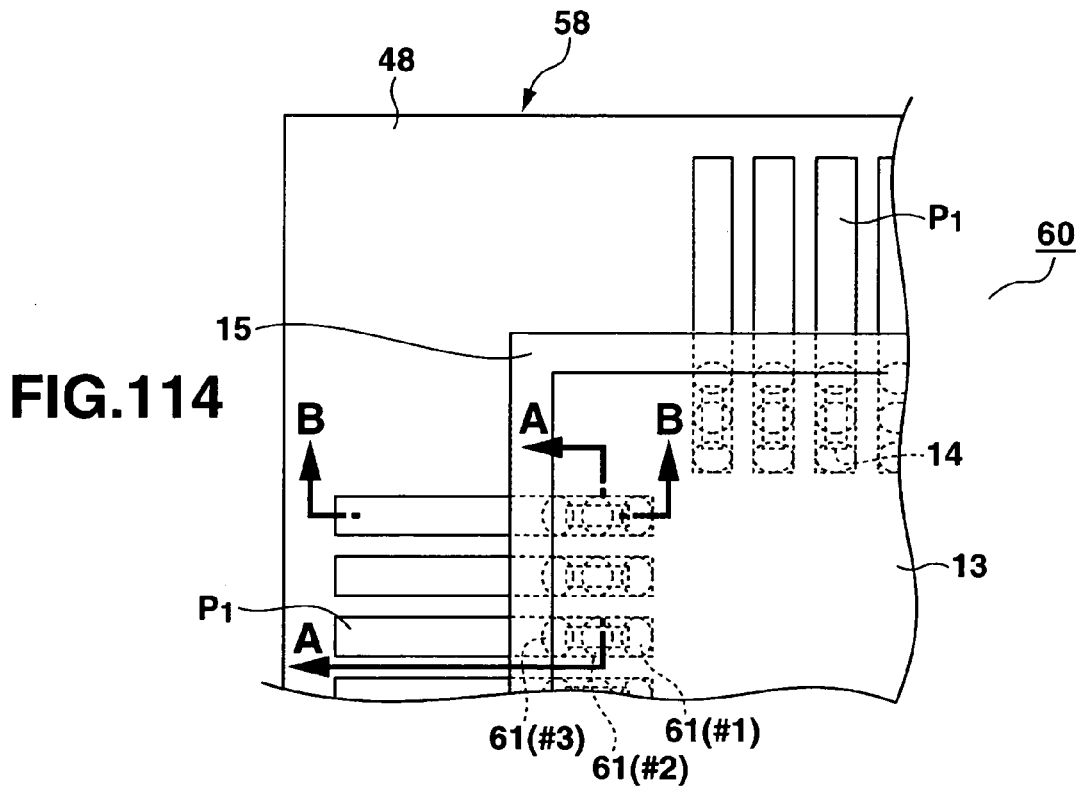
FIG. 114 is a view showing another arrangement of the semiconductor device according to the 10th embodiment.
Figure 115:
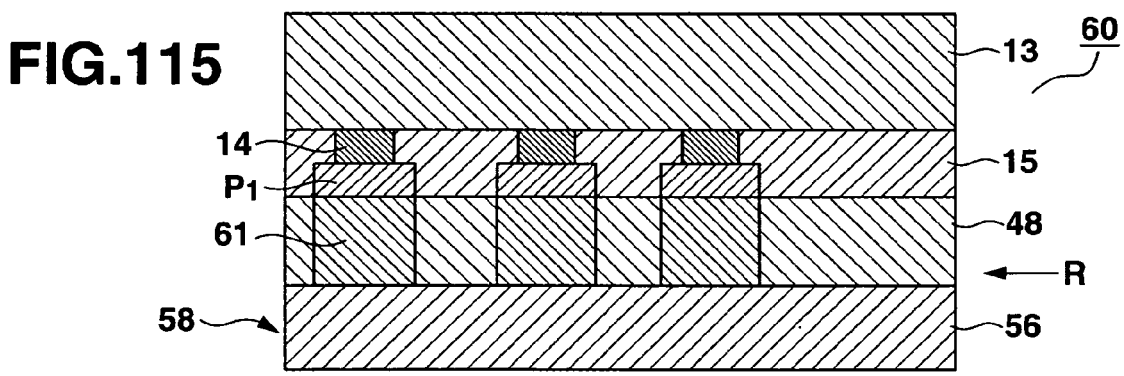
FIG. 115 is a sectional view taken along a line A-A in FIG. 114.
Figure 116:
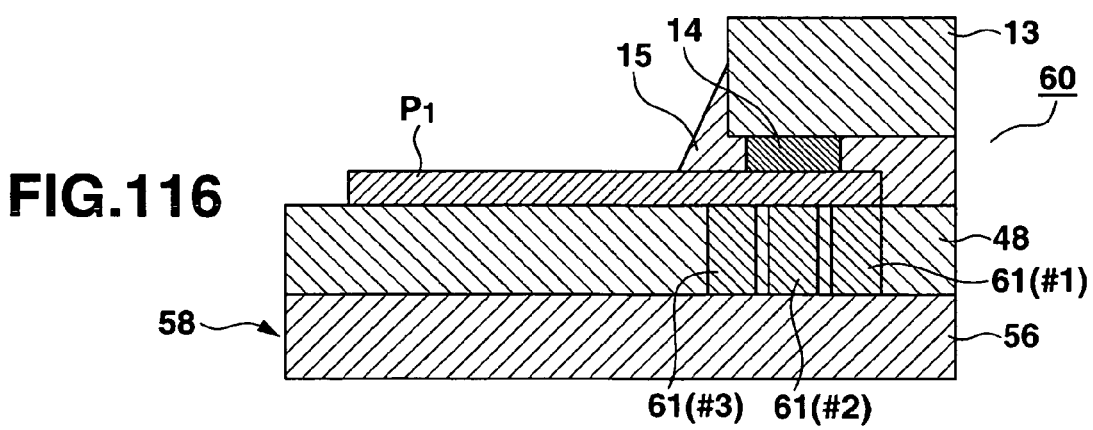
FIG. 116 is a sectional view taken along a line B-B in FIG. 114.

As shown in FIGS. 114 to 116, the second wiring pattern $P_2$ may be formed from a plurality of pillars 61 (#1 to #3). FIG. 115 is a sectional view taken along a line A-A in FIG. 114. FIG. 116 is a sectional view taken along a line B-B in FIG. 114.

11th Embodiment

The 11th embodiment of the present invention will be described.

First, a method of manufacturing a wiring board according to this embodiment will be described with reference to FIGS. 117 to 126.

As shown in FIG. 117, a cladding material is prepared, in which a copper foil 46 (#2) as a material to form second wiring patterns $P_2$, an Ni foil 47 having a thickness of several μm, and a copper foil 46 (#1) having the thickness of first wiring patterns $P_1$ are stacked in advance. This material can be formed by a known cladding method.

As shown in FIG. 118, a resist 52 (#1) is applied to the surface of the copper foil 46 (#2) to a thickness of 10 μm or less by an application method such as roll coating, spin coating, or casting and pre-baked at a temperature of about 80° C. to form a film.

As shown in FIGS. 119 and 120, to form the second wiring patterns $P_2$ from the copper foil 46 (#2), a glass mask 54 is prepared on the basis of the pattern design data. The copper foil 46 (#2) is exposed through the glass mask 54 by UV rays u having a predetermined wavelength. Subsequently, development is executed to pattern the resist 52 (#1).

As shown in FIG. 121, the copper foil 46 (#2) is etched by using a copper etchant based on, e.g., cupric chloride, ferrous chloride, or hydrogen peroxide/sulfuric acid by using the patterned resist 52 (#1) as a mask, thereby fabricating the copper foil 46 (#2) into the shape of the second wiring patterns $P_2$. After that, the resist 52 (#1) is removed.

As shown in FIG. 122, a resin layer 48 made of, e.g., polyimide is formed on the surface of the copper foil 46 (#2). The thickness of the resin layer 48 is about 20 to 35 μm. To form the resin layer 48, a known method such as casting can be used. After the resin layer 48 is formed, the resultant structure is pre-baked in an inert atmosphere at a temperature of about 80° C. to 120° C. to solidify the resin layer and form a film. In addition, to increase the imidization ratio, post-curing (curing) is executed in an inert atmosphere at a temperature of about 300° C., thereby forming a polyimide resin layer.

As shown in FIG. 123, a resist 52 (#2) is applied to the surface of the copper foil 46 (#1) to a thickness of 10 μm or less by roll coating, spin coating, or casting and pre-baked at a temperature of about 80° C. to form a film. To form the first wiring patterns $P_1$, the copper foil 46 (#1) is exposed through a glass mask 57 based on the pattern design data by UV rays having a predetermined wavelength. Subsequently, development is executed to pattern the resist 52 (#2) (FIG. 124).

As shown in FIG. 125, the copper foil 46 (#1) is etched by using a copper etchant based on, e.g., cupric chloride, ferrous chloride, or hydrogen peroxide/sulfuric acid by using the patterned resist 52 (#2) as a mask, thereby fabricating the copper foil into the shape of the first wiring patterns $P_1$. The resist 52 (#2) is removed. The Ni foil 47 is etched by using the patterned first wiring patterns $P_1$ as a mask. A surface treatment (not shown) using Au, Sn, or In is executed for the exposed first wiring patterns $P_1$, as needed. After that, an insulating surface protective film (not shown) of a polyimide resin or epoxy resin is formed on the upper of the resin layer 48 by a known method except a region to which an electronic component such as an active device or passive device is to be electrically connected. A wiring board 62 shown in FIG. 126 can be formed in this way.

The wiring board 62 according to this embodiment having the above-described arrangement uses the cladding material prepared by sandwiching Ni by Cu. Hence, the process can be shortened. In addition, a refractory metal such as titanium or tungsten, which cannot be deposited by plating, can be used as the material of the second wiring patterns $P_2$. For this reason, a wide choice of options can be provided without any limitation on the material.

12th Embodiment

The 12th embodiment of the present invention will be described.

First, a method of manufacturing a wiring board according to this embodiment will be described with reference to FIGS. 127 to 132.

Figure 127:
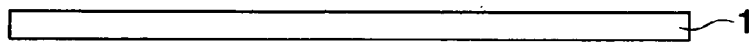

As shown in FIG. 127, an Ni film 1 having a thickness of 50 to 125 μm is prepared as a supporting member.

Figure 128:
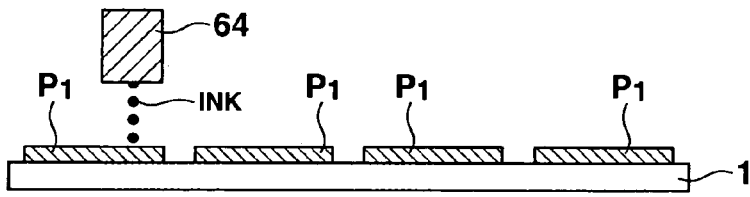

As shown in FIG. 128, first wiring patterns $P_1$ are imprinted directly on the surface of the Ni film 1 by using conductive ink containing silver nanoparticles, copper nanoparticles, or Au nanoparticles having an average particle size of 10 to 100 nm by using an inkjet head 64 having at least one nozzle. The thickness of the first wiring patterns $P_1$ is several μm. The first wiring patterns $P_1$ are directly drawn by transferring CAD data created in advance in pattern design directly to an inkjet printer.

If the predetermined film thickness cannot be obtained by printing the nanopaste once, the predetermined film thickness is obtained by repeating printing several times. The whole structure is pre-baked together with the ink printed on the Ni film 1. The baking is executed in an inert atmosphere at a temperature is 150° C. to 250° C. By this baking, an anticoagulant formed on the nanoparticle surface is pyrolyzed, and the surfaces of the inorganic or metal nanoparticles are exposed. The exposed surfaces of the metal nanoparticles come into contact. Since they are particles having a nanodiameter, the activation energy on the surface increases. The particles are partially melted and bonded at the contact portions due to the high surface energy and heat energy by the pre-baking temperature. By repeating this process, the nanoparticles are bonded to each other to form the first wiring patterns $P_1$ as a conductor.

Figure 129:
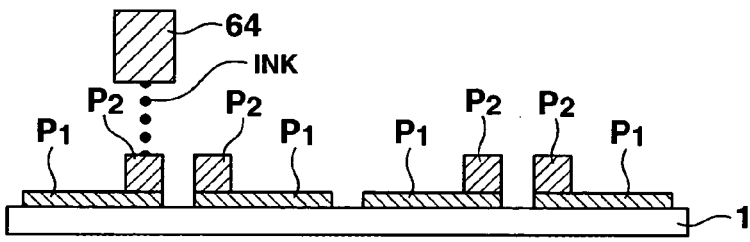

As shown in FIG. 129, second patterns $P_2$ are imprinted directly on the first wiring patterns $P_1$ by using conductive ink containing silver nanoparticles, copper nanoparticles, or Au nanoparticles having an average particle size of 10 to 100 nm by using the inkjet head 64 having at least one nozzle. The second wiring patterns $P_2$ may be formed by using nanoparticles of a material different from the first wiring patterns $P_1$.

Figure 130:
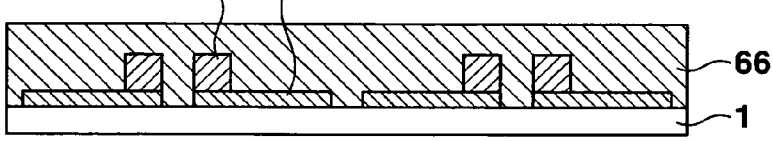

As shown in FIG. 130, an insulating resin 66 such as liquid crystal polymer or polyimide is applied by a known method such as casting to the Ni film 1 on which the first wiring patterns $P_1$ and second wiring patterns $P_2$ are formed in advance. The insulating resin 66 is applied such that the final film thickness becomes 10 to 40 μm. The insulating resin 66 is cured. When the insulating resin 66 is polyimide, curing is executed in an inert atmosphere at a temperature of 300° C. for a curing time of 1 to 2 hrs. The polymerization reaction is made to progress until the polyimide is further dehydrated and polymerized, and the imidization ratio reaches 90% or more.

With this process, the insulating resin layer 66 having a high thermal resistance is formed. After the insulating resin layer 66 is formed, the insulating resin layer 66 may be planarized by polishing the surface of the formed insulating resin by a known polishing method, as needed.

As shown in FIG. 131, only Ni of the Ni film 1 is etched by using a dedicated etchant. In addition, a surface treatment is executed by using electroless Cu, Ni, or Au or a combination thereof, as needed, as shown in FIG. 132. After that, an insulating surface protective film (not shown) of a polyimide resin or epoxy resin is formed on the upper surface of the insulating resin layer 66 by a known method except a region to which an electronic component such as an active device or passive device is to be electrically connected. A wiring board 68 according to this embodiment is thus formed.

In the wiring board according to this embodiment having the above-described arrangement, nanoparticles are used. In addition, the first wiring patterns $P_1$ and second wiring patterns $P_2$ are formed by imprinting using an inkjet print technique. Hence, the process can greatly be shortened. The wiring patterns are formed directly by drawing. Since no chemicals such as a resist adhesion reinforcing agent (e.g., silane coupling agent), resist, resist remover, and etchant are used at all, the environment can be made small. Since the imprinting method is used, wiring boards can be produced by continuous production such as roll-to-roll (also called RtoR).

When the wiring resistance is high, or the solder wettability in soldering is poor, a surface treatment can be executed to improve it.

13th Embodiment

The 13th embodiment of the present invention will be described.

A semiconductor device according to this embodiment will be described with reference to FIGS. 133 to 135. FIG. 133 is a plan view showing an example of a semiconductor device 70 according to this embodiment. FIG. 134 is a sectional view taken along a line A-A in FIG. 133. FIG. 135 is a sectional view taken along a line B-B in FIG. 133. The semiconductor device 70 is manufactured in the following way.

To manufacture the semiconductor device 70 shown in FIGS. 133 to 135, a bonding apparatus shown in FIGS. 3 and 4 is prepared. In this bonding apparatus, a bonding tool 22 movable in the vertical direction is arranged above a stage 21 having a built-in heater (not shown). A semiconductor chip 13 is placed on the stage 21 with bump electrodes 14 being directed upward. A clamp 23 clamps a wiring board 68 at the periphery of the region where the semiconductor chip 13 is to be mounted. The bonding tool 22 is moved downward.

The wiring board 68 has the lower surface opposing the semiconductor chip 13 all over the semiconductor chip mounting region. The wiring board 68 is set with its lower surface being directed to the upper surface of the semiconductor chip 13, i.e., with the surface having wiring 12 being directed toward the semiconductor chip 13.

Next, the bump electrodes 14 of the semiconductor chip 13 and connection terminals 12a of the wiring board 68 are aligned. In the bonding structures of the second, fourth, sixth, eighth, and 10th embodiments, the bump electrode 14 of the semiconductor chip 13 to be mounted is arranged at almost the central portion of the wiring pattern to be bonded. In this embodiment, however, the bump electrode 14 is arranged inside the center line of the wiring pattern (toward the center of the semiconductor chip region). That is, the bump electrode 14 is shifted in the X or Y direction by a length L from a center line $CL_2$ of the second wiring pattern $P_2$ in the lead direction to a center line $CL_1$ of the bump electrode 14 in the lead direction and bonded. That is, each bump electrode 14 is bonded with the offset amount L.

As shown in FIG. 4, for example, the stage 21 is moved upward to bring the bump electrodes 14 into contact with the connection terminals 12a. The bonding tool 22 is moved downward again. In this state, the stage 21 is heated to 350° C. to 450° C., and preferably, about 400° C. to heat the semiconductor chip 13. In addition, the bonding tool 22 is heated to 250° C. to 350° C., and preferably, about 300° C. at which Cu interdiffusion to the bump electrodes 14 occurs, and brought into direct contact with the upper surface of the wiring board 68 to press it. The bump electrodes 14 and second wiring patterns $P_2$ corresponding to the connection terminals formed on the wiring board 68 are heated and pressed for about 1 to 3 sec. The bonding load is about 10 to 17 mg/μm².

The bump electrodes 14 of gold are formed on the semiconductor chip 13 in advance. On the other hand, an Sn layer is formed on the wiring pattern of the wiring board 68 in advance. The Sn layer is formed by using an organic-acid-based electroless plating solution. The thickness of the Sn layer is about 0.5 to 1.0 μm. After that, the space formed between the semiconductor chip 13 and a photosensitive resin layer 2 is filled with an insulating resin 15 (also called a sealing resin) by a known side potting method. The insulating resin 15 is heated and set.

In the semiconductor device 70 thus manufactured according to this embodiment, the wiring board 68 is AuSn-bonded by the bonding tool 22 by using the bonding apparatus (also called a "TAB bonder") shown in FIGS. 3 and 4. The connection terminals of the wiring patterns, which are made of the same material as the conductive material of the wiring patterns, are anchored in the wiring board 68 near the connection to the Au bumps. In addition, at the connection terminal of each wiring pattern, only the second wiring pattern $P_2$ is thick and projects into the wiring board 68. For a first wiring pattern $P_1$ as another wiring pattern, $W_1 > t_1$ holds. The second wiring pattern $P_2$ is at least columnar and has at least one pillar structure. The bump electrode 14 is aligned inside the center line of the second wiring pattern $P_2$ (toward the center of the semiconductor chip 13) and bonded. With this semiconductor bonding structure, the rigidity of the second wiring pattern $P_2$ can be made high, and the second wiring patterns $P_2$ are rarely bent and stretched. Since pressure in bonding can be dispersed, the wiring patterns are not deformed in bonding. In addition, the wiring patterns are not bent and deformed.

Since the plurality of second wiring patterns $P_2$ are formed, and the contact area between polyimide and the second wiring patterns $P_2$ increases, the peeling strength increases. In addition, bonding is done for the wiring board 68 in which a plurality of pillars are driven in polyimide, the anchor effect increases. For this reason, in the semiconductor device 70, deformation of the wiring patterns is further reduced. Hence, the semiconductor device 70 can be formed in which AuSn eutectic bonding is executed at a temperature of 300° C. or more without bending the wiring patterns or peeling them from the wiring board 68 and forming any void Vd. In addition, the semiconductor device 70 with a high flexibility can be formed.

As the bonding material, AuSn solder is used. Any other leadless solder material such as SnCu, SnAgCu, or SnAg may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wiring board for supporting a semiconductor chip, the wiring board comprising:

a substrate having mutually perpendicular length, width, and thickness directions; and a conductive pattern formed on the substrate, wherein the conductive pattern includes first wiring pattern portions with a first length along the length direction and elongated rectangular shaped second wiring pattern portions with a second length along the length direction, the second wiring pattern portions having one end portion connected to the first wiring pattern portion and the second wiring pattern portions extending in the length direction to a peripheral portion of the substrate, the first wiring pattern portions are formed on an area of the substrate in a plane defined by the length and width directions in which the semiconductor chip is mounted on the substrate, the second wiring pattern portions comprising first parts with said one end portion formed on the first wiring pattern portions such that individual bump electrodes are above respective individual first parts in the thickness direction, and second parts that are formed over the substrate to extend along the length direction beyond the first wiring pattern portions, the width of the second wiring pattern portions is larger than the thickness of the second wiring pattern portions, and the width of the first wiring pattern portions is not larger than the thickness of the first wiring pattern portions.

2. The wiring board according to claim 1, wherein the substrate is formed of polyimide.

3. The wiring board according to claim 1, wherein the individual bump electrodes are provided on the semiconductor chip and are formed on the first parts of the second wiring pattern portions.

4. The wiring board according to claim 1, wherein the first wiring pattern portions and the second wiring pattern portions are formed of the same conductive material.

5. The wiring board according to claim 4, wherein the first wiring pattern portions and the second wiring pattern portions are formed of the same conductive material having a different crystal size.

6. The wiring board according to claim 5, wherein the first wiring pattern portions are formed of a first conductive material having a crystal size that is smaller than a crystal size of a second conductive material forming the second wiring pattern portions.

7. The wiring board according to claim 4, wherein the first wiring pattern portions and the second wiring pattern portions are formed of the same conductive material having a different hardness.

8. The wiring board according to claim 7, wherein the first wiring pattern portions are formed of a first conductive material having a hardness that is harder than a hardness of a second conductive material forming the second wiring pattern portions.

9. The wiring board according to claim 4, wherein the first wiring pattern portions and the second wiring pattern portions are formed of the same conductive material having a different crystal orientation.

10. The wiring board according to claim 1, wherein the first wiring pattern portions are formed of a copper and the second wiring pattern portions are formed of copper-alloy, nickel, or chrome.

11. The wiring board according to claim 1, wherein the second wiring pattern portions have a cross section of a square viewed from the inner area.

12. The wiring board according to claim 1, wherein the second wiring pattern portions have a cross section of a trapezoidal viewed from the inner area, an upper side of the trapezoidal being short and a lower side of the trapezoidal being long.

13. A semiconductor device comprising:
a substrate having mutually perpendicular length, width, and thickness directions;
a wiring board formed on the substrate; and
a semiconductor chip mounted on the wiring board, wherein the wiring board includes a conductive pattern formed on the substrate,
wherein the conductive pattern includes first wiring pattern portions with a first length along the length direction and elongated rectangular shaped second wiring pattern portions with a second length along the length direction, the second wiring pattern portions having one end portion connected to the first wiring pattern portion and the second wiring pattern portions extending in the length direction to a peripheral portion of the substrate,
the first wiring pattern portions are formed on an area of the substrate in a plane defined by the length and width directions in which the semiconductor chip is mounted on the substrate,
the second wiring pattern portions comprising first parts with said one end portion formed on the first wiring pattern portions such that individual bump electrodes are above respective individual first parts in the thickness direction, and second parts that are formed over the substrate to extend along the length direction beyond the first wiring pattern portions,
the width of the second wiring pattern portions is larger than the thickness of the second wiring pattern portions, and
the width of the first wiring pattern portions is not larger than the thickness of the first wiring pattern portions.

* * * * *